United States Patent
Sato et al.

(10) Patent No.: US 8,110,484 B1
(45) Date of Patent: Feb. 7, 2012

(54) CONDUCTIVE NITRIDE SEMICONDUCTOR SUBSTRATE AND METHOD FOR PRODUCING THE SAME

(75) Inventors: Fumitaka Sato, Itami (JP); Seiji Nakahata, Itami (JP); Makoto Kiyama, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 12/950,686

(22) Filed: Nov. 19, 2010

(51) Int. Cl.
*H01L 21/20* (2006.01)
*H01L 21/36* (2006.01)

(52) U.S. Cl. .................. 438/479; 257/E21.113
(58) Field of Classification Search .......... 438/479; 257/E21.113
See application file for complete search history.

(56) References Cited

U.S. PATENT DOCUMENTS

| | | | |
|---|---|---|---|
| 2009/0050915 A1* | 2/2009 | Yamamoto | 257/94 |
| 2009/0108297 A1* | 4/2009 | Sato et al. | 257/192 |

FOREIGN PATENT DOCUMENTS

| | | |
|---|---|---|
| EP | 0 942 459 | 9/1999 |
| JP | 2001-102307 | 4/2001 |
| JP | 2005-306723 | 11/2005 |
| JP | 3788037 | 4/2006 |
| JP | 3788041 | 4/2006 |
| JP | 3788104 | 4/2006 |
| JP | 3801125 | 5/2006 |
| JP | 3826825 | 7/2006 |
| JP | 3864870 | 10/2006 |
| WO | 98/47170 | 10/1998 |
| WO | 99/23693 | 5/1999 |

* cited by examiner

*Primary Examiner* — Alexander Ghyka
*Assistant Examiner* — Seahvosh Nikmanesh
(74) *Attorney, Agent, or Firm* — Drinker Biddle & Reath LLP

(57) ABSTRACT

A method for producing a conductive nitride semiconductor substrate circuit includes the steps of forming, on an underlying substrate, a mask including dot or stripe masking portions having a width or diameter of 10 to 100 μm and arranged at a spacing of 250 to 10,000 μm; growing a nitride semiconductor crystal on the underlying substrate by hydride vapor phase epitaxy (HVPE) at a growth temperature of 1,040° C. to 1,150° C. by supplying a group III source gas, a group V source gas, and a silicon-containing gas in a V/III ratio of 1 to 10; and removing the underlying substrate, thus forming a free-standing conductive nitride semiconductor crystal substrate having a resistivity r of 0.0015 Ωcm≦r≦0.01 Ωcm, a thickness of 100 μm or more, and a radius of bow curvature U of 3.5 m≦U≦8 m.

17 Claims, 30 Drawing Sheets

Dot mask

CONDUCTIVE NITRIDE SEMICONDUCTOR SUBSTRATE AND METHOD FOR PRODUCING THE SAME

BACKGROUND OF THE INVENTION

1. Field of the Invention

The present invention relates to conductive nitride semiconductor substrates and methods for producing such substrates. Nitride semiconductors include gallium nitride (GaN), aluminum nitride (AlN), indium nitride (InN), and mixed crystals such as InGaN and AlInGaN. The invention is directed not to thin films deposited on underlying substrates, but to free-standing crystal substrates. Here, GaN will be mainly discussed. GaN, which has a wide bandgap, is used as a material for blue light-emitting devices.

In the related art, blue light-emitting devices such as light-emitting diodes and semiconductor lasers are produced by epitaxially growing a nitride semiconductor thin-film crystal such as InGaN, GaN, or AlInGaN on a single-crystal sapphire substrate ($\alpha$-$Al_2O_3$). Sapphire has the same crystal system as GaN, namely, a hexagonal system. A c-plane GaN thin film is grown on a c-plane sapphire crystal.

A sapphire substrate, however, has insulation properties, and consequently a cathode cannot be formed on the bottom surface thereof. In addition, chips must be separated by a cutting machine because the cleavage plane of GaN differs from that of a sapphire substrate. This is disadvantageous because such chip separation takes much time and effort and also results in poor yield.

In addition, GaN differs greatly from sapphire in lattice constant. A GaN crystal grown on a sapphire substrate has high dislocation density and large bow. Accordingly, in order to use GaN itself as a substrate, the preparation of a substrate crystal of GaN has been attempted. GaN, which has a wide bandgap, is thought to be a material suitable for blue light-emitting devices. A highly conductive substrate is desired for light-emitting devices because such a substrate is advantageous in forming a cathode on the bottom surface and an anode on the top surface.

In the production of nitride semiconductor substrates, the growth of n-type nitride semiconductor crystals, which have high free electron density, has so far been researched. Currently, free-standing oxygen-doped n-type GaN substrates having a diameter of two inches can be produced.

2. Description of the Related Art

To produce light-emitting devices, metal organic chemical vapor deposition (MOCVD) is often used to form a nitride semiconductor thin film (such as a GaN, InGaN, or AlGaN thin film) on a sapphire substrate. Because MOCVD is a vapor synthesis process, the source materials are supplied in vapor phase. Nitrogen is supplied in the form of ammonia ($NH_3$). In MOCVD, a group III element is supplied in the form of an organic metal. An organic metal of a group III element, such as gallium or indium (for example, trimethylgallium or triethylindium), and $NH_3$ are supplied as source materials to a heated sapphire substrate.

Hydride vapor phase epitaxy (HVPE) is also frequently used as a vapor synthesis process for forming a GaN-based semiconductor thin film. In this process, a gallium boat filled with molten gallium is disposed above a susceptor, and HCl is blown therein to synthesize GaCl for use as a gallium source material. Thus, the source gases are GaCl and ammonia.

PCT International Publication No. WO99/23693 (PCT International Application No. PCT/W98/04908) (Patent Document 1) discloses a technique for forming a thick GaN crystal by forming a GaN buffer layer on a GaAs substrate on which a mask having a window diameter of 1 to 5 µm and a window pitch of 4 to 10 µm is formed and performing c-plane growth of GaN thereon at 820° C. or 970° C. by MOCVD or at 970° C., 1,000° C., 1,010° C., 1,020° C., or 1,030° C. by HVPE.

Patent Document 1 uses a mask having fine windows. FIG. 1 shows a plan view of an example of the mask. The mask is formed on an underlying substrate U. This mask has numerous small windows W regularly arranged in a large, continuous masking portion M. The underlying substrate U is exposed in the windows W. The masking portion M has a much larger area than exposed portions E (windows W). The masking portion M is a continuous thin film having the same dimensions as the underlying substrate U. The exposed portions E (openings: windows W) are larger in number but are smaller in total area.

The mechanism by which dislocations are reduced by the mask method will be described with reference to FIGS. 2A to 2G. FIGS. 2A to 2G are sectional views illustrating how a crystal is grown by the mask method. Referring to FIG. 2A, a mask M is formed by applying a mask material to the underlying substrate U and forming small windows W (exposed portions E) in a regular pattern. As GaN is grown in vapor phase, GaN crystals G are formed only in the windows W (exposed portions E). In the exposed portions E, numerous upward dislocations T occur at the boundaries between the crystals G and the underlying substrate U (see FIG. 2B).

As the growth proceeds, a portion of the crystals G growing on the exposed portions E (windows W) overgrow the masking portions (mask) M and grow across the mask M (masking portions) laterally (see FIG. 2C). As the crystals G grow laterally, the dislocations T also propagate laterally. The lateral surfaces are low-index facets F. Referring to FIG. 2D, the crystals G grow upward and laterally, thus having the shape of a truncated cone. The top surface of the truncated cone is the c-plane (C). Referring to FIG. 2E, the crystals G growing from the adjacent windows W contact each other. The dislocations T then propagate laterally and collide with each other. This causes some dislocations T to cancel each other out.

Referring to FIG. 2F, the grooves defined by the facets F are gradually filled and narrowed. Finally, the grooves defined by the facets F are completely filled, thus forming a flat surface C. The flat surface C is the c-plane. Thereafter, the growth continues at the flat c-plane surface C. The number of dislocations T is large above the windows W (exposed portions E) and is small above the masking portion (mask) M.

Patent Document 1 is important in the related art because it discloses specific data such as growth temperature and source material partial pressure. Patent Document 1 discloses that the growth temperature is 970° C., 1,000° C., 1,010° C., 1,020° C., or 1,030° C. for HVPE and is 820° C. or 970° C. for MOCVD.

For HVPE, the source materials are HCl, molten gallium, and $NH_3$. The group III source material is GaCl, which is produced by reacting the molten gallium with HCl gas. The amounts of group III and V source materials supplied are expressed as the partial pressures $P_{GaCl}$ and $P_{NH3}$ of GaCl and $NH_3$, respectively. As used herein, the unit of partial pressure is Pa, where 0.1 MPa (100,000 Pa) is approximated to 1 atmospheric pressure (1 atm). More frequently, kPa (1,000 Pa) is used as a unit; in this case, 100 kPa is approximated to 1 atm. The ratio b of the group V source material to the group III source material can be expressed as the ratio of the $NH_3$ partial pressure $P_{NH3}$ to the GaCl partial pressure $P_{GaCl}$. The ratio of the group V source material to the group III source material is referred to as the V/III ratio b, as defined as $b = P_{NH3}/P_{GaCl}$.

According to Patent Document 1, the GaN crystal formed by the mask method has a resistivity r of 0.005 to 0.08 Ωcm.

The substrate temperature and the V/III ratio b during growth are important conditions responsible for crystal growth. FIG. 22 lists the growth temperatures and the V/III ratios b of all of Patent Document 1 to 11 described below, where the horizontal axis indicates the substrate temperature (° C.) and the vertical axis indicates the V/III ratio b. The coordinates of the substrate temperatures and V/III ratios b of the GaN crystals shown in the patent documents are marked with dots. The black dots indicate GaN crystals formed by HVPE, and the circled black dots indicate GaN crystals formed by MOCVD. The numbers beside the black dots and the circled black dots are the number of the patent documents. The growth conditions for MOCVD disclosed in the examples in Patent Document 1 are as follows.

The growth temperature Tq, the $NH_3$ partial pressure $P_{NH3}$, the trimethylgallium (TMG) partial pressure $P_{TMG}$, and the V/III ratio b are shown below in the above order:

| 970° C. | 20 kPa | 0.2 kPa | 100 times |
|---|---|---|---|
| 970° C. | 25 kPa | 0.2 kPa | 100 times |
| 820° C. | 20 kPa | 0.3 kPa | 67 times |
| 970° C. | 20 kPa | 0.2 kPa | 100 times |
| 1,000° C. | 20 kPa | 0.4 kPa | 50 times |
| 970° C. | 25 kPa | 0.5 kPa | 50 times |

The substrate temperature for MOCVD in Patent Document 1 is 820° C. to 1,000° C., and the V/III ratio b is 50 to 100 times. These examples are indicated by the five circled black dots in the middle left of FIG. 22. The third example, namely, 820° C. and 67 times, is omitted from FIG. 22 because the temperature is excessively low and deviates from FIG. 22.

The growth conditions for HVPE disclosed in the examples in Patent Document 1 are as follows.

The growth temperature Tq, the $NH_3$ partial pressure $P_{NH3}$, the HCl partial pressure $P_{HCl}$, and the V/III ratio b are shown below in the above order:

| 970° C. | 25 kPa | 2 kPa | 12.5 times |
|---|---|---|---|
| 970° C. | 25 kPa | 2.5 kPa | 10 times |
| 970° C. | 25 kPa | 0.5 kPa | 50 times |
| 1,000° C. | 20 kPa | 2 kPa | 10 times |
| 950° C. | 25 kPa | 2 kPa | 12.5 times |
| 1,020° C. | 25 kPa | 2 kPa | 12.5 times |
| 1,000° C. | 25 kPa | 2 kPa | 12.5 times |
| 1,010° C. | 25 kPa | 2 kPa | 12.5 times |
| 1,030° C. | 25 kPa | 2 kPa | 12.5 times |

The substrate temperature for HVPE in Patent Document 1 is 950° C. to 1,030° C., and the V/III ratio b is 10 to 50 times.

Japanese Patent No. 3788037 (Japanese Patent Application No. 10-171276, Japanese Unexamined Patent Application Publication No. 2000-012900) (Patent Document 2) provides a free-standing GaN substrate having a diameter of 20 mm or more, a thickness of 70 μm or more, and a deflection (bow) of 0.55 mm or less on a 50 mm diameter wafer basis by forming a mask having a staggered pattern of fine windows on a GaAs substrate, growing a thick GaN film thereon by HVPE while maintaining the c-plane, and removing the GaAs substrate. A central deflection (bow) of 0.55 mm on a 50 mm diameter wafer basis is equivalent to a radius of curvature R of about 600 mm=0.6 m, meaning that the curvature is large.

In Patent Document 2, the growth temperature for HVPE is 970° C., 1,020° C., or 1,030° C., the GaCl partial pressure $P_{GaCl}$ is 1 or 2 kPa (0.01 to 0.02 atm), and the $NH_3$ partial pressure $P_{NH3}$ is 4 or 6 kPa. Patent Document 2 discloses that a crystal formed at a GaCl partial pressure $P_{GaCl}$ of 1 kPa is impractical because it has a flat surface but has large bow and large internal stress and cracks easily, and it cannot be formed to a thickness of 70 μm or more.

Conversely, according to Patent Document 2, a crystal formed at a GaCl partial pressure $P_{GaCl}$ of 2 kPa has a rough surface but has small bow and small internal stress. The $NH_3$ partial pressure is 6, 12, or 24 kPa. The WM ratio b is 3, 6, or 12. The radius of curvature is about 1 m. The resistivity is 0.0035 to 0.0083 Ωcm. This crystal is n-type.

The growth conditions disclosed in the examples in Patent Document 2 are as follows.

The growth temperature Tq, the $NH_3$ partial pressure $P_{NH3}$, the GaCl partial pressure $P_{GaCl}$, and the V/III ratio b are shown below in the above order:

| 1,030° C. | 4 kPa | 1 kPa | 4 times |
|---|---|---|---|
| 1,030° C. | 6 kPa | 1 kPa | 6 times |
| 970° C. | 6 kPa | 2 kPa | 3 times |
| 970° C. | 6 kPa | 1 kPa | 6 times |
| 970° C. | 6 kPa | 1 kPa | 6 times |
| 1,020° C. | 6 kPa | 2 kPa | 3 times |
| 1,020° C. | 6 kPa | 2 kPa | 3 times |
| 1,030° C. | 6 kPa | 1 kPa | 6 times |
| 970° C. | 6 kPa | 2 kPa | 3 times |
| 970° C. | 12 kPa | 2 kPa | 6 times |
| 970° C. | 24 kPa | 2 kPa | 12 times |

All examples are formed by HVPE. The substrate temperature is 970° to 1,030° C., and the V/III ratio b is 3 to 12 times. The growth conditions (substrate temperature and V/III ratio b) of Patent Document 2 are indicated by the eleven black dots in the lower left of FIG. 22.

Japanese Patent No. 3788041 (Japanese Patent Application No. 10-183446, Japanese Unexamined Patent Application Publication No. 2000-022212) (Patent Document 3) proposes a method for producing a free-standing single-crystal GaN substrate by forming, on a GaAs substrate, a mask having a dot pattern of windows arranged at predetermined intervals in the [11-2] direction and shifted by half the pitch in the [-110] direction, a mask having a stripe pattern of windows extending in the [11-2] direction, or a mask having a stripe pattern of windows extending in the [-110] direction; forming a buffer layer; epitaxially growing GaN by HVPE while maintaining the c-plane; and removing the substrate and the mask.

The technique proposed in Patent Document 3 reduces dislocations T by forming a mask having numerous small windows arranged at a narrow pitch in two orthogonal directions on the underlying substrate U, as shown in FIG. 1, and growing GaN in vapor phase. The GaCl partial pressure $P_{GaCl}$ is 1 kPa (0.01 atm) or 2 kPa (0.02 atm). Patent Document 3 discloses that a GaN crystal formed at a GaCl partial pressure $P_{GaCl}$ of 1 kPa has a flat surface but has large internal stress and large bow and cracks easily and that a GaN crystal formed at a GaCl partial pressure $P_{GaCl}$ of 2 kPa has a rough surface but has small internal stress and small bow and does not crack easily.

Patent Document 3 also discloses that a crystal formed at a growth temperature of 1,020° C. or 1,030° C. has a flat surface but has large internal stress and cracks easily.

Patent Document 3 also discloses that a thick GaN crystal formed at a growth temperature of 970° C. and a GaCl partial pressure $P_{GaCl}$ of 2 kPa has a rough surface but has small internal stress and small bow. The $NH_3$ partial pressure $P_{NH3}$ is 6 to 12 kPa.

In summary, according to Patent Document 3, the conditions for producing a GaN crystal that has a rough surface but has small bow and small internal stress and does not crack easily are a growth temperature of 970° C., a GaCl partial pressure of 2 kPa, a $NH_3$ partial pressure of 6 to 12 kPa, and a V/III ratio b of about 3 to 6. The crystal has a resistivity of 0.01 to 0.017 Ωcm and is n-type.

The HVPE growth conditions disclosed in the examples in Patent Document 3 are as follows.

The growth temperature Tq, the $NH_3$ partial pressure $P_{NH3}$, the GaCl partial pressure $P_{GaCl}$, and the V/III ratio b are shown below in the above order:

| | | | |
|---|---|---|---|
| 1,030° C. | 4 kPa | 1 kPa | 4 times |
| 1,030° C. | 6 kPa | 1 kPa | 6 times |
| 970° C. | 6 kPa | 2 kPa | 3 times |
| 970° C. | 6 kPa | 1 kPa | 6 times |
| 970° C. | 6 kPa | 1 kPa | 6 times |
| 1,020° C. | 6 kPa | 2 kPa | 3 times |
| 1,020° C. | 6 kPa | 2 kPa | 3 times |
| 1,030° C. | 6 kPa | 1 kPa | 6 times |
| 970° C. | 6 kPa | 2 kPa | 3 times |
| 970° C. | 12 kPa | 2 kPa | 6 times |
| 970° C. | 24 kPa | 2 kPa | 12 times |

All examples are formed by HVPE. The substrate temperature is 970° to 1,030° C., and the V/III ratio b is 3 to 12 times. The growth conditions (substrate temperature and V/III ratio b) of Patent Document 3 are indicated by the eleven black dots in the lower left of FIG. 22.

In PCT International Publication No. WO98/47170 (PCT International Application No. PCT/JP 98/01640) (Patent Document 4), two or three epitaxial lateral overgrowth (ELO) masks are formed so as to be alternately superimposed to reduce dislocations, and a silicon-doped n-type GaN crystal is grown by MOCVD or HVPE while maintaining the c-plane. According to Patent Document 4, dislocations can be reduced by forming two or three ELO masks such that windows are shifted from each other because the dislocation density is higher above the windows and is lower above the masks. Patent Document 4 discloses that a V/III ratio b of 30 to 2,000 times is appropriate for MOCVD.

In the examples in Patent Document 4, MOCVD is used, and source gases are used in a V/III ratio b of 12,000 times, 2,222 times, 1,800 times, 1,500 times, 800 times, or 30 times. Patent Document 4 discloses that the preferred growth temperature is 950° C. to 1,050° C. The conditions for HVPE are not disclosed. In FIG. 22, lines are drawn along the temperature range of 950° C. to 1,050° C. at b=2,222 times, 1,800 times, 1,500 times, 800 times, and 30 times and are marked with circled black dots. The n-type dopant is silicon. Silicon serves as an n-type dopant because a silicon atom replaces a gallium atom to release one free electron. Silane gas ($SiH_4$) is used for doping. First, truncated crystals are formed above the windows of the ELO masks by MOCVD, and the process is switched to HVPE immediately before the truncated crystals combine above the ELO masks.

EPC Publication No. EP0942459 A1 (EPC Application No. 9891274.8) (Patent Document 5) is substantially the same as Patent Document 4 and proposes a technique for reducing dislocations using two or three ELO masks. The growth conditions, including the substrate temperature, and the group III source material partial pressure, and the group V source material partial pressure, are the same as those of Patent Document 4 and therefore will not be described. Although not shown in FIG. 22, the growth conditions of Patent Document 5 are equivalent to those of Patent Document 4.

Japanese Patent No. 3788104 (Japanese Unexamined Patent Application Publication No. 2000-044400, Japanese Patent Application No. 11-144151, priority claim based on Japanese Patent Application No. 10-147716) (Patent Document 6) first proposed a method for producing an n-type GaN substrate by doping GaN with oxygen (O) as an n-type dopant. Oxygen may serve as an n-type dopant because it can release one free electron by replacing nitrogen. However, it is unknown what level oxygen forms in GaN, and it is therefore uncertain whether oxygen serves as an n-type dopant unless a doping test is carried out in practice. Patent Document 6 does not specifically disclose substrate temperature or source material partial pressure, and they are not shown in FIG. 22.

In Patent Documents 4 and 5, a crystal is doped with silicon, which serves as an n-type dopant, using silane gas ($SiH_4$). The use of a large amount of silane gas for growth of an n-type substrate is hazardous because it has the risk of explosion. Patent Document 6 has found that oxygen forms a shallow donor level in GaN. If a GaN crystal is grown by HVPE on a GaAs substrate on which an ELO mask is formed using a source gas, such as $NH_3$ or HCl, to which water is added, the crystal is doped with oxygen from the source gas during c-plane growth to form a donor level and produce n-type carriers, thus making the crystal n-type. In addition, according to Patent Document 6, the activation rate is 100% over a wide range of concentration. Thus, Patent Document 6 first revealed that oxygen can serve as an n-type dopant advantageous for a thick crystal such as a substrate. Patent Document 6, however, only first pointed out that oxygen can serve as an n-type dopant and does not recognize anisotropy in doping.

Japanese Patent No. 3826825 (Japanese Unexamined Patent Application Publication No. 2002-373864, Japanese Patent Application No. 2002-103723, priority claim based on Japanese Patent Application No. 2001-113872) (Patent Document 7) reveals that oxygen doping of GaN has significant anisotropy, that is, the selectivity that oxygen is not easily absorbed through the c-plane ((0001) plane) and is easily absorbed through planes other than the c-plane. As shown in FIG. 17, Patent Document 7 proposes a technique for growing a crystal in the c-axis direction as a whole while forming numerous non-c-plane facets F in the surface thereof so that oxygen is absorbed into the crystal through the non-c-plane facets F, as shown in FIG. 17, or growing a crystal on a GaN underlying substrate having a non-c-plane surface (hkmn) (≠(0001) plane) while doping it with oxygen through the non-c-plane surface, as shown in FIG. 18. Thus, Patent Document 7 first revealed significant anisotropy in oxygen doping.

The HVPE growth conditions disclosed in an example in Patent Document 7 are as follows.

The growth temperature Tq, the $NH_3$ partial pressure $P_{NH3}$, the HCl partial pressure $P_{HCl}$, and the V/III ratio b are shown below in the above order:

| | | | |
|---|---|---|---|
| 1,020° C. | 20 kPa | 1 kPa | 20 times |

The coordinates of 1,020° C. and 20 times in FIG. 22 are indicated by the black dot marked with "7".

Japanese Unexamined Patent Application Publication No. 2001-102307 (Japanese Patent Application No. 11-273882) (Patent Document 8) proposes a novel method for reducing dislocation density that is quite different from ELO (see FIG. 1 and FIGS. 2A to 2G; that is, as shown in FIG. 2G, a crystal is grown while maintaining a flat c-plane surface). In Patent Document 8, as shown in FIG. 3, numerous pits P of varying sizes defined by facets F are intentionally formed under appropriately controlled growth conditions, and the facets F are maintained to the end of the growth without filling the pits P. This method is referred to as facet growth since the facets F are maintained to the end without filling the pits P. Although the pits P are six- or twelve-sided pyramids, six-sided pyramid pits are shown here for brevity.

As shown in the perspective view of the pits P in FIG. 4 and the plan view of the pits P in FIG. 5, as a crystal is grown while maintaining the recesses (pits P) defined by the facets F, it grows in a direction V normal to the facets F inside the pits P. Because dislocations T propagate in the growth direction, they propagate in the direction V normal to the facets F. During the facet growth, the dislocations T cluster at boundaries B. Thus, clusters of dislocations T are formed under the boundaries B (planar defects PD).

As the facet growth proceeds, the dislocations T further cluster at the bottoms of the pits P. Clusters of numerous dislocations T (linear clusters of defects H) are formed at the bottoms of the pits P. Even through the total number of dislocations T remains nearly the same, the dislocation density is lower at other portions because the dislocations T cluster into the planar defects PD and the linear defects H. Unlike ELO (see FIG. 1 and FIGS. 2A to 2G), this method provides the effect of reducing dislocations from the middle stage to the final stage of the growth. Thus, this is a completely novel method for reducing dislocation density. This method is referred to as facet growth since it maintains facets to reduce dislocations by the effect of the facets.

Because it is uncertain where the pits P (recesses) are formed in the technique in Patent Document 8, this is referred to as random facet growth to distinguish it from the later improved versions. The resultant crystal has noticeable surface irregularities.

The growth conditions disclosed in the examples in Patent Document 8 (random facet growth) are as follows.

The growth temperature T, the NH$_3$ partial pressure P$_{NH3}$, the HCl partial pressure P$_{HCl}$, and the V/III ratio b are shown below in the above order:

| | | | |
|---|---|---|---|
| 1,050° C. | 20 kPa | 0.5 kPa | 40 times |
| 1,000° C. | 30 kPa | 2 kPa | 15 times |
| 1,050° C. | 20 kPa | 0.5 kPa | 40 times |
| 1,020° C. | 20 kPa | 1 kPa | 20 times |
| 1,000° C. | 30 kPa | 2 kPa | 15 times |
| 1,000° C. | 40 kPa | 3 kPa | 13 times |
| 980° C. | 40 kPa | 4 kPa | 10 times |

In the growth conditions of Patent Document 8, the substrate temperature is 980° C. to 1,050° C., and the V/III ratio b is 10 to 40 times. The V/III ratio b is high. Seven black dots having the substrate temperatures and the V/III ratios b shown above as the coordinates thereof are distributed in the center of the lower half of FIG. 22.

In Patent Document 8, the positions where facet pits are formed are randomly determined because the substrate has no anisotropy or specificity; thus, this method is referred to as random facet growth. Because the pit positions are randomly determined, it is difficult to fabricate devices on the substrate. In addition, clustered dislocations can be redispersed as the crystal grows because of the absence of local specificity.

Because devices are fabricated on the substrate, it will be more advantageous if the positions where facet pits are formed can be designated in advance. In addition, the dislocation density will be further reduced if the dislocations can be confined and prevented from being redispersed.

As shown in FIG. 6, Japanese Patent No. 3864870 (Japanese Unexamined Patent Application Publication No. 2003-165799, Japanese Patent Application No. 2002-230925, priority claim based on Japanese Patent Application No. 2001-284323) (Patent Document 9) uses a mask having an isolated dot pattern of masking portions M regularly arranged on the underlying substrate U. Unlike the ELO mask shown in FIG. 1 and FIGS. 2A to 2G, the region where the underlying substrate U is exposed (exposed portion E) is much larger than the masking portion (mask portions) M. The sum of the spacing w and the diameter s of the masking portions M is the pitch p. The spacing w is much larger than the diameter s, and the pitch p of the masking portions M is much larger than that of an ELO mask. GaN is grown in vapor phase on the masked underlying substrate U. The growth starts from the exposed portion E, and a thin film is formed on the exposed portion E. Because the growth is delayed on the masking portions M, recesses (facet pits P) whose bottoms are defined by the masking portions M are formed.

Facet growth using a dot mask will now be described with reference to FIGS. 7, 8, and 9A to 9F. Referring to FIG. 9A, an isolated dot pattern of masking portions M is formed on the underlying substrate U. Referring to FIG. 9B, as GaN is grown in vapor phase, a crystal G grows only on the exposed portion E of the underlying substrate U; it does not grow on the masking portions M. Referring to FIG. 9C, the crystal G grows upward above the exposed portion E. The inclined surfaces are low-index facets F. Referring to FIG. 9D, six- or twelve-sided pyramid facet pits P are formed whose bottoms are defined by the masking portions M and whose inclined surfaces are defined by the facets F. Referring to FIG. 9E, the crystal G overgrows the masking portions M. These portions are closed defect cluster regions H where dislocations cluster at high density. The portions below the facets F are single-crystal low-dislocation-density concomitant regions Z. The flat surface is the c-plane (C). The portion below the c-plane is a single-crystal low-dislocation-density remaining region Y.

As shown in the perspective view of the crystal G in FIG. 7 and the plan view of FIG. 8, facet pits P defined by facets F having the shape of an inverted cone like a flower petal are arranged in the surface of the crystal G in two orthogonal directions. The portions corresponding to the stalk are the closed defect cluster regions H where dislocations cluster. The portions corresponding to the root are the masking portions M. The flat surface is the c-plane. The portion under the c-plane is a low-dislocation-density region (Y). The portions below the facets F are also low-dislocation-density regions (Z). This mask is referred to as a dot mask to distinguish it from others. This method is referred to as dot facet growth.

The facet pits P, as described above, have the effect of causing dislocations in the facets F to cluster at the boundaries B and further cluster at the bottoms of the pits P. The bottoms of the pits P (above the masking portions M) are the closed defect cluster regions H where dislocations cluster. The closed defect cluster regions H are "closed" because the clustered dislocations are no longer redispersed. The other portions are the single-crystal low-dislocation-density concomitant regions Z (formed below the facets F) having a low-dislocation-density and the single-crystal low-dislocation-density remaining region Y (formed below the c-plane). The regions Z and Y have low dislocation density.

Patent Document 9 first introduced the concepts of the closed defect cluster regions H, the single-crystal low-dislocation-density concomitant regions Z, and the single-crystal low-dislocation-density remaining region Y. The closed defect cluster regions H are formed above the masking portions M. The single-crystal low-dislocation-density concomitant regions Z are formed above the exposed portion E, where the masking portions M are not formed, beside (so as to be attached to) the masking portions M. The single-crystal low-dislocation-density remaining region Y is formed above the exposed portion E in a region remote from the masking portions M. The single-crystal low-dislocation-density concomitant regions Z are formed beside (so as to be attached to) the masking portions M because they are formed below the facets F, which are formed diagonally with respect to the masking portions M so as to cover the exposed portion E. The single-crystal low-dislocation-density remaining region Y is formed in a region remote from the masking portions M because they are surrounded by the single-crystal low-dislocation-density concomitant regions Z. Unlike an ELO mask, the mask used for facet growth does not have fine windows arranged at a small pitch, but has a dot pattern (such as circles or squares) of masking portions M (see FIG. 6) of considerable size in a large exposed portion.

For an ELO mask (see FIGS. 1 and 2A to 2G), the masking portion M is a single continuous region larger than the exposed portions E (windows W), and the numerous exposed portions E (windows W) are small (1 to 2 μm in diameter), are arranged at a small pitch (2 to 6 μm), and have a total area smaller than that of the masking portion M.

Conversely, for the mask serving as the basis of the facet pits P in Patent Document 9, as shown in FIG. 6, the exposed portion E is larger than the masking portions M. The exposed portion E is a single continuous region. The masking portions M are large in number but have a total area smaller than that of the exposed portion E. As shown in FIGS. 7, 8, and 9A to 9F, because the facets F are formed above the exposed portion E and low-dislocation-density high-quality regions, namely, the single-crystal low-dislocation-density concomitant regions Z, are formed directly below the facets F, it is essential to form a large exposed portion E. The diameter of the masking portions M is considerably large (20 to 100 μm in diameter). The bottoms of the facet pits P are located above the masking portions M. The facet pits P collect and trap dislocations at the bottoms thereof and do not release the dislocations. This mask is characterized in that the closed defect cluster regions H are formed above the masking portions M and the low-dislocation-density regions Z and Y are formed therearound (see FIGS. 8 and 9A to 9F). The low-dislocation-density regions Z and Y are formed above the exposed portion E, where the masking portions M are not formed. The regions Z are formed directly below the facets F, and the region Y is formed directly below the c-plane growth portion. The regions Z and Y are formed of a single crystal and have low dislocation density. Thus, concentric HZY structures are formed around the dot masking portions M. This relationship is opposite to that of an ELO mask, in which high-dislocation-density regions (H) are formed above the exposed portions E (windows W) and low-dislocation-density regions (Z, Y) are formed above the masking portion M.

The growth conditions of the examples in Patent Document 9 are as follows.

The growth temperature $T_q$, the $NH_3$ partial pressure $P_{NH3}$, the HCl partial pressure $P_{HCl}$, and the V/III ratio b are shown below in the above order:

| | | | |
|---|---|---|---|
| 1,050° C. | 30 kPa | 2 kPa | 15 times |
| 1,030° C. | 30 kPa | 2.5 kPa | 12 times |
| 1,010° C. | 20 kPa | 2.5 kPa | 8 times |
| 1,030° C. | 25 kPa | 2.5 kPa | 10 times |
| 1,050° C. | 30 kPa | 2.5 kPa | 12 times |
| 1,030° C. | 25 kPa | 2 kPa | 12.5 times |
| 1,030° C. | 25 kPa | 2 kPa | 12.5 times |

The growth temperature is 1,010° C. to 1,050° C., and the V/III ratio b is 8 to 15 times.

These examples are indicated by the seven black dots marked with the number "9" in the center of the lower half of FIG. 22.

In Patent Document 9, because the mask has a regularly distributed isolated dot pattern, the closed defect cluster regions H are formed above the dots (masking portions), and the single-crystal low-dislocation-density concomitant regions Z and the single-crystal low-dislocation-density remaining region Y are formed therearound above the exposed portion E. The dispersed closed defect cluster regions H are disadvantageous in fabricating devices such as semiconductor lasers or light-emitting diodes on the substrate.

Accordingly, in Japanese Patent No. 3801125 (Japanese Unexamined Patent Application Publication No. 2003-183100, Japanese Patent Application No. 2002-269387, priority claim based on Japanese Patent Application No. 2001-311018) (Patent Document 10), as shown in FIG. 10, a mask having a regularly spaced parallel stripe pattern of masking portions M is formed on the underlying substrate U, and GaN is grown thereon by facet growth. The sum of the width s of the masking portions M and the width w of the exposed portions E is the pitch p (p=s+w). The widths s and w in this method are larger than the pitch or spacing in ELO. The width w is much larger than the width s. GaN is grown in vapor phase on the underlying substrate U.

As shown in the plan view of FIG. 11 and the perspective view of FIG. 12, numerous parallel ridge-and-valley crystals having flat top faces are formed. Parallel crystal defect cluster regions H are formed above the masking portions M, and parallel low-dislocation-density single-crystal regions Z and c-plane growth regions Y are formed above the exposed portions E. The regions where dislocations cluster above the parallel masking portions M are referred to as the crystal defect cluster regions H. The regions continuously grown below the facets F adjacent to the crystal defect cluster regions H are referred to as the low-dislocation-density single-crystal regions Z. The c-plane growth regions Y may or may not be formed between the adjacent low-dislocation-density single-crystal regions Z.

Whereas Patent Document 9 uses the term "closed" to emphasize that the defect regions H are closed because they are formed above the isolated dot pattern of masking portions M, the term "closed" is inappropriate for the regions H formed above the stripe pattern of masking portions M because they are not closed at the ends thereof; thus, the regions formed above the masking portions M are referred to as the crystal defect cluster regions H. These regions are the same as the closed defect cluster regions H in Patent Document 9 and are therefore denoted by the same symbol H. In addition, the term "concomitant" is inappropriate for the regions Z because the exposed portions E spread continuously and the regions Z are not necessarily concomitant with the regions H; thus, the regions Z are referred to as the low-dislocation-density single-crystal regions Z. These regions are the same as the single-crystal low-dislocation-density concomitant regions Z in Patent Document 9 and are therefore denoted by the same symbol Z. For the dot mask in Patent Document 9, a remaining portion occurs necessarily if osculating circles of equal radius are drawn about the masking portions M. Accordingly, the single-crystal low-dislocation-density remaining region Y occurs necessarily in Patent Document 9. In Patent Document 10, on the other hand, the regions Y may or may not be formed because the mask has a parallel stripe pattern. The regions Y are formed where the c-plane appears. Because the regions Y occur in the c-plane, they are referred to as the c-plane growth regions Y in Patent Document 10. These regions are the same as the single-crystal low-dislocation-density remaining region Y and are therefore denoted by the same symbol Y.

The c-plane growth regions Y may disappear depending on the manner of growth. As shown in the plan view of FIG. 13 and the perspective view of FIG. 14, ridge-and-valley crystals having sharp ridges may be formed. The parallel crystal defect cluster regions H are formed above the masking portions M, thus forming the valleys. The parallel low-dislocation-density single-crystal regions Z are formed above the exposed portions E adjacent thereto. The ridges formed by the facets F are sharp and have no c-plane portion. The c-plane growth regions Y are lost; that is, the . . . ZHZH . . . structure is formed.

Stripe facet growth will now be described with reference to FIGS. 15A to 15F.

Referring to FIG. 15A, a parallel stripe pattern of masking portions M is formed on the underlying substrate U. The pitch p of the masking portions M (20 to 2,000 μm) is much larger than the pitch of the mask windows w in FIGS. 1 and 2A to 2G (about 2 to 6 μm). The exposed portions E are larger than the masking portions M. Referring to FIG. 15B, as GaN is grown in vapor phase, crystals G grow only on the exposed portions E of the underlying substrate U; they do not grow on the masking portions M. Referring to FIG. 15C, the crystals G grow upward above the exposed portions E. The inclined faces are low-index facets F. The crystals G are formed as parallel stripes separated by the masking portions M. Referring to FIG. 15D, parallel V-grooves whose bottoms are defined by the masking portions M are formed by the parallel inclined faces inclined in opposite directions. The opposite inclined faces are the facets F inclined at the same angle in opposite directions. The flat faces between the adjacent masking portions M are the c-plane (C).

Referring to FIG. 15E, the crystals G overgrow the masking portions M. These portions are the crystal defect cluster regions H where dislocations cluster at high density. Referring to FIG. 15F, the crystals G grow further. The crystal defect cluster regions H above the masking portions M grow upward while substantially maintaining their areas. The parallel facets F become larger. The portions directly below the facets F are the low-dislocation-density single-crystal regions Z. The boundaries between the crystal defect cluster regions H and the low-dislocation-density single-crystal regions Z are crystal boundaries K. The crystal boundaries K confine dislocations within the crystal defect cluster regions H.

The flat faces formed midway between the masking portions M are the c-plane (C). The portions below the c-plane are the c-plane growth regions Y. The c-plane becomes gradually narrower. The pitch of the stripe pattern of crystals G is equal to the mask pitch p, which is the sum the width s of the masking portions M and the width w of the exposed portions E (p=s+w). As the crystal growth proceeds, as shown in FIG. 16A, parallel crystals grow like a mountain range, with the crystal defect cluster regions H forming the bases of the mountains and the c-plane forming the ridges of the mountains. The c-plane portions (C), corresponding to the mountaintops, become narrower. The portions directly below the facets F are the low-dislocation-density single-crystal regions Z, and the portions directly below the c-plane are the c-plane growth regions Y.

The crystals G may grow upward while maintaining their shapes, or may grow further into the shape of parallel mountains having sharp peaks, as shown in FIG. 16B. In this case, the c-plane disappears, and the c-plane growth regions Y also disappear.

In Patent Document 10, the . . . ZHZYZHZYZH . . . structure or the . . . ZHZHZH . . . structure is formed. The crystal defect cluster regions H have dislocations concentrated therein, and the low-dislocation-density single-crystal regions Z and the c-plane growth regions Y are formed of a single crystal and have low dislocation density.

The method of Patent Document 10 is referred to as stripe facet growth because the parallel crystal defect cluster regions H are formed by forming a mask having a parallel stripe pattern. In this case, devices such as semiconductor lasers or light-emitting diodes can be easily fabricated because the low-dislocation-density single-crystal regions Z extend in a straight line.

Facet growth and ELO are totally different methods, and the shapes, dimensions, and effects of the masks are also different. An ELO mask, which has windows distributed in a staggered pattern, can be clearly distinguished from a stripe mask because they have different shapes and dimensions. An ELO mask has numerous small windows having a diameter of 1 to 2 μm and distributed at a pitch of about 2 to 6 μm. A stripe mask has a width s of about 10 to 300 μm and a pitch p of about 20 to 2,000 μm. A stripe mask is a coarse mask, for example, having a width s of 50 μm and a pitch p of 500 μm.

In dot facet growth and stripe facet growth, dislocations are concentrated in the crystal defect cluster regions H above the masking portions M and are no longer redispersed because they are confined by the crystal boundaries K. The regions Z and Y adjacent to the regions H have low dislocation density and are formed of a single crystal. These portions may be used as portions where a device current flows.

A GaN crystal can be used to form a cavity mirror of a laser by natural cleavage because it cleaves in a {1-100} direction. A cathode can be formed on the bottom surface of the crystal because it is made n-type by oxygen doping so that a current flows therethrough. In this respect, a GaN crystal is superior to a sapphire substrate.

In ELO, high-dislocation-density regions are formed above small exposed portions, and a low-dislocation-density region is formed above a large masking portion. In stripe facet growth, on the other hand, low-dislocation-density regions are formed above wide exposed portions, and high-dislocation-density regions are formed above narrow masking portions.

The growth conditions of the examples (all by HVPE) in Patent Document 10 are as follows.

The growth temperature Tq, the $NH_3$ partial pressure $P_{NH3}$, the HCl partial pressure $P_{HCl}$ and the V/III ratio b are shown below in the above order:

| | | | |
|---|---|---|---|
| 1,050° C. | 30 kPa | 2 kPa | 15 times |
| 1,030° C. | 30 kPa | 2.5 kPa | 12 times |
| 1,050° C. | 30 kPa | 2 kPa | 15 times |
| 1,010° C. | 20 kPa | 2.5 kPa | 8 times |

-continued

| 1,030° C. | 25 kPa | 2 kPa | 12.5 times |
| 1,030° C. | 25 kPa | 2.5 kPa | 10 times |

In Patent Document 10, the substrate temperature is 1,010° C. to 1,050° C., and the V/III ratio b is 8 to 15 times. The growth conditions of Patent Document 10 are indicated by the six dots marked with the number "10" in the center of the lower half of FIG. 22.

Japanese Unexamined Patent Application Publication No. 2005-306723 (Japanese Patent Application No. 2005-075734, priority claim based on Japanese Patent Application No. 2004-085372) (Patent Document 11) proposes a method for producing an iron-doped GaN substrate by growing an iron-doped GaN crystal on a sapphire (0001) substrate by MOCVD using $H_2$, TMG, and ammonia as source gases and $(C_5H_5)_2Fe$ as a dopant, or by HVPE using $H_2$, HCl, molten gallium, and ammonia as source materials and $(C_5H_5)_2Fe$ as a dopant. Patent Document 11 is intended to produce a semi-insulating substrate by iron doping.

The growth conditions of an example (MOCVD) in Patent Document 11 are as follows.

The growth temperature Tq, the $NH_3$ partial pressure $P_{NH3}$, the TMG partial pressure $P_{TMG}$, and the V/III ratio b are shown below in the above order:

| 1,000° C. | 15 kPa | 0.3 kPa | 50 times |

This example is indicated by the circled black dot at 1,000° C. and 50 times in the center of FIG. 22.

The growth conditions of an example (HVPE) in Patent Document 11 are as follows.

The growth temperature Tq, the $NH_3$ partial pressure $P_{NH3}$, the HCl partial pressure and the V/III ratio b are shown below in the above order:

| 1,000° C. | 15 kPa | 0.3 kPa | 50 times |

This example is indicated by the black dot at 1,000° C. and 50 times in the center of FIG. 22.

The substrates that have so far been discussed are n-type GaN substrates used as substrates for blue light-emitting diodes and semiconductor lasers and semi-insulating (SI) GaN substrates used as substrates for field-effect transistors (FET). AlInGaN substrates containing small amounts of aluminum and indium have also been produced for use as substrates for light-emitting devices. These substrates allow a high-density current to flow therethrough because they are n-type and have high conductivity. The dopant is silicon (Si) or oxygen (O).

For light-emitting devices, dislocations may lead to deterioration because a high-density current flows through the substrate. Accordingly, a low dislocation density is desired in view of inhibiting deterioration. However, there are other problems.

A substrate having high dislocation density is undesirable because it causes current leakage. Fewer dislocations are desirable because GaN, InGaN, or AlGaN thin films having a regular lattice structure are formed in layers on the substrate. In addition, a substrate having little bow and low cracking ratio is desirable because semiconductor devices are fabricated thereon. Accordingly, as a conductive substrate, a substrate having high conductivity, little bow, low dislocation density, and low cracking ratio is strongly desired.

The GaN substrates mentioned as the related art (Patent Documents 1 to 10) have low resistivity and are n-type.

Patent Document 1 discloses that the resistivity is 0.005 to 0.08 Ωcm. Patent Document 2 discloses that the resistivity is 0.0035 to 0.0083 Ωcm. Patent Document 3 discloses that the resistivity of the GaN substrate is 0.01 to 0.017 Ωcm.

In Patent Documents 1 to 3, it is assumed that vacancies of the group V element form a donor level or an n-type dopant element contained in the source gases is introduced because they do not disclose that an n-type dopant is introduced.

Patent Document 4 does not specify resistivity. Because this intends to form a low-resistivity n-type GaN substrate using silicon as a dopant, it is assumed that the resistivity is lower than those of Patent Documents 1 to 3. From the descriptions thereof, it is assumed that the upper limit of the GaN crystals of the related art is about 0.08 Ωcm and the lower limit thereof is about 0.005 Ωcm.

ELO cannot sufficiently reduce dislocations. Facet growth, proposed in Patent Documents 8 and 9, have the effect of reducing dislocation density. Currently known methods for forming conductive GaN include oxygen doping and silicon doping. For oxygen doping, as in Patent Documents 6 and 7, water or oxygen may be mixed in a source gas. These are safe substances. For silicon doping, as in Patent Documents 4 and 5, silane ($SiH_4$) gas must be supplied. Silane gas is a hazardous gas and therefore should not be used in large quantities. In addition, it is uncertain whether or not the absorption of $SiH_4$ gas has plane dependence. There is no research as to whether or not silicon doping has anisotropy for the c-plane and the m- or a-plane, or generally a facet plane (hereinafter abbreviated to "f-plane"). If silicon has the same plane orientation dependence as oxygen, the dosage of the n-type impurity cannot be made uniform. However, if silicon and oxygen have different plane dependence, the resistivity may be complementarily made uniform.

Facet growth is effective in reducing dislocation density. By causing dislocations to cluster into closed defect cluster regions above the masking portions, the dislocation density can be reduced in other portions. In addition, the substrate has little bow and low cracking ratio because it has a rough surface.

Nevertheless, facet growth has some disadvantages. One of the disadvantages is anisotropy in oxygen absorption during oxygen doping. The use of facet growth for forming an oxygen-doped n-type crystal results in significant plane orientation dependence in doping efficiency. Patent Document 7 discloses that the efficiency of oxygen doping is lowest in the c-plane and that the amount of oxygen absorbed through the facets is 50 times or more that through the c-plane. Facet growth portions and c-plane growth portions are mixed in the crystal formed by facet growth. The oxygen concentration is lower in the c-plane because it absorbs little oxygen and is higher in the facets because the amount of oxygen absorbed through the facets is 50 times or more that through the c-plane. A crystal formed by facet growth has uneven oxygen concentration because it includes c-plane portions. If devices are fabricated using such crystals as substrates, the devices have significant variations in conductivity.

If a crystal is formed by c-plane growth, rather than by facet growth, it has high resistivity because little oxygen is absorbed. In addition, the crystal formed by c-plane growth, in which the crystal is grown while maintaining a flat surface, cracks and splits off easily, whereas a crystal formed by facet growth does not crack easily and is robust. Thus, an n-type substrate having low cracking ratio, little bow, and uniform resistivity is desired.

SUMMARY OF THE INVENTION

Accordingly, it is an object of the present invention to provide an n-type GaN substrate having low cracking ratio, little bow, and uniform resistivity. One aspect of the present invention relates to a method for producing a conductive nitride semiconductor substrate, comprising the steps of: preparing an underlying substrate having a c-plane or a plane with three-fold symmetry; forming, on the underlying substrate, masking portions having a width or diameter of 10 to 100 μm and periodically repeated at a spacing of 250 to 10,000 μm and an exposed portion where the substrate is exposed; growing a nitride semiconductor crystal having facets in a surface thereof on the underlying substrate by hydride vapor phase epitaxy (HVPE) at a crystal growth temperature of 1,040° C. to 1,150° C. while doping the nitride semiconductor crystal with silicon and oxygen by supplying a group III source gas, a group V source gas, a silicon compound gas, and water or oxygen in a V/III ratio of 1 to 10 so that low-dislocation-density single-crystal regions Z following the facets and a c-plane growth region Y following a flat face are formed above the exposed portion and crystal defect cluster regions H are formed above the masking portions, the nitride semiconductor crystal being doped with oxygen and silicon through the facets and with silicon through a c-plane and having an HZYZHZYZ . . . structure in an inner portion thereof; removing the underlying substrate; and polishing the surface of the nitride semiconductor crystal to form a freestanding conductive nitride semiconductor crystal having a cracking ratio K of $1\% \leq K \leq 22\%$.

Another aspect of the present invention relates to a conductive nitride semiconductor substrate comprising a bottom portion, an inner portion, and a surface portion in order in a crystal growth direction, the bottom portion and the inner portion including crystal defect cluster regions H, low-dislocation-density single-crystal regions Z, and a c-plane growth region Y periodically arranged in the order of the crystal defect cluster regions H, the low-dislocation-density single-crystal regions Z, the c-plane growth region Y, and the low-dislocation-density single-crystal regions Z in a direction perpendicular to the growth direction, thereby forming an HZYZHZYZ . . . structure, the crystal defect cluster regions H in the bottom portion and the inner portion having a width or diameter of 10 to 100 μm in a cross section perpendicular to the growth direction, ZYZ portions defined between the adjacent crystal defect cluster regions H having a width of 250 to 10,000 μm, the surface portion including the c-plane growth region Y and not including the crystal defect cluster regions H or the low-dislocation-density single-crystal regions Z, the low-dislocation-density single-crystal regions Z and the crystal defect cluster regions H being doped with silicon and oxygen, the c-plane growth region Y being doped with silicon, the conductive nitride semiconductor substrate having a thickness of 100 μm or more, a diameter of 18 mm or more, a cracking ratio K of $1\% \leq K \leq 22\%$, a radius of bow curvature U of 3.5 m$\leq$U$\leq$8 m, and a resistivity r of 0.0015 Ωcm$\leq$r$\leq$0.01 Ωcm.

DESCRIPTION OF THE PREFERRED EMBODIMENTS

In a method for producing an n-type nitride semiconductor substrate according to the present invention, a silicon- and oxygen-doped conductive nitride semiconductor crystal substrate having a thickness of 100 μm or more and having little bow, low cracking ratio, low resistivity, and few local variations in resistivity is produced by forming a dot mask or a stripe mask on an underlying substrate, growing a thick nitride semiconductor crystal on the masked underlying substrate by HVPE at a substrate temperature of 1,040° C. to 1,150° C. while doping facets with oxygen and silicon and doping c-plane growth regions mainly with silicon by supplying ammonia gas, a group III source gas, a silicon (Si) compound gas, and oxygen (O) in a ratio b of the group V source gas to the group III source gas of 1 to 10, and removing the underlying substrate.

Unlike the related art, two dopants are used, rather than one dopant, and the facets and the c-plane are doped mainly with different dopants so that the resistivity is complementarily made uniform.

Figure 22:
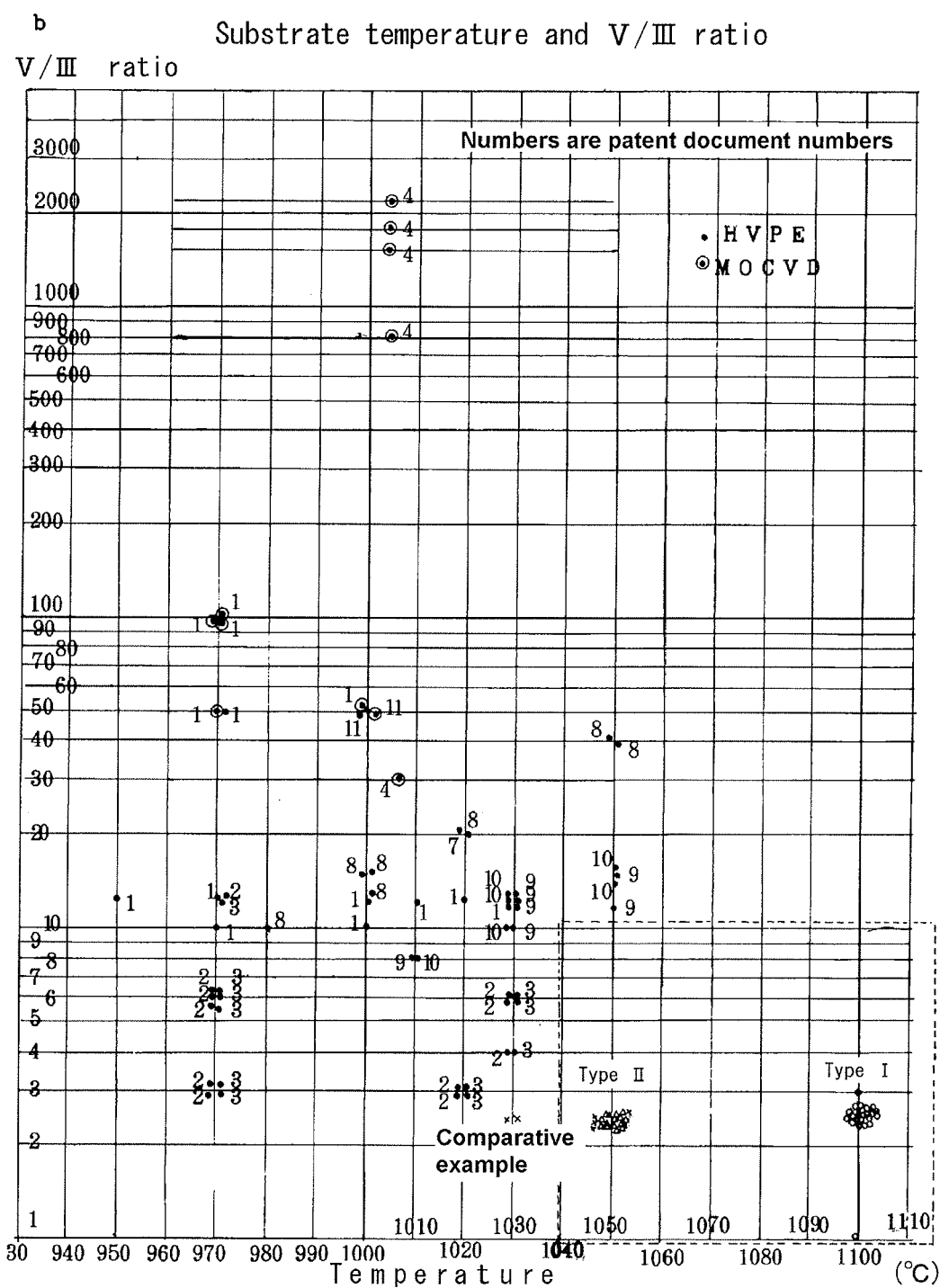
FIG. 22 is a graph showing the growth temperatures and the V/III ratios b of examples of vapor deposition processes disclosed in the related art, namely, Patent Documents 1 to 11, and examples of vapor deposition processes according to the present invention in a coordinate system, where the horizontal axis indicates the growth temperature (° C.) and the vertical axis indicates the V/III ratio b in a logarithmic scale.

In the related art, there is no example in which GaN is grown at such a low V/III ratio b, namely, 1 to 10, and such a high temperature, namely, 1,040° C. to 1,150° C. As shown in FIG. 22, the V/III ratio b is higher than 10 in many GaN growth methods (Patent Documents 1, 4, 7, 8, 10 (in part), and 11). Although GaN is grown in a V/III ratio b of lower than 10 in some documents (Patent Documents 2, 3, 9 (in part), and 10 (in part)), the temperature is low, namely, below 1,040° C.

Figure 20:
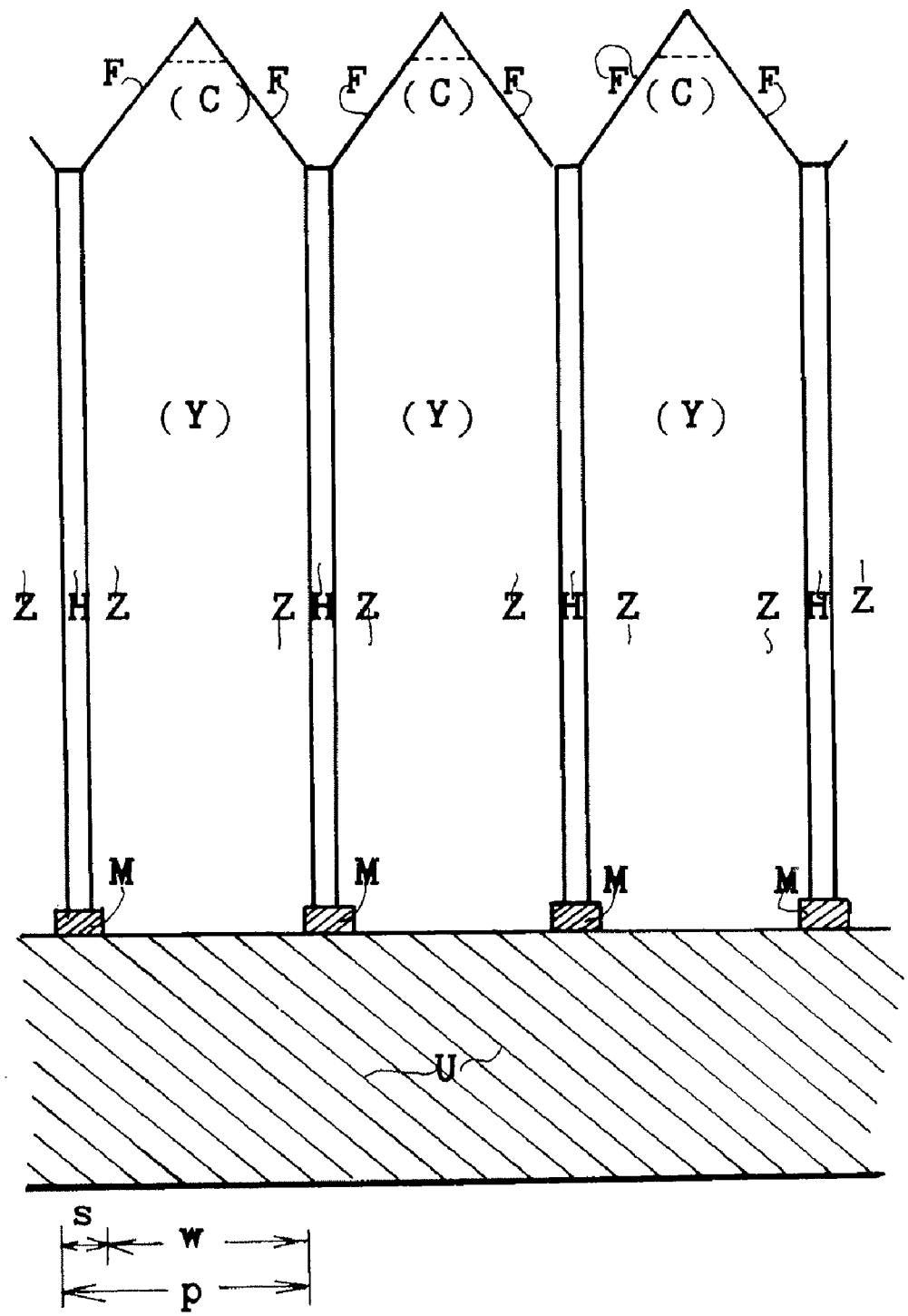
FIG. 20 is a sectional view showing the profile of a type II nitride semiconductor crystal, having a ridge-and-valley structure, that is produced by a method according to the present invention.

In a V/III ratio b of 1 to 10 and a temperature range of 1,040° C. to 1,070° C., facets appear noticeably, thus forming sharply inclined faces. A crystal having such a rough surface is referred to as type II. This type is shown in FIG. 20. Because the crystal is formed by facet growth on an underlying substrate U on which masking portions M are formed at a large pitch, crystal defect cluster regions H are formed above the masking portions M, and low-dislocation-density single-crystal regions Z are formed beside the crystal defect cluster regions H so as to follow facets F. The facets F remain to the end of the growth. In some cases, the facets F may occupy the entire surface. In other cases, the c-plane may appear as if the facets F were partially cut (broken lines) and be followed by c-plane growth regions Y. Depending on the proportion of the facets F, the c-plane growth regions Y may be absent between the regions Z, or may be partially present.

The present invention employs facet growth because the wide masking portions M are periodically arranged on the underlying substrate U and a nitride semiconductor is grown thereon. Accordingly, numerous facets F are formed so as to extend upward from the masking portions M. The facet growth proceeds as shown in FIGS. 9A to 9F and 15A to 15F. The crystal defect cluster regions H are formed above the masking portions M, and the low-dislocation-density single-crystal regions Z and the c-plane growth regions Y are formed above exposed portions E. The low-dislocation-density single-crystal regions Z are formed below the facets F, and the c-plane growth regions Y are formed below the c-plane. For type II, that is, a crystal having a surface with facets, it grows while the facets F remain predominant. For type I, that is, a crystal having a flat surface, the c-plane becomes predominant soon because the temperature is high, finally occupying the entire surface. In either case, the crystal mainly absorbs oxygen until sometime because of the facet growth.

Figure 25:
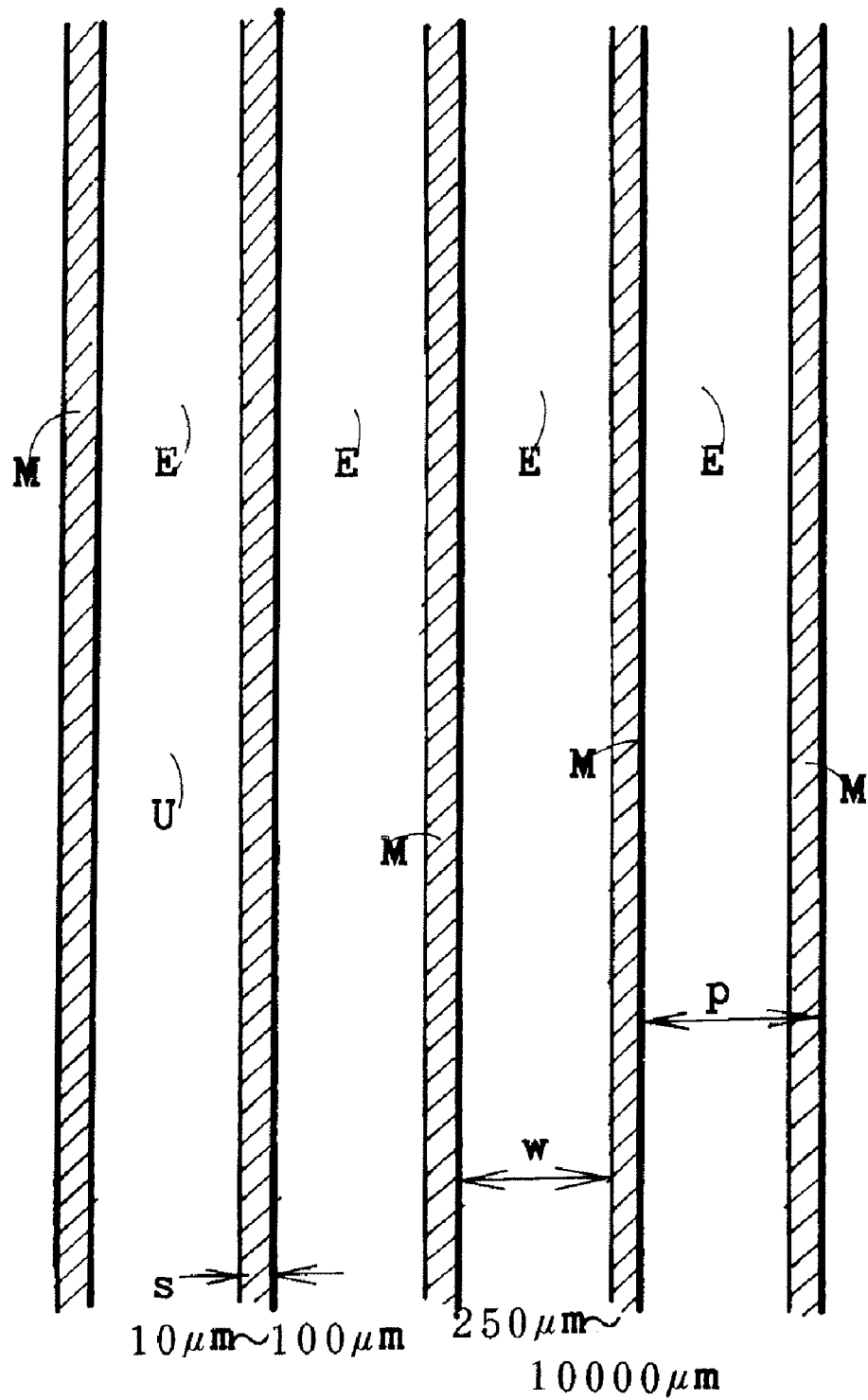
FIG. 25 is a plan view showing the width s and the spacing w of a stripe mask used in a method according to the present invention in which a nitride semiconductor is grown in vapor phase on an underlying substrate on which a stripe mask including parallel masking portions is formed.
Figure 26:
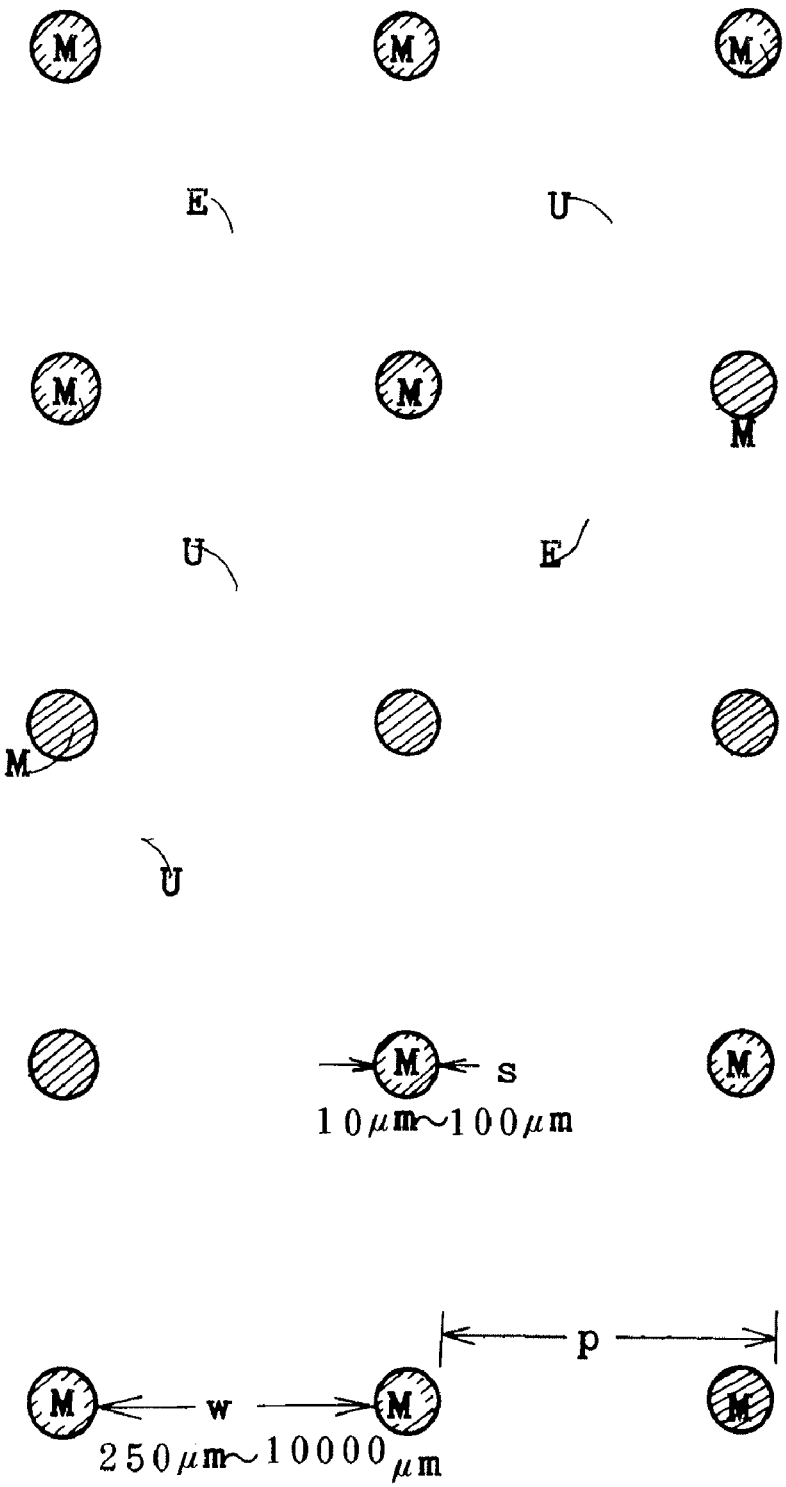
FIG. 26 is a plan view showing the diameter s and the spacing w of a dot mask used in a method according to the present invention in which a nitride semiconductor is grown in vapor phase on an underlying substrate on which a dot mask including plurality of dot masking portions arranged in two orthogonal directions is formed.

The width (diameter) of the masking portions M is denoted by s, the spacing between the masking portions M is denoted by w, and the pitch of the masking portions M is denoted by p. The width s is 10 to 100 μm, and the spacing w is 250 to 10,000 μm. The masking portions M are regularly formed on the underlying substrate U. Because of the regularity, s, w, and p can be defined. Typical examples are an isolated dot pattern of masking portions (dot mask, as shown in FIG. 26) and a parallel stripe pattern of masking portions (stripe mask, as shown in FIG. 25). Other patterns having regularity can also be used.

Figure 21:
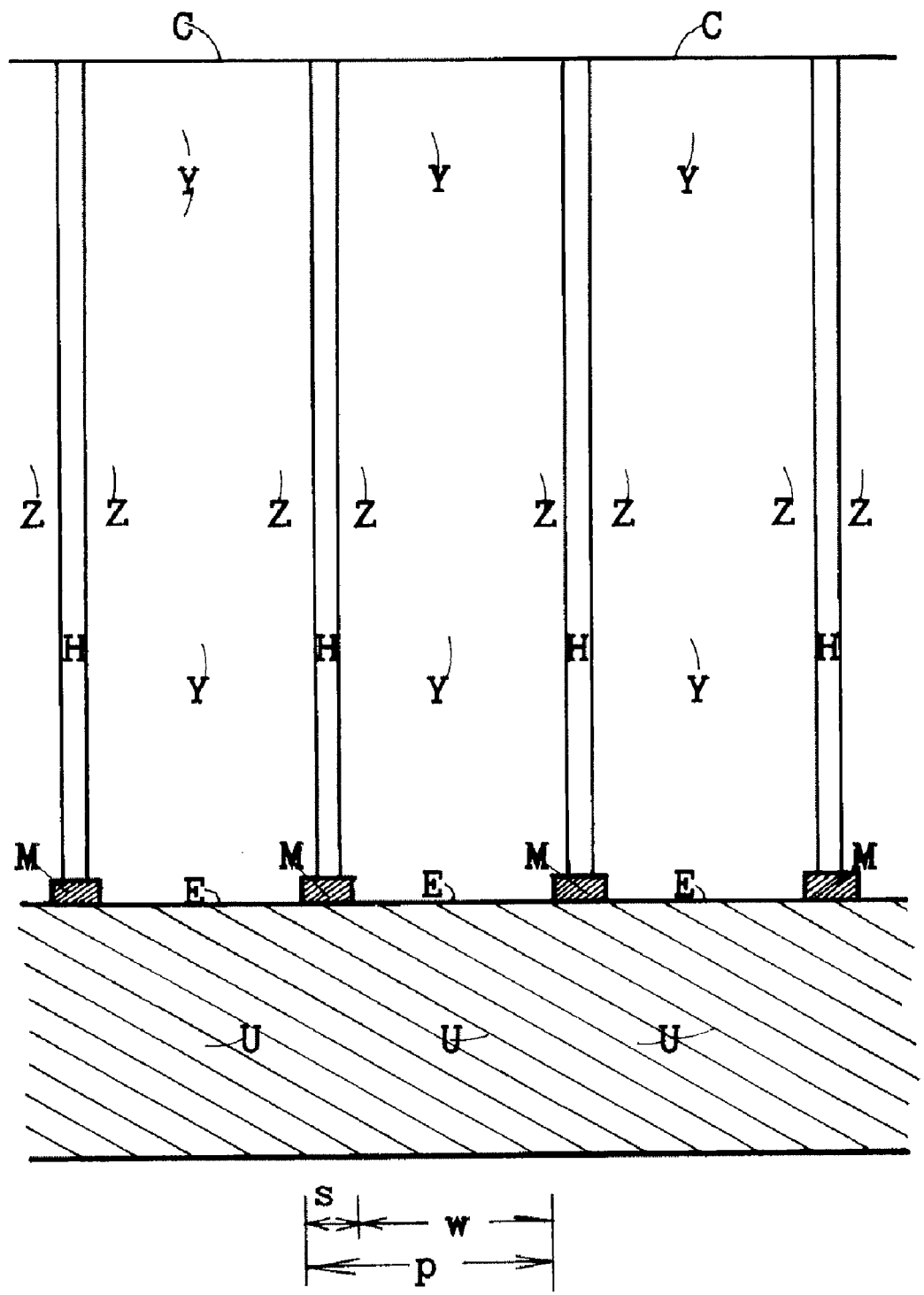
FIG. 21 is a sectional view showing the profile of a type I nitride semiconductor crystal, having a flat surface, that is produced by a method according to the present invention.

In a V/III ratio b of 1 to 10 and a higher temperature range, namely, 1,090° C. to 1,150° C., the surface finally becomes a flat c-plane surface. Such a crystal having less roughness is referred to as type I. FIG. 21 shows a type I crystal. Even a type I crystal is grown by facet growth until sometime because the mask is used. The growth process changes to c-plane growth near the final stage of the growth. Accordingly, the crystal defect cluster regions H are formed above the masking portions M, the low-dislocation-density single-crystal regions Z are formed beside the crystal defect cluster regions H, and the c-plane growth regions Y are formed midway between the masking portions M. Although the top surface is the c-plane, this facet growth because the crystal is grown after the masking portions M are formed at a large pitch on the underlying substrate U. The growth process changes to c-plane growth after the crystal grows to a sufficient thickness. Thus, type I in the present invention differs from c-plane growth in the related art. The width (diameter) of the masking portions M is denoted by s, the spacing between the masking portions M is denoted by w, and the pitch of the masking portions M is denoted by p. The width s is 10 to 100 μm, and the spacing w is 250 to 10,000 μm. The masking portions M are regularly formed on the underlying substrate U. Because of the regularity, s, w, and p can be defined. Typical examples are an isolated dot pattern of masking portions (dot mask, as shown in FIG. 26) and a parallel stripe pattern of masking portions (stripe mask, as shown in FIG. 25). Other patterns having regularity can also be used.

Figure 24:
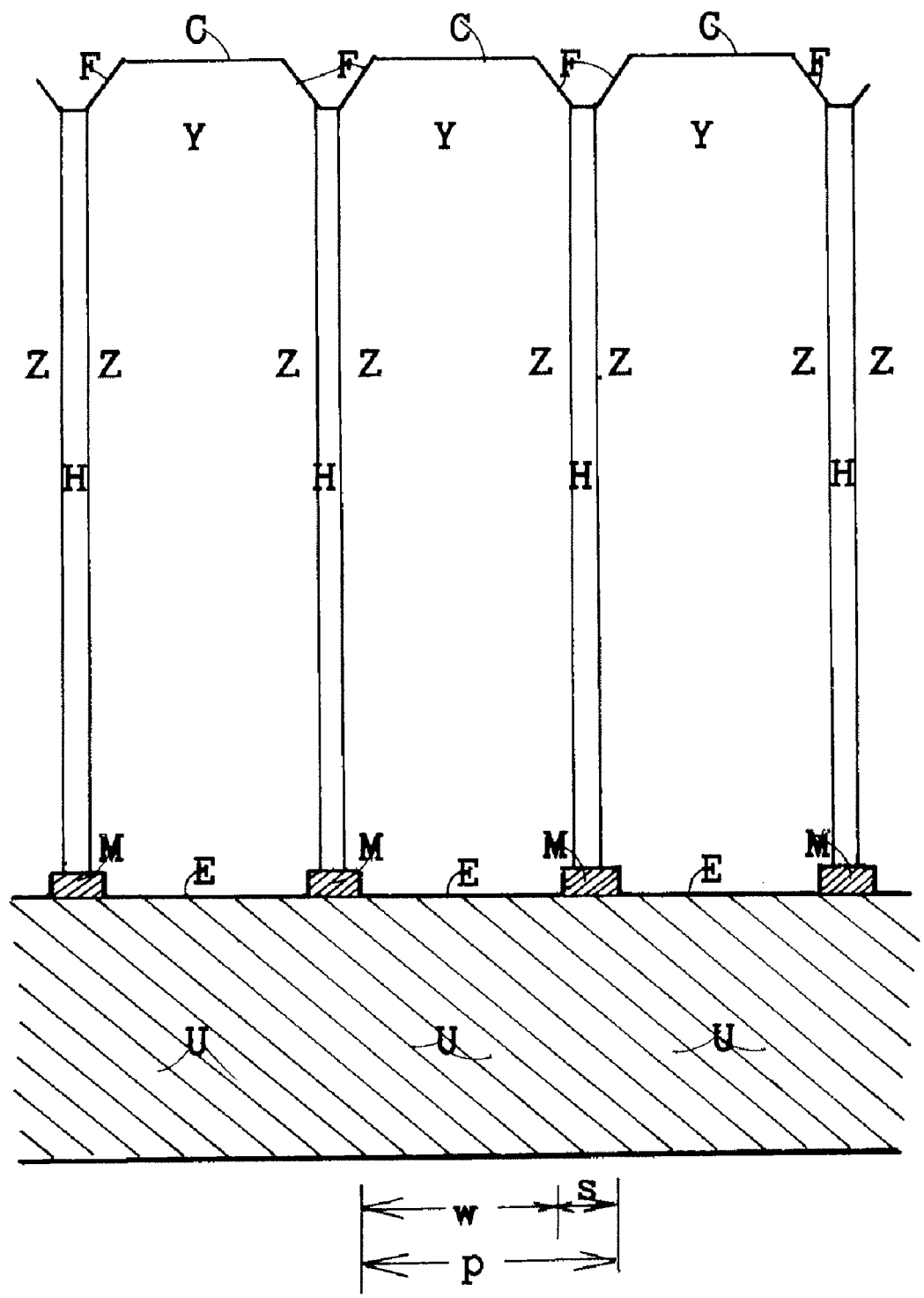
FIG. 24 is a sectional view showing the profile of a nitride semiconductor crystal of a mixture of type I and type II, having flat faces and facets, that is produced by a method according to the present invention.

In a V/III ratio b of 1 to 10 and the middle temperature range, namely, 1,070° C. to 1,090° C., a mixed type having a partially cut mountain shape is formed. FIG. 24 shows a sectional view of a mixed-type crystal. The crystal is grown by facet growth because it is grown after the masking portions M are formed at a large pitch on the underlying substrate U. The portions directly above the masking portions M are the crystal defect cluster regions H. The portions following the facets F beside the crystal defect cluster regions H above the exposed portions E are the low-dislocation-density single-crystal regions Z. The portions under the c-plane between the regions Z are grown by c-plane growth. C-plane growth becomes predominant after the crystal grows to a sufficient thickness. The portions formed by c-plane growth are the c-plane growth regions Y. The facets F remain in the surface to the end. The width (diameter) of the masking portions M is denoted by s, the spacing between the masking portions M is denoted by w, and the pitch of the masking portions M is denoted by p. The width s is 10 to 100 μm, and the spacing w is 250 to 10,000 μm. The masking portions M are regularly formed on the underlying substrate U. Because of the regularity, s, w, and p can be defined. Typical examples are an isolated dot pattern of masking portions (dot mask, as shown in FIG. 26) and a parallel stripe pattern of masking portions (stripe mask, as shown in FIG. 25). Other patterns having regularity can also be used.

In any case, the surface is finally ground and polished into a flat mirror surface. Thus, the mirror wafer no longer has the ridge-and-valley structure, that is, the structure immediately after the crystal growth. The mirror wafer has a thickness of 100 μm or more for use as a free-standing substrate. Any larger thickness is permitted. In some cases, the thickness may be 300 to 10,000 μm. A thick wafer is cut into a plurality of wafers in a direction parallel to the plane thereof. The wafer maintains its original HZYZHZYZ... structure and therefore has anisotropy in the lateral direction. Although the structure is transparent and invisible to the naked eye, it can be recognized by cathode luminescence (CL) or fluorescence microscopy.

Another characteristic of the present invention is double doping with silicon and oxygen. For type II and the mixed type, the c-plane and the f-plane (which refers to facets) are mixed in the surface. Even for type I, the c-plane and the f-plane are mixed until sometime during the growth. Oxygen has the plane orientation dependence that the f-plane is more doped with oxygen and the c-plane is less doped with oxygen. If silicon has the opposite plane orientation dependence, that is, if the c-plane is more doped with silicon and the f-plane is less doped with silicon, double doping with silicon and oxygen allows the amounts of n-type dopants absorbed into the c-plane and the f-plane to be complementary. In this case, however, it should be examined whether double doping with silicon and oxygen results in interference between the two dopants (interference effect) and, if oxygen and silicon do not interfere with each other and independently release n-type carriers, whether oxygen doping and silicon doping can be considered as being equal (dominance) since the amounts of oxygen and silicon required may differ because of the difference in activation rate. In addition, the ratio of the c-plane to the f-plane (C/F ratio) varies depending on the method for crystal growth. The ratio of the c-plane to the f-plane varies not only as a whole, but also in the growth direction (height direction). If the ratio of the c-plane to the f-plane varies, the resistivity should vary as a whole. Thus, various factors must be clarified to enable a design for achieving the intended resistivity by double doping. Double doping with n-type dopants is not described in Patent Documents 1 to 11 mentioned above. According to research by the present inventors, no document discusses double doping.

As a result of many experiments, the present inventors have found that silicon has no plane orientation dependence, that is, the c-plane and the f-plane are equally doped with silicon. The amount of oxygen absorbed differs considerably between the c-plane and the f-plane, and the ratio is larger than 50 times, which is the ratio pointed out in Patent Document 7.

If a nitride semiconductor crystal is grown in an atmosphere containing both silicon and oxygen by facet growth, in which the c-plane and the f-plane coexist, the n-type dopant concentration can be made uniform in the c-plane and the f-plane, thus reducing local variations in resistivity. In the present invention, as described above, the V/III ratio b is low, namely, 1 to 10, and the substrate temperature is high, namely, 1,040° C. to 1,150° C. For type II (see FIG. 20), in which facets are predominant and spread over substantially the entire surface during the growth, oxygen serves as the major dopant. Oxygen can be introduced into the atmosphere by adding water or oxygen itself to ammonia, hydrogen, or HCl gas. The c-plane, which is slightly present, is supplied with n-type carriers by silicon doping.

Even for type I (see FIG. 21), in which the c-plane spreads over the surface, the crystal is considerably doped with oxygen because it grows while maintaining facets until sometime. As the end of the growth approaches, the c-plane becomes dominant, and accordingly less oxygen is absorbed. Instead, the crystal is more doped with silicon.

For the mixed type (see FIG. 24), in which facet growth continues to the end, as in type II, oxygen is sufficiently absorbed through facets. The c-plane is doped with silicon.

The underlying substrate may be any substrate on which a nitride semiconductor grows in the c-axis direction, such as a (111) GaAs wafer, a c-plane sapphire wafer, a c-plane SiC wafer, or a c-plane GaN wafer. The mask may be formed of $SiO_2$, SiN, AlN, or a metal film.

Figure 1:
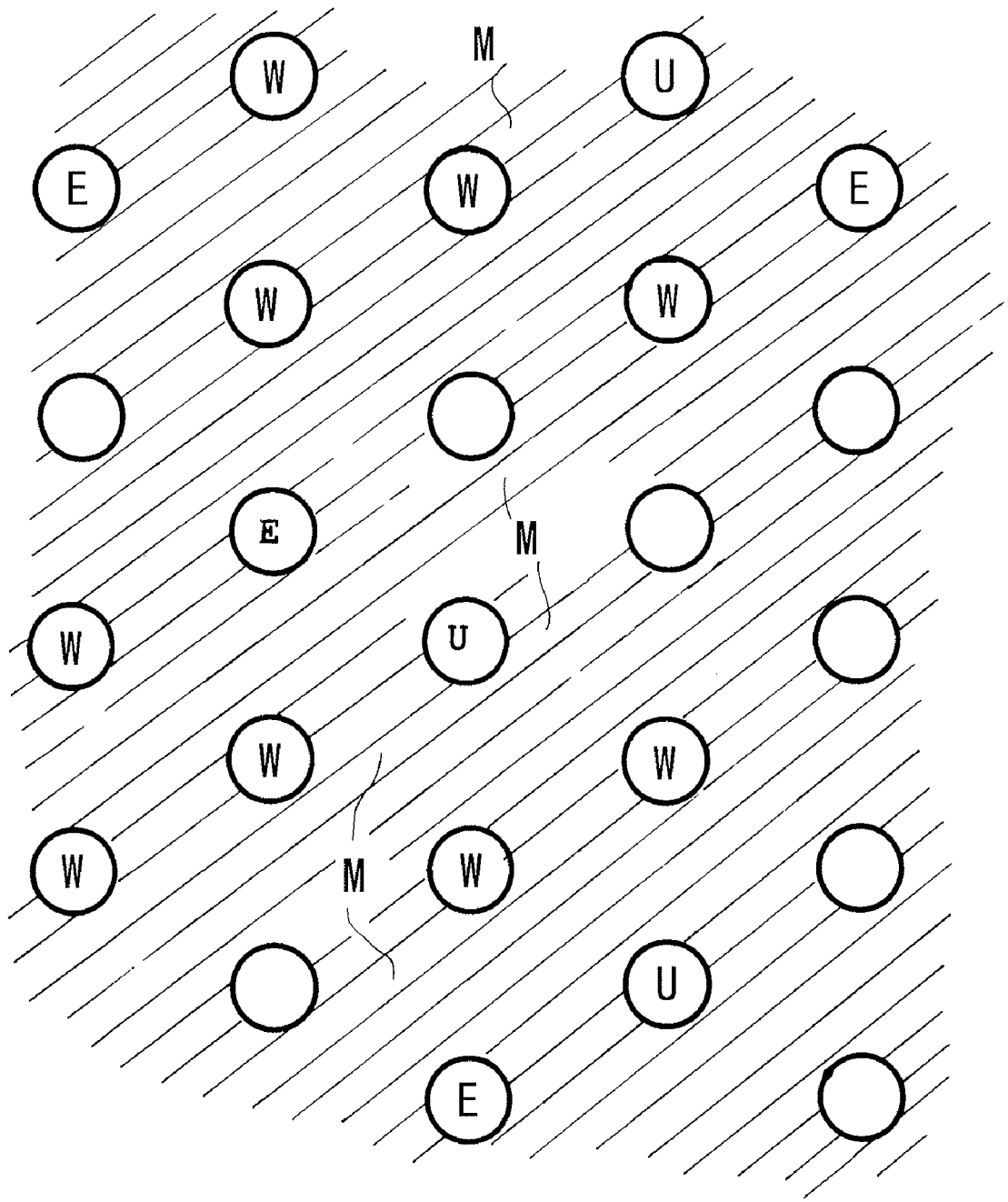
FIG. 1 is a plan view of an ELO mask formed on an underlying substrate and including a large masking portion and numerous small windows (exposed portions) repeated at a narrow pitch in the masking portion.
Figure 2A:
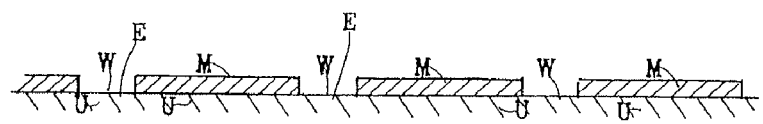
FIGS. 2A to 2G are diagrams illustrating a process of growing GaN in vapor phase on an underlying substrate on which an ELO mask is formed.
Figure 2B:
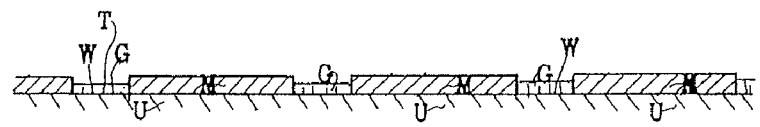
Figure 2C:
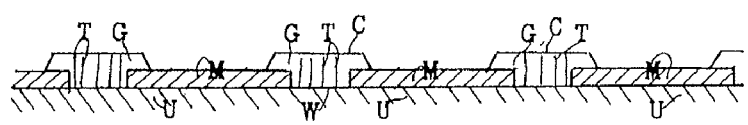
Figure 2D:
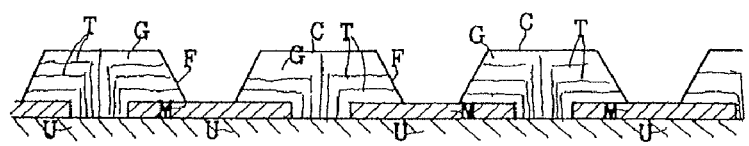
Figure 2E:
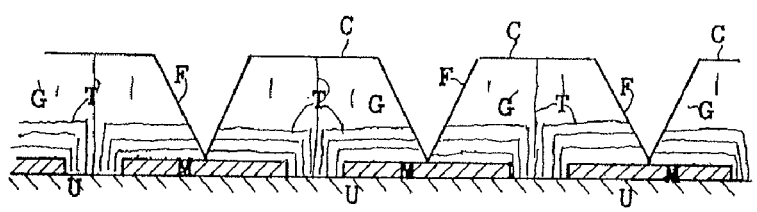
Figure 2F:
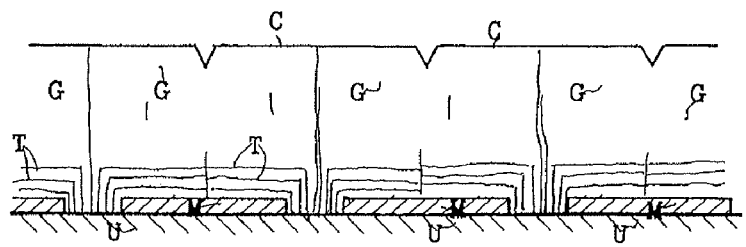
Figure 2G:
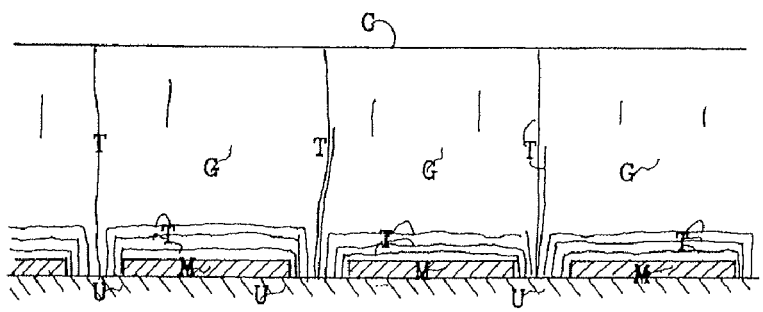
Figure 3:
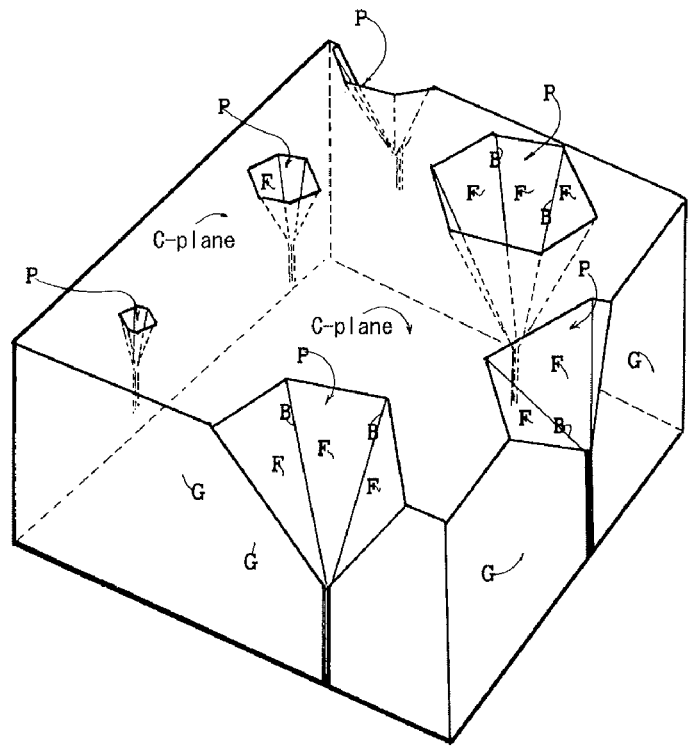
FIG. 3 is a partial perspective view of a crystal formed by random facet growth in which numerous facet pits of different sizes are randomly formed in a surface of the crystal.
Figure 4:
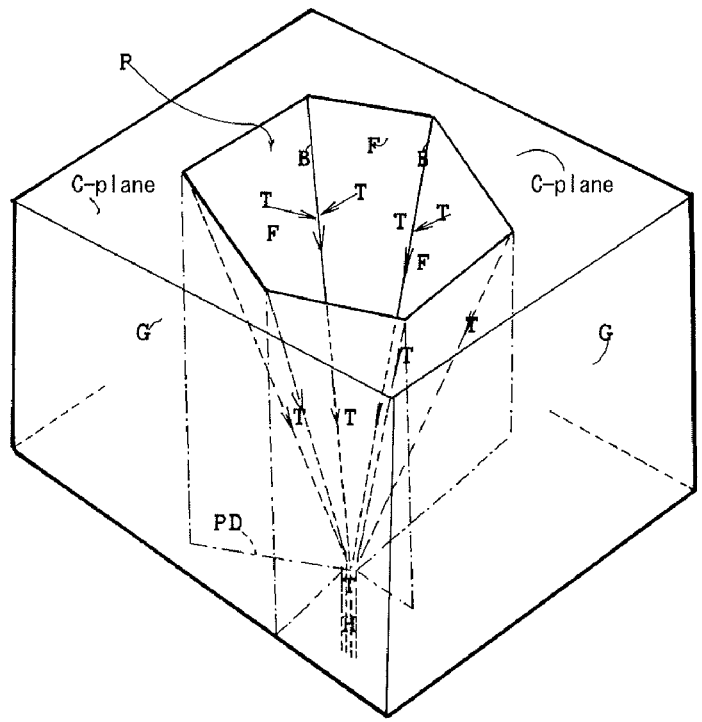
FIG. 4 is a perspective view of a facet pit formed by facet growth in which facet pits are maintained to the end of the growth, illustrating that dislocations propagate in a direction normal to facets inside the facet pit because the growth direction is parallel to the dislocation direction, reach the boundaries between the facets, extend downward along the boundaries, and cluster at the bottom of the pit.
Figure 5:
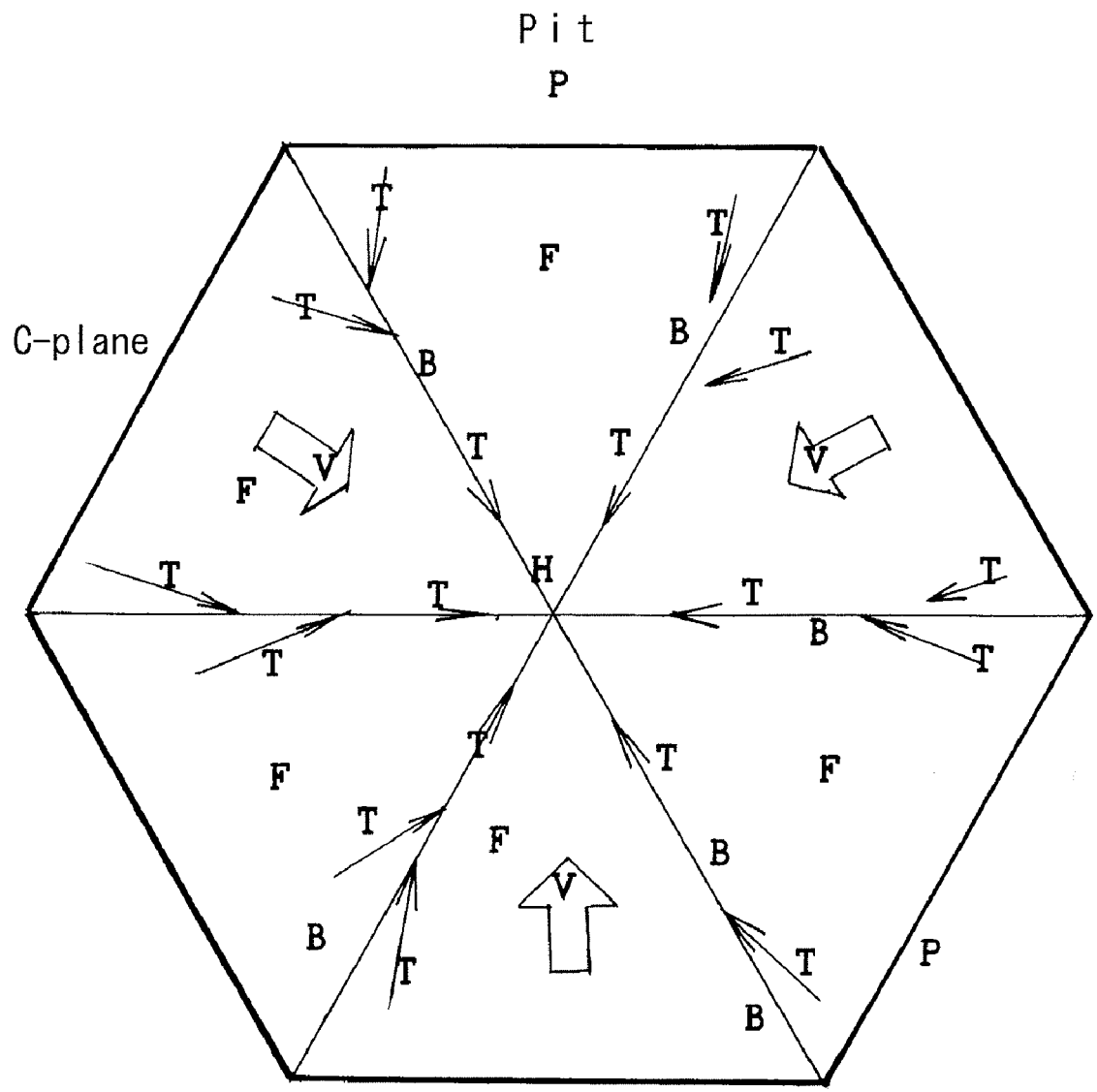
FIG. 5 is a plan view of a facet pit formed by facet growth in which facet pits are maintained to the end of the growth, illustrating that dislocations propagate in a direction normal to facets inside the facet pit because the growth direction is parallel to the dislocation direction, reach the boundaries between the facets, extend downward along the boundaries, and cluster at the bottom of the pit.
Figure 6:
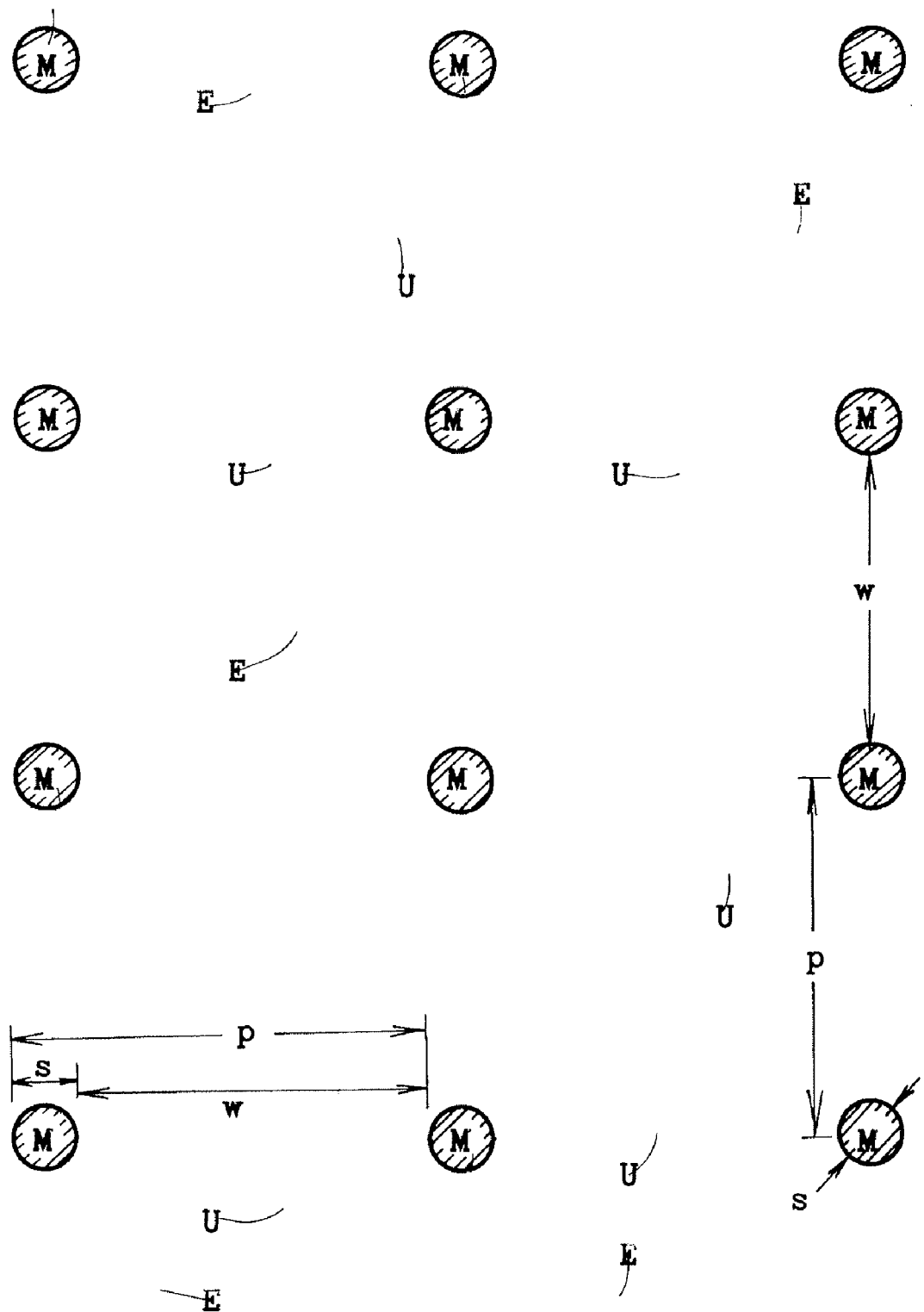
FIG. 6 is a partial plan view of a dot mask formed on an underlying substrate for facet growth in which facet pits are maintained to the end of the growth and including a dot pattern of numerous masking portions regularly arranged at a large spacing in two orthogonal directions.
Figure 7:
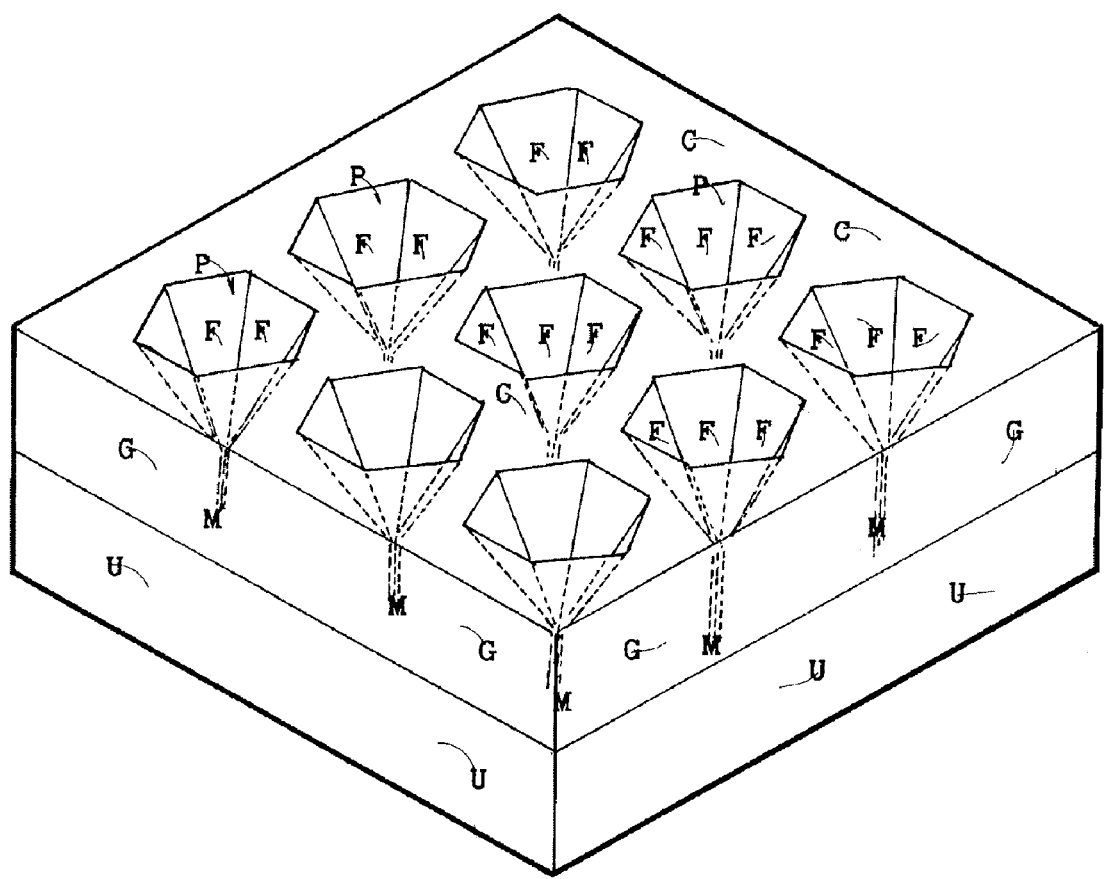
FIG. 7 is a perspective view of a GaN crystal formed by dot facet growth in which the GaN crystal is grown in vapor phase on an underlying substrate on which a dot mask is formed so as to form facet pits whose bottoms are located above masking portions.
Figure 8:
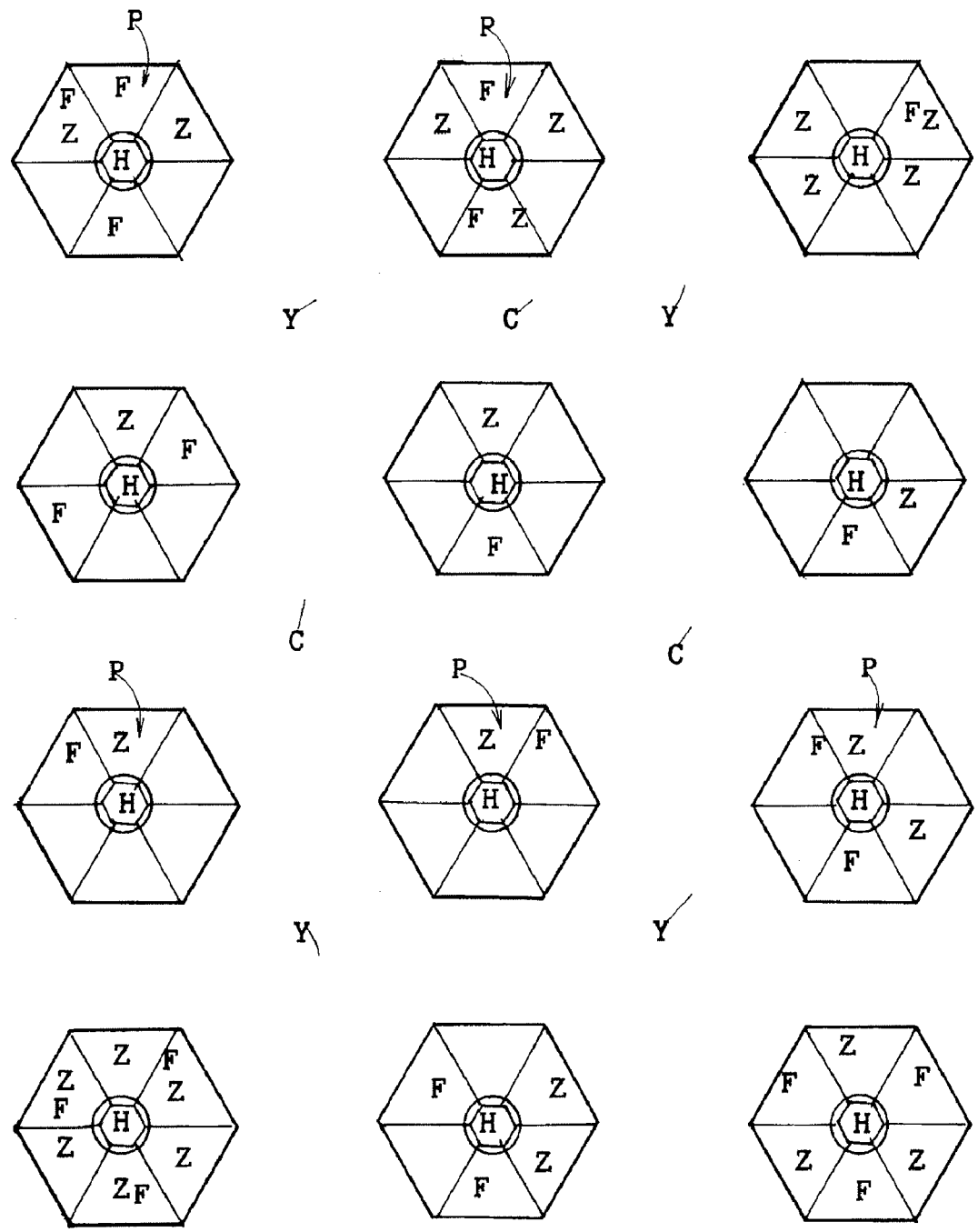
FIG. 8 is a plan view of a surface of a GaN crystal formed by dot facet growth in which the GaN crystal is grown in vapor phase on an underlying substrate on which a dot mask is formed so as to form facet pits whose bottoms are located above masking portions.
Figure 9A:
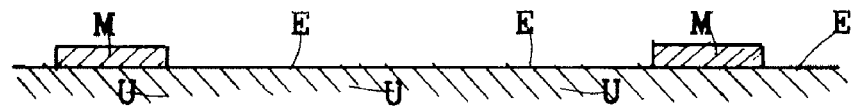
FIGS. 9A to 9F are longitudinal sectional views illustrating the steps of a facet growth process by which a GaN crystal is grown in vapor phase on an underlying substrate on which a dot mask is formed so as to form facet pits whose bottoms are defined by masking portions, the facet pits are made larger, and crystal defect cluster regions H are formed above the masking portions.
Figure 9B:
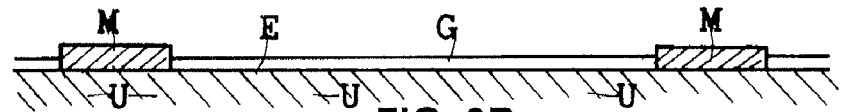
Figure 9C:
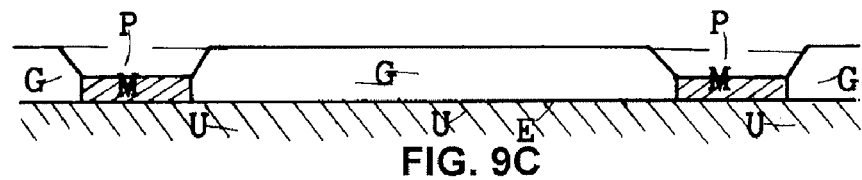
Figure 9D:
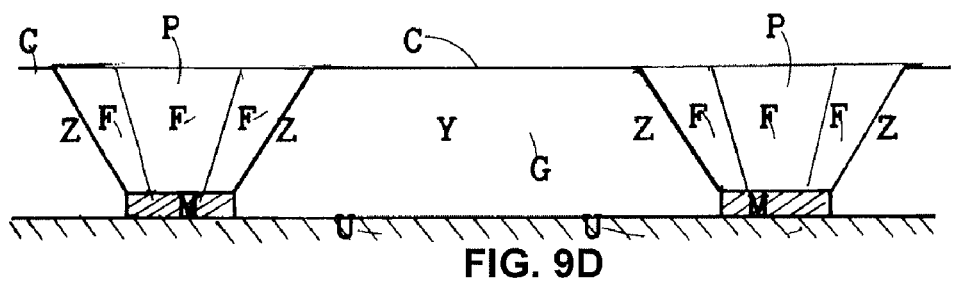
Figure 9E:
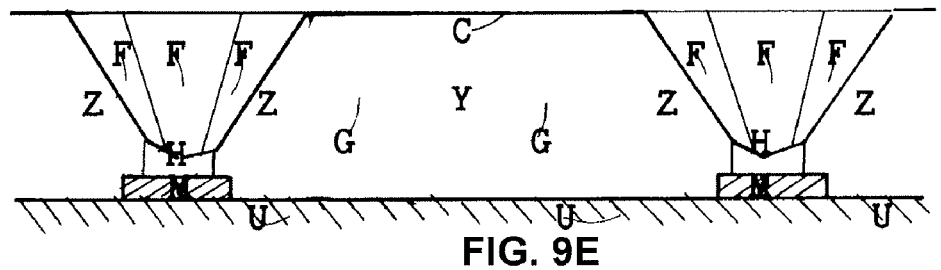
Figure 9F:
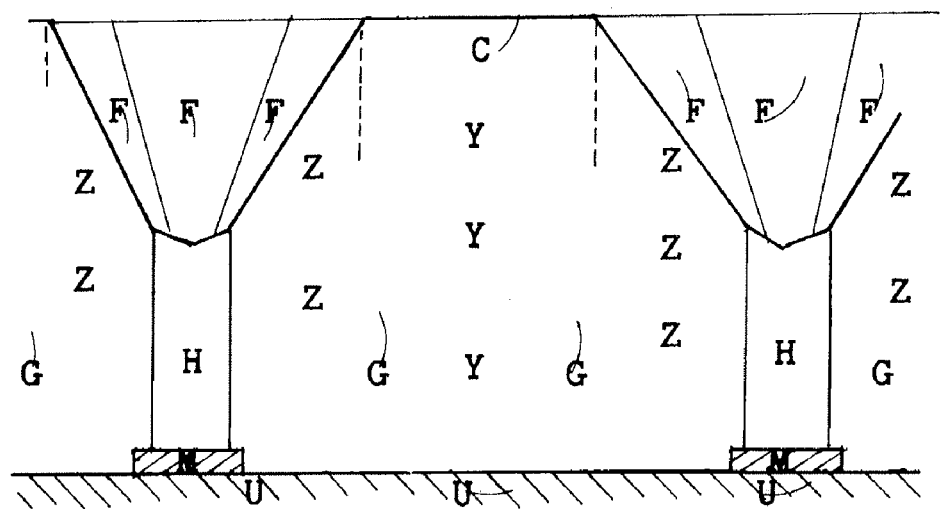
Figure 10:
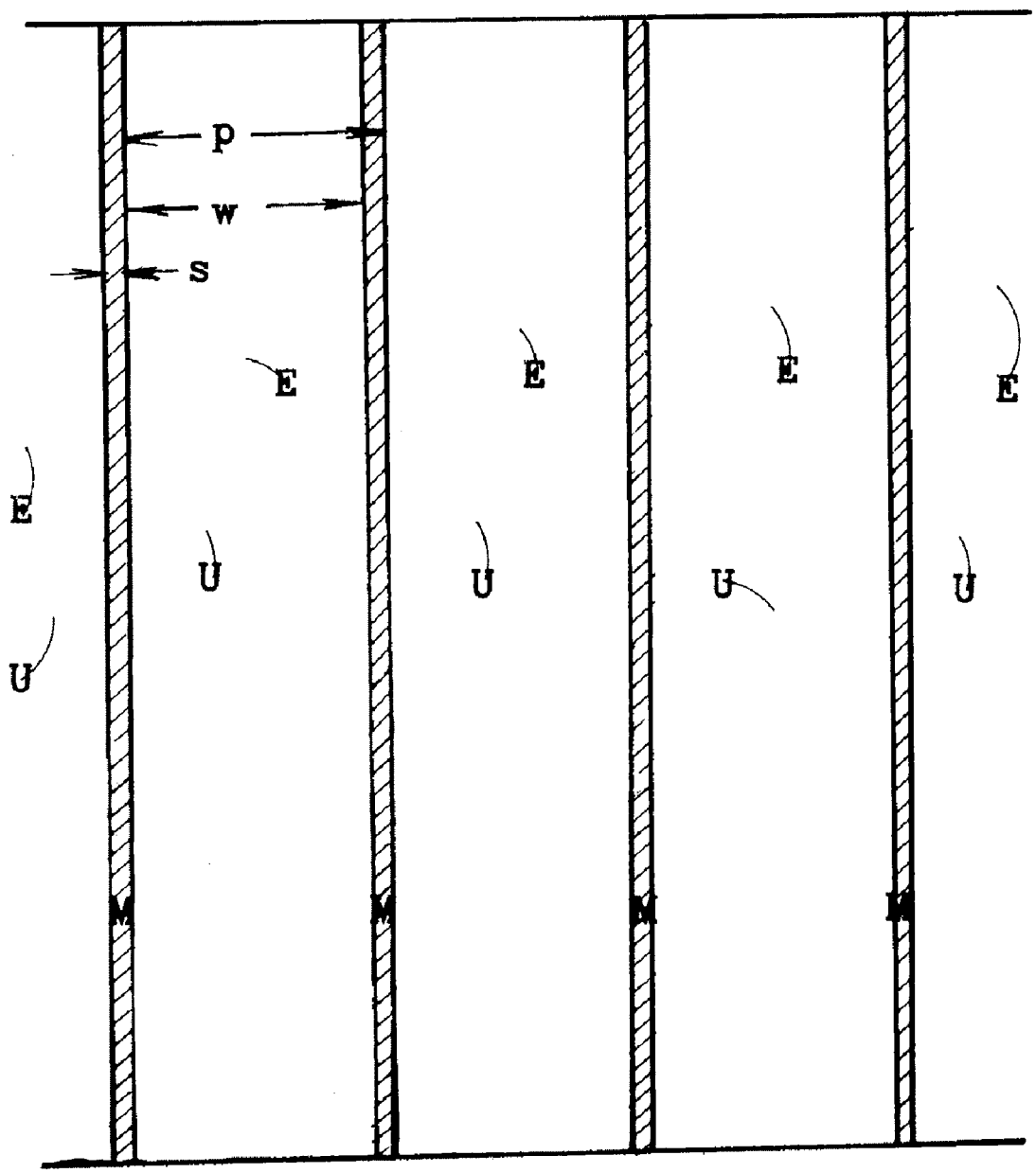
FIG. 10 is a partial plan view of a stripe mask formed on an underlying substrate for facet growth in which facets are maintained to the end of the growth and including a parallel stripe pattern of masking portions regularly arranged at a large spacing in one direction.
Figure 11:
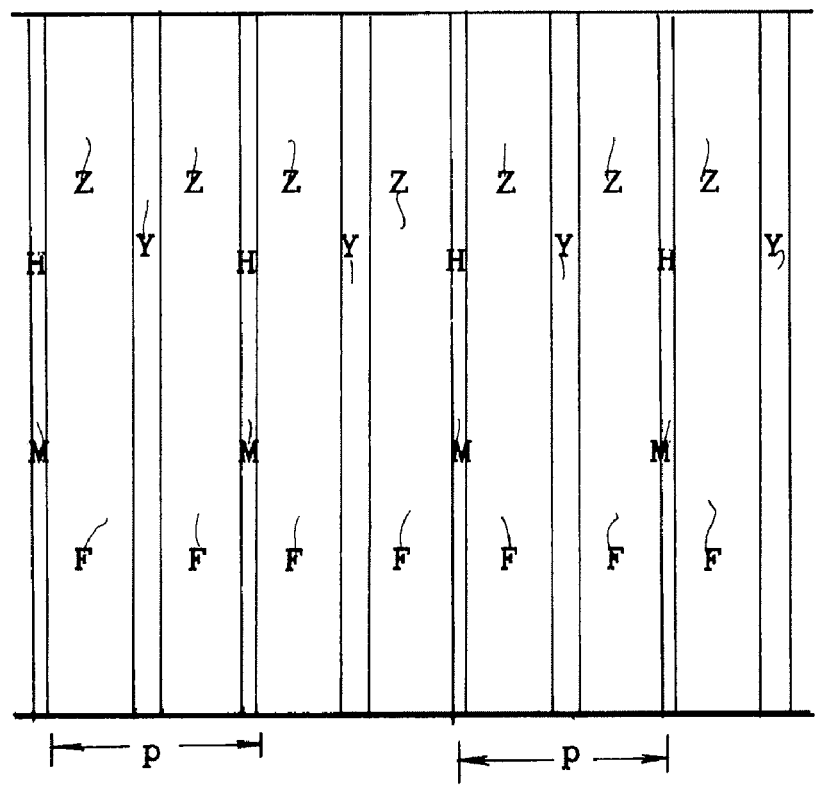
FIG. 11 is a plan view of a GaN crystal formed by stripe facet growth in which the GaN crystal is grown in vapor phase on an underlying substrate on which a stripe mask is formed so as to form a ridge-and-valley structure including valleys above masking portions, flat top faces midway between the masking portions, and inclined facets between the top faces and the valleys.
Figure 12:
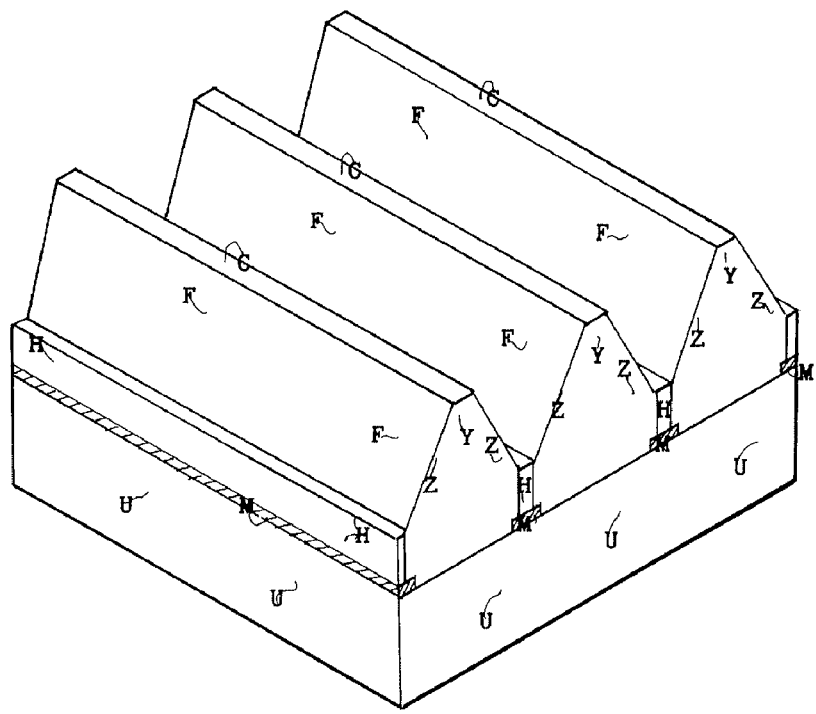
FIG. 12 is a perspective view of a GaN crystal formed by stripe facet growth in which the GaN crystal is grown in vapor phase on an underlying substrate on which a stripe mask is formed so as to form a ridge-and-valley structure including valleys above masking portions, flat top faces midway between the masking portions, and inclined facets between the top faces and the valleys.
Figure 13:
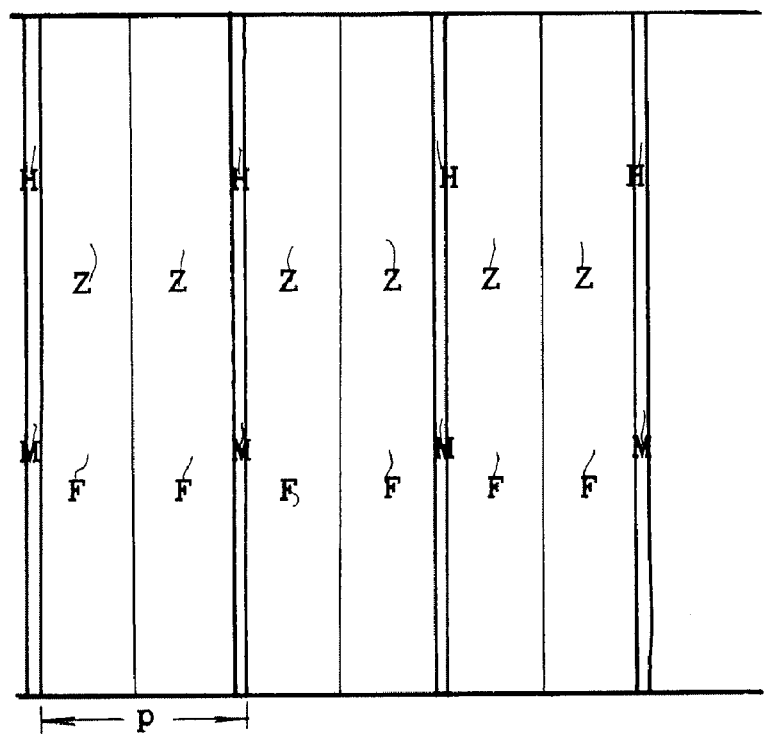
FIG. 13 is a plan view of a GaN crystal formed by stripe facet growth in which the GaN crystal is grown in vapor phase on an underlying substrate on which a stripe mask is formed so as to form a ridge-and-valley structure including valleys above masking portions, sharp ridges midway between the masking portions, and inclined facets between the sharp ridges and the valleys.
Figure 14:
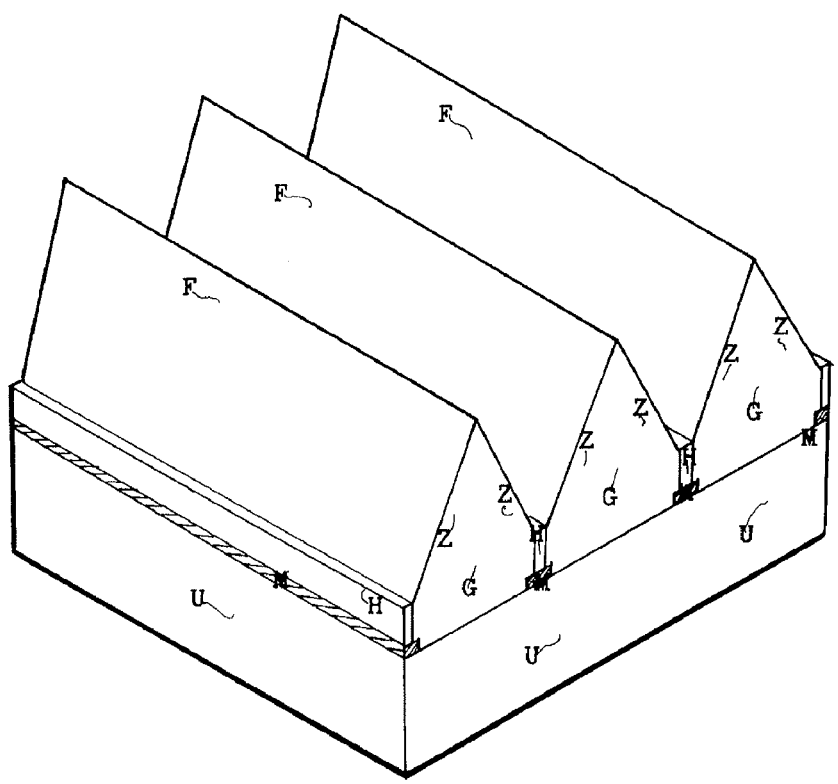
FIG. 14 is a perspective view of a GaN crystal formed by stripe facet growth in which the GaN crystal is grown in vapor phase on an underlying substrate on which a stripe mask is formed so as to form a ridge-and-valley structure including valleys above masking portions, sharp ridges midway between the masking portions, and inclined facets between the sharp ridges and the valleys.
Figure 15A:
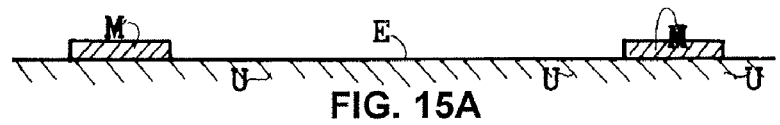
FIGS. 15A to 15F are sectional views illustrating the steps of a process by which GaN is grown in vapor phase on an underlying substrate on which a stripe mask is formed so that crystals having the c-plane and facets are grown above exposed portions, because the growth proceeds initially in the exposed portions, and so that low crystal defect cluster regions H are formed above masking portions, thus forming a parallel ridge-and-valley structure including valleys directly above the masking portions and ridges midway between the masking portions.
Figure 15B:
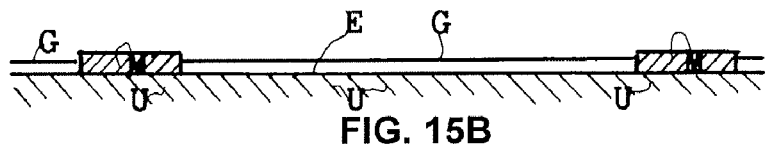
Figure 15C:
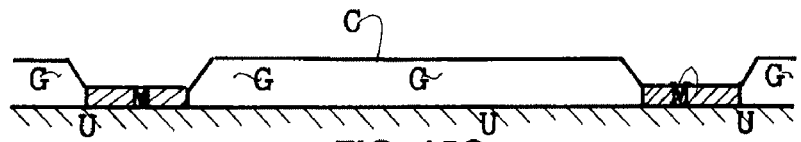
Figure 15D:
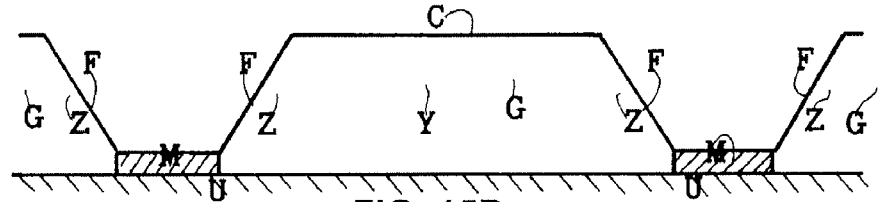
Figure 15E:
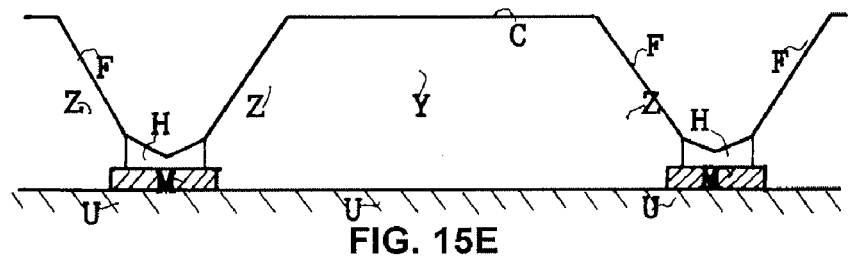
Figure 15F:
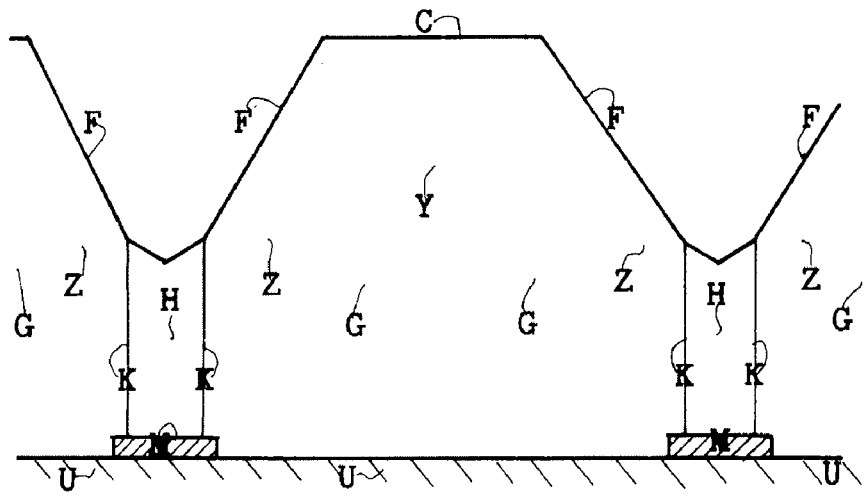
Figure 16A:
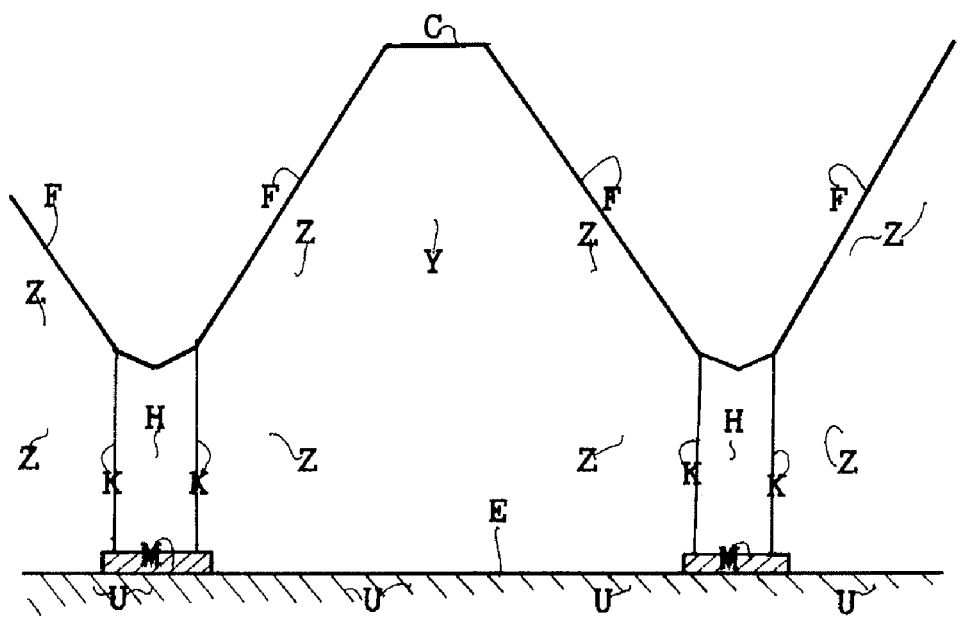
FIGS. 16A and 16B are sectional views illustrating the steps of a process by which the crystal grown by the stripe mask facet growth process in FIGS. 15A to 15F is further grown so that it has higher ridges and larger valleys.
Figure 16B:
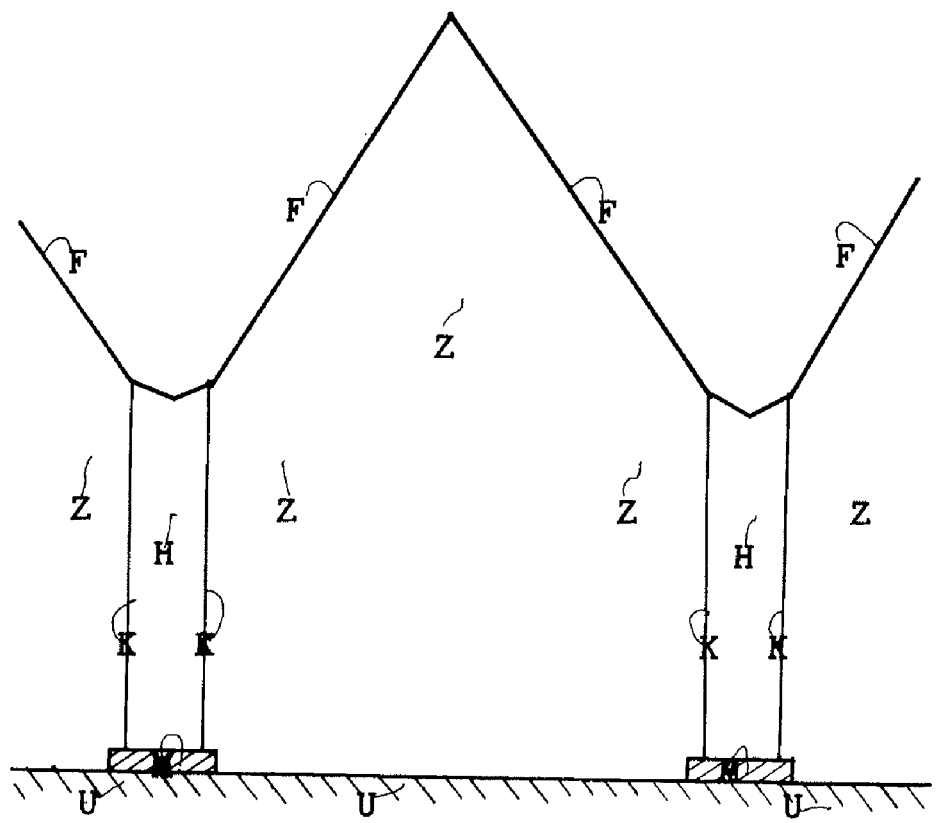
Figure 17:
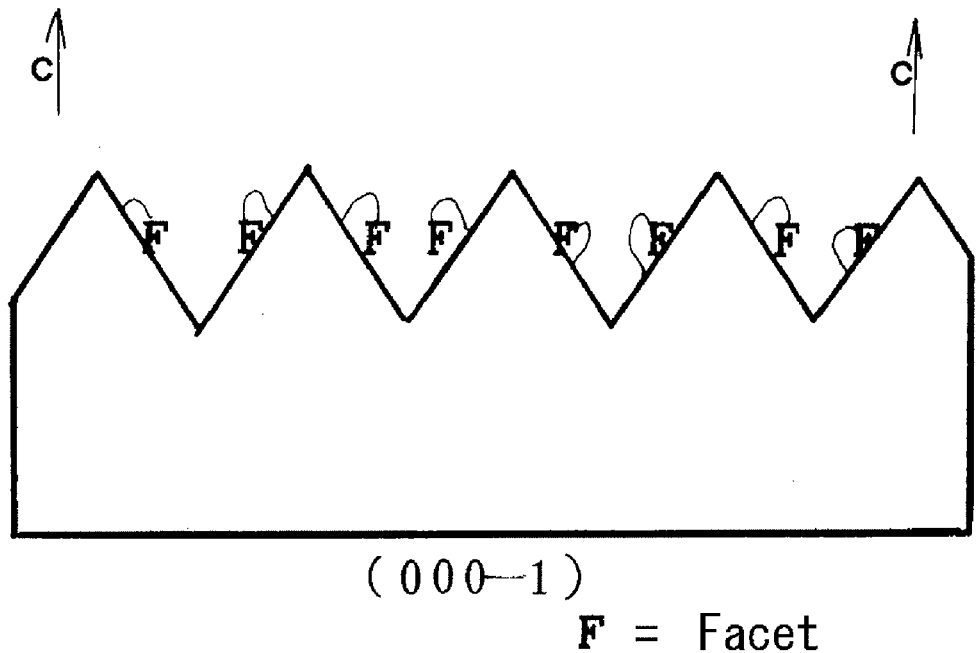
FIG. 17 is a sectional view of a GaN crystal, proposed in Patent Document 7 (Japanese Patent No. 3826825), that is grown in the c-axis direction while forming facets so that it can be heavily doped with oxygen because of the selectivity that oxygen is absorbed into the crystal negligibly through the c-plane and in large amounts through the facets.
Figure 18:
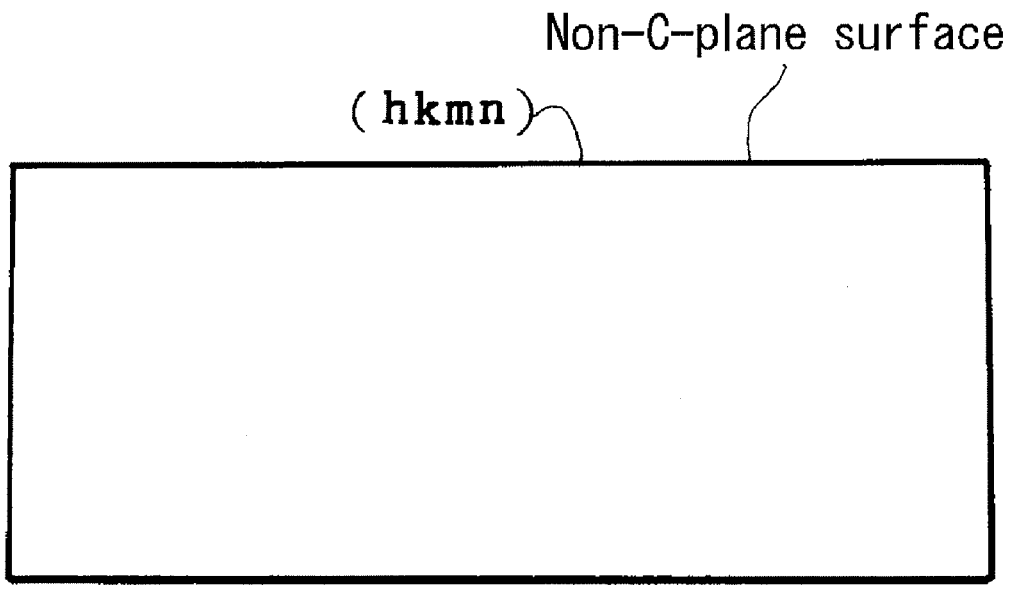
FIG. 18 is a sectional view of a GaN crystal, proposed in Patent Document 7 (Japanese Patent No. 3826825), that is grown on a crystal having a non-c-plane surface prepared in advance so that it can be heavily doped with oxygen because of the selectivity that oxygen is absorbed into the crystal negligibly through the c-plane and in large amounts through the facets.
Figure 19:
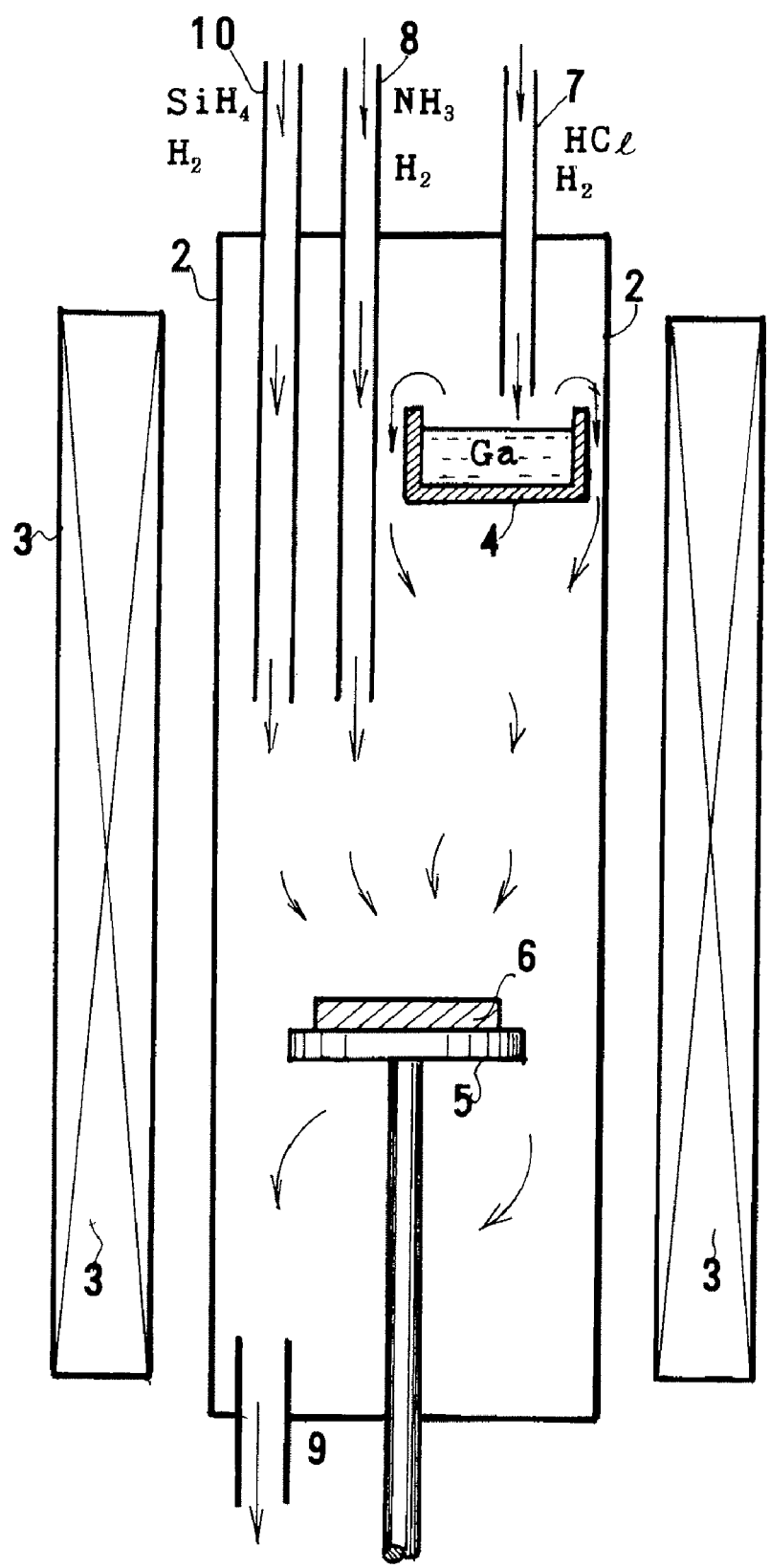
FIG. 19 is a sectional view of an HVPE furnace for producing a nitride semiconductor crystal according to the present invention.

FIG. 19 is a schematic longitudinal sectional view of an HVPE furnace. A heater 3 is disposed outside a vertically oriented reactor 2. The heater 3 extends in the vertical direction and is divided into several segments so that any temperature distribution can be formed in the vertical direction. The reactor 2 has a hot wall. A gallium reservoir 4 containing molten gallium is disposed in the upper middle portion of the reactor 2. A susceptor 5 is disposed in the lower portion of the reactor 2 and is supported by a rotating shaft so that it can be rotated and elevated. An underlying substrate 6 is placed on the susceptor 5. A first source gas supply pipe 7 supplies hydrogen ($H_2$) gas and hydrogen chloride (HCl) gas to the gallium reservoir 4. HCl and gallium react to produce GaCl gas. The GaCl gas then flows downward. A second source gas supply pipe 8 supplies hydrogen ($H_2$) gas and ammonia ($NH_3$) gas to the top of the underlying substrate 6. GaCl and $NH_3$ react to produce GaN. A third source gas supply pipe 10 supplies a mixture of a silicon (Si) compound gas (such as silane ($SiH_4$)) and a carrier gas ($H_2$) to the reactor 2. To add oxygen, water or oxygen itself is mixed in the source gas ($H_2$+HCl) from the first source gas supply pipe 7, the source gas ($NH_3$+$H_2$) from the second source gas supply pipe 8, or the source gas ($SiH_4$+$H_2$) from the third source gas supply pipe 10. The GaN being synthesized is doubly doped with silicon and oxygen. After the reaction, exhaust gas and unreacted gas are discharged from a gas exhaust pipe 9.

Silicon is supplied using a source material such as silicon chloride, silicon fluoride, or silicon hydride ($SiH_4$). The source material, which is gaseous, is blown into the reactor through the upper gas channel in vapor phase. The source material is then thermally decomposed and absorbed into the crystal. In the crystal, oxygen and silicon coexist as n-type dopants.

The nitride semiconductor substrate, thus produced, according to the present invention has a cracking ratio K of 22% or less. The lower limit of the cracking ratio K is about 1% ($0.01 \leq K \leq 0.22$). For type II, the cracking ratio is 18% or less ($K \leq 0.18$ (type II)). Patent Documents 2 and 3 disclose that free-standing GaN crystals having flat surfaces were all cracked during polishing. That is, all the GaN substrates having flat surfaces in Patent Documents 2 and 3 have a cracking ratio K of 100%.

The radius of bow curvature U of the nitride semiconductor substrate according to the present invention after the removal of the underlying substrate is 3.5 to 7 m ($3.5 \text{ m} \leq U \leq 7 \text{ m}$). For type II, which has a surface with facets, the radius of bow curvature U is $4.2 \text{ m} \leq U \leq 7 \text{ m}$. According to Patent Documents 2 and 3, in which ELO is used, unpolished crystals having flat surfaces had a radius of curvature of 0.054 to 0.167 m. That is, these crystals had extremely large bow. In addition, four unpolished crystals having rough surfaces had a radius of curvature of 1 to 2.6 m, and one unpolished crystal having a rough surface had a radius of curvature of 10 m. Because the bow is increased after polishing, after the unpolished sample having a radius of curvature of 10 m was polished, the radius of bow curvature U was decreased to 3.4 m. That is, the substrates having rough surfaces in Patent Documents 2 and 3 had a radius of curvature U of 3.4 m or less. The cracking ratio of this sample is not disclosed in Patent Documents 2 and 3. The substrate temperature is 1,020° C., which is lower than that of the present invention. The growth process is not facet growth, but c-plane growth. The resistivity is 0.05 Ωcm. The type of dopant is not disclosed in Patent Documents 2 and 3. In some documents, the bow is expressed as the radius of curvature U, although in other cases it is expressed as the height h of the center of a wafer placed on a flat surface so as to be convex. The height h of the center of a wafer having a diameter D can be converted to the radius of curvature U on the basis of the relationship $U=D^2/8h$. The radius of curvature U in the present invention, namely, 3.5 to 7 m, is equivalent to a height h of 89 to 45 μm for a diameter of two inches (50 mm).

The nitride semiconductor substrate according to the present invention has a silicon concentration of $5 \times 10^{19}$ cm$^{-3} \geq [Si] \geq 1 \times 10^{17}$ cm$^{-3}$ and an oxygen concentration of $1 \times 10^{19}$ cm$^{-3} \geq [O] \geq 1 \times 10^{15}$ cm$^{-3}$, where an oxygen concentration of $1 \times 10^{15}$ cm$^{-3}$ is the detection limit of oxygen, and a lower concentration is possible in practice. This will be described later.

The resistivity r of the nitride semiconductor substrate according to the present invention is $1 \times 10^{-2}$ Ωcm or less. In the lower range of resistivity r, a resistivity r of 1.5 to $2 \times 10^{-3}$ Ωcm is also achieved. That is, the resistivity r of the crystal provided by the present invention is 0.0015 Ωcm$\leq r \leq$0.01 Ωcm, which is lower than the resistivity achieved in Patent Document 1, namely, 0.005 Ωcm$\leq r \leq$0.08 Ωcm. Thus, a superior nitride semiconductor crystal having low resistivity, low cracking ratio, and little bow can be achieved as an n-type substrate.

The mask is formed of, for example, SiO$_2$, SiON, SiN, AlN, or Al$_2$O$_3$. The mask may be formed in any periodic pattern having small masking portions and a large exposed portion. Although a stripe mask (parallel stripes) and a dot mask (isolated staggered distribution) will be described here, a mask having another periodic pattern may also be formed. For a stripe mask, the width s of the masking portions is 10 to 100 μm, the spacing w between the masking portions is 250 to 10,000 μm, and the pitch p (p=s+w) is 260 to 10,100 μm.

For a dot mask, the diameter s of the masking portions is 10 to 100 μm the spacing w between the masking portions is 250 to 10,000 μm, and the pitch p is 260 to 10,100 μm.

At a V/III ratio b of 1 to 10 and a substrate temperature of 1,040° C. to 1,080° C., a ridge-shaped crystal (type II) grows that have facets F lower above the masking portions and higher above the exposed portions (see FIG. 20). This is facet growth because the crystal is lower above the masking portions M and is higher above the exposed portions E. The facets F (simply referred to as "f-plane") considerably absorb oxygen. The facets F are doped with both oxygen and silicon. The facet growth continues to the end. The portions above the masking portions M are the crystal defect cluster regions H, and the portions above the exposed portions E, but near the masking portions M, and directly below the facets F are the low-dislocation-density single-crystal regions Z. The amount of oxygen supplied is defined as O(t), and the amount of silicon supplied is defined as Si(t). The amounts of oxygen and silicon supplied may be constant during the growth, that is, O(t)=C$_2$ and Si(t)=C$_1$, respectively (where C$_1$ and C$_2$ are constants).

FIG. 20 shows an ideal type (type II) composed only of ridges to contrast it with FIG. 21. The ideal type is a repetition of ZHZHZH . . . . The ideal type is achieved with a stripe mask only in special cases. The ideal type is not achieved with a dot mask because of its geometric limitations; instead, a repetition of ZHZYHZYZH . . . is achieved. In practice, for either a dot mask or a stripe mask, the c-plane often appears midway between the masking portions M (indicated by the broken lines), and the c-plane growth regions Y are formed therebelow. Little oxygen is absorbed into the c-plane, and silicon is instead absorbed. That is, silicon is necessary for c-plane doping. In the initial stage of the growth, the masking portions M and the exposed portion E are influential, and the facets F are predominant. In the final stage of the growth, the difference between the masking portions M and the exposed portion E is not influential, and the c-plane tends to appear partially. Accordingly, it is possible to initially supply no or only a slight amount of silicon-containing gas (for example, SiH$_4$ gas) and gradually increase the amount of silicon-containing gas depending on the appearance of the c-plane. For example, the amount of silicon-containing gas supplied Si(t) may be determined on the basis of the equation Si(t)=C$_3$t+ C$_4$t$^2$+ . . . (where C$_3$ and C$_4$ are positive constants and t is time). This allows the donor concentration to be made more uniform in the thickness direction.

Type II, in which the facets F (f-plane) are maintained to the end, is most preferable in view of low cracking ratio, small bow, robustness, low dislocation density, and ease of oxygen doping. However, the c-plane may appear somewhere during the growth. If only oxygen doping is performed, the donor density (n-type dopant) is lower in those portions. In the present invention, the c-plane has a considerable donor density because the crystal is also doped with silicon. Thus, the donor density can be made uniform by doping the f-plane with oxygen and silicon and doping the c-plane with silicon. In addition, most of the donor is oxygen, and the dosage of silicon is low. This ensures safety because SiH$_4$, which is hazardous, does not have to be used in large quantities. A type II crystal is a repetition of ZHZYZHZYZH . . . as viewed in the lateral direction. This structure results in stress relaxation because different types of regions, namely, the regions H and Z or the regions H, Z, and Y, are mixed. This reduces the internal stress and therefore reduces the cracking ratio.

At higher substrate temperatures, namely, 1,080° C. to 1,150° C., a crystal having a surface of constant height (type I) grows I (see FIG. 21). For type I, the surface is a substantially flat c-plane surface. In practice, the portions above the masking portions M may be slightly depressed. The c-plane is doped with silicon as a donor, although not all of the donor is silicon; oxygen is important. A considerable proportion of the donor is oxygen. Even type I is initially grown by facet growth because the facets F are formed and grown as the growth starts from the exposed portions E. The crystal defect cluster regions H are formed above the masking portions M, and the low-dislocation-density single-crystal regions Z and the c-plane growth regions Y are formed above the exposed portions E. Because the temperature is high, the growth process becomes closer to c-plane growth as the end of the growth approaches. The portions above the masking portions M are the crystal defect cluster regions H, and the portions above the exposed portion E are a mixture of the low-dislocation-density single-crystal regions Z and the c-plane growth regions Y. The surface is the c-plane. This structure results in stress relaxation because different types of regions alternate (HZYZHZYZ . . . ).

Type I can absorb a large amount of oxygen because it is initially grown by facet growth and has numerous facets F, and also absorb silicon through the f-plane because silicon has no selectivity. The inner portion of the crystal is sufficiently doped with oxygen. The crystal is simultaneously doped with oxygen and silicon through the f-plane. As the end of the growth approaches, however, the facets F are decreased, and the growth process becomes closer to c-plane growth. Less oxygen is absorbed because the facets F are decreased, and more silicon is absorbed because the c-plane is increased. For type I, the effect of silicon doping becomes significant at the end of the growth, when silicon serves as a complementary dopant. That is, more silicon is contained in the surface, and more oxygen is contained in the inner portion.

It is also possible to introduce silicon as a dopant from the beginning and maintain a constant amount of silicon supplied ($Si(t)=C_1$). In this case, the f-plane is simultaneously doped with oxygen and silicon in the initial facet growth stage. As the end of the growth approaches, the c-plane becomes predominant, and the crystal is doped only with silicon. That is, whereas the rate at which silicon is absorbed remains constant, the rate at which oxygen is absorbed decreases. The donor density then varies in the thickness direction. As a result, the donor density is lower in the surface, and accordingly the resistivity is higher in the surface.

Because facet growth occurs initially and becomes closer to c-plane growth as the end of the growth approaches, the amount of silicon supplied may be changed with time. That is, it is possible to initially supply no silicon-containing gas (for example, $SiH_4$ gas), gradually increase the amount of silicon-containing gas supplied, and maximize the amount of silicon-containing gas supplied as the end of the growth approaches, as represented by the equation $Si(t)=C_3 t+C_4 t^2+\ldots$ (where $C_3$ and $C_4$ are positive constants and t is time). In this case, oxygen and silicon are absorbed through the f-plane in the initial and middle stages, when the f-plane is predominant, and silicon is absorbed through the c-plane in the final stage. This allows the donor (n-type dopant) concentration to be uniform in the thickness direction.

In resistivity measurement, silicon doping is influential because the measurement is carried out between two points in the surface. However, if devices are fabricated using the crystal as an n-type substrate, the oxygen concentration is influential because a current flows perpendicularly. The resistivity is the average of local variations in the lateral direction because it is measured between two separate points. The resistivity in the perpendicular direction differs from that in the lateral direction. For type II, if the resistivity is measured on the surface, oxygen doping and silicon doping are both influential; on the other hand, for type I, in which the surface is the c-plane, the portions doped with silicon contribute greatly to resistivity. Accordingly, for type I, the conductivity is increased (the resistivity is decreased) substantially in proportion to the dosage of silicon. That is, for type I, the smaller the dosage of silicon is, the higher the surface resistivity is. However, this applies only to the surface; the conductivity is high in the perpendicular direction because the inner portion of the crystal is doped with oxygen.

Even for type I, the internal stress can be relaxed because the inner portion of the crystal has the HZYZHZYZ . . . structure. Thus, the cracking ratio can be reduced.

To form type I, a higher temperature and a lower V/III ratio b are desired. Specifically, a temperature of 1,080° C. to 1,150° C. and a V/III ratio b of 1 to 10 are desired. In addition, type I can be more reliably formed if the temperature is 1,090° C. to 1,150° C. and the V/III ratio b is about 1 to 5.

At a V/III ratio b of 1 to 10 and a substrate temperature around 1,080° C. (1,070° C. to 1,090° C.), a mixture of type I and type II, that is, a crystal having trapezoidal tops, is formed (see FIG. 24). This crystal grows initially by facet growth. The crystal growth starts from the exposed portions E, and the facets F are formed at the edges of the exposed portions E. The growth starts later on the masking portions M. The low-dislocation-density single-crystal regions Z and the c-plane growth regions Y are formed above the exposed portions E. The crystal defect cluster regions H are formed above the masking portions M. Because this is facet growth, oxygen is absorbed through the facets F (f-plane). Silicon is also absorbed through the facets F. That is, the f-plane is simultaneously doped with silicon and oxygen. Although the crystal defect cluster regions H are formed above the masking portions M and the growth process changes to c-plane growth as the end of the growth approaches, the facets F remain to the end. The c-plane is doped with silicon. Thus, the dopant distribution becomes more uniform. The crystal has the HZYZHZYZ . . . structure, which reduces the internal stress and therefore reduces the cracking ratio.

Although the sectional views of the three types, namely, type II, type I, and the mixed type, are shown (FIGS. 20, 21, and 24, respectively), phase transition does not occur such that the cross-sectional shape changes suddenly at a certain temperature; it changes continuously with the temperature and the V/III ratio b. At a temperature of 1,090° C. to 1,150° C. and a V/III ratio b of 1 to 3, the ideal flat type shown in FIG. 21 is formed. As the temperature is decreased and the V/III ratio b is increased, the type changes gradually from the flat type in FIG. 21 to the ridge shape in FIG. 20.

A substrate temperature of 1,050° C. to 1,150° C. is relatively high as the growth temperature for vapor deposition of a nitride semiconductor. The growth of type I suggests that a crystal having a flat surface can be finally formed even on large masking portions if the temperature is increased.

A V/III ratio b of 1 to 10 is extremely low and is close to the lower limit in the vapor deposition of a nitride semiconductor. Growing a silicon- and oxygen-doped nitride semiconductor at a low V/III ratio b and a high growth temperature is the idea of the present invention.

By double doping with silicon and oxygen, silicon can be absorbed into the c-plane to form a highly uniform donor concentration distribution together with oxygen absorbed into the f-plane, thus achieving a conductive nitride semiconductor substrate having a resistivity r of $10^{-2}$ Ωcm or less. The lower limit of the resistivity r is 0.0015 Ωcm. That is, the range of resistivity r of the substrate of the present invention is 0.0015 Ωcm$\leq$r$\leq$0.01 Ωcm.

Because a crystal is grown on an underlying substrate on which a mask having a large repetition pitch is formed, a structure including different types of regions, namely, the crystal defect cluster regions H, the low-dislocation-density single-crystal regions Z, and the c-plane growth regions Y, is formed in the inner portion. That is, a structure in which different phases are sequentially arranged, namely, the ZYZHZYZ . . . structure, is formed. This structure relaxes the internal stress, thus providing a crystal having little bow. The radius of bow curvature U can be controlled to 3.5 m$\leq$U$\leq$8 m.

Because a crystal is grown on an underlying substrate on which a mask having a large repetition pitch is formed, a structure including different types of regions, namely, the crystal defect cluster regions H, the low-dislocation-density single-crystal regions Z, and the c-plane growth regions Y, is formed in the inner portion. This structure relaxes the internal stress, thus providing a crystal having low cracking ratio. The cracking ratio K can be controlled to 1%$\leq$K$\leq$22%.

In the facet growth proposed in Patent Documents 8, 9, and 10, a mask for defining a large exposed portion is formed on an underlying substrate to concentrate crystal defects above the masking portions, thereby reducing dislocations in the surrounding regions (Z and Y). This is intended to reduce dislocations.

If a crystal for use as an n-type substrate is grown, it is desirable that the crystal have low dislocation density because dislocations may be increased after a high-density current flows through the n-type substrate. A direct advantage of facet growth is to reduce dislocation density, but there is more advantage thereof.

In the facet growth proposed in Patent Documents 8, 9, and 10, different regions H, Z, and Y formed in the crystal relax the stress. It turned out that this also reduces bow and inhibits cracking. The c-plane growth in Patent Documents 1, 2, and 3 has little effect of stress relaxation because it forms the same crystal region. In Patent Documents 1, 2, and 3, crystals having a flat surface have a radius of bow curvature of several tens of centimeters and cannot be polished because the cracking ratio is 100%. Some crystals having a rough surface have a radius of bow curvature of about 1 m and can be polished, but are impractical because the cracking ratio is high.

Accordingly, the present invention employs facet growth to form a GaN crystal doped with an n-type impurity. In some cases, as in Patent Document 8, facet growth uses no mask, whereas in other cases, as in Patent Documents 9 and 10, a mask is formed on an underlying substrate to forcedly form facets from the edges of the masking portions, thereby designating the positions where the regions H, Z, and Y are formed. In this case, facets are inevitably formed, and if the facets are maintained to the end without being buried, dislocations cluster into the portions above the masking portions to form the crystal defect cluster regions H above the masking portions, thus reducing the dislocation density in other portions.

If a crystal is grown by facet growth using a mask having a large pitch for defining a large exposed portion, as in Patent Documents 9 and 10, a structure in which the crystal defect cluster regions H, which contain clusters of detects, and the low-dislocation-density single-crystal regions Z and the c-plane growth regions Y, which contain few defects, alternate can be formed, thus relaxing the internal stress.

It turned out that facet growth using a mask having a large pitch for defining a large exposed portion provides the advantageous effect of reducing dislocation density, reducing bow, and inhibiting cracking.

To produce a highly conductive GaN crystal, it must be heavily doped with an n-type impurity. If a single-crystal structure is heavily doped with an impurity, a strong internal stress occurs therein, thus increasing the bow, making the crystal susceptible to cracking, and increasing dislocations. By facet growth, the HZYZH . . . complex structure can be formed, thereby reducing the internal stress resulting from the high dosage of impurity.

Facet growth is expected to be effective for forming an n-type conductive crystal. Facet growth, however, has one disadvantage in view of forming a highly conductive n-type crystal. Patent Document 6 first revealed that oxygen serves as a donor in GaN to form an n-type crystal. This document demonstrated that water, which is safe, can be used for doping with an n-type impurity (O) and the activation rate is nearly 100%. Patent Document 7, however, found that oxygen doping has strong plane orientation dependence, that is, the plane orientation selectivity that oxygen is absorbed through facets but is not substantially absorbed through the c-plane. An oxygen-doped n-type crystal formed by facet growth has not only facets (f-plane), but also the c-plane. The portions below the f-plane have high conductivity, whereas the portions below the c-plane have high resistivity. Thus, facet growth causes significant local variations in the dosage of oxygen.

If a crystal is grown on an underlying substrate of a different material such as GaAs or sapphire, the c-plane may appear somewhere even in facet growth because the crystal grows in the c-axis direction. The regions below the c-plane, which are referred to as the single-crystal low-dislocation-density remaining region Y or the c-plane growth regions Y, have high resistivity because they absorb no oxygen. If the HZYZHZYZH . . . structure is formed by facet growth, the regions H and Z have high conductivity because they absorb oxygen, and the regions Y have high resistivity because they absorb no oxygen. That is, the resistivity varies locally and periodically.

This is a problem. In addition, this problem occurs only for facet growth using oxygen as an n-type impurity. Silicon is usually used as an n-type impurity for a GaN thin film. This problem does not occur for a normal method that employs c-plane growth using silicon as an n-type dopant.

Accordingly, in the present invention, a crystal is grown by facet growth while simultaneously doping it with oxygen and silicon. If silicon has c-plane selectivity, it should cancel out the f-plane selectivity of oxygen, thus forming a uniform donor concentration distribution. As a result of many experiments, the present inventors have found that silicon has no plane orientation dependence and is equally absorbed into both the c-plane and the f-plane. Therefore, by simultaneous doping with silicon (Si) and oxygen (O), silicon and oxygen are absorbed into the f-plane, and silicon is absorbed into the c-plane. That is, the crystal can be doped with the n-type impurities through all surfaces. If facet growth is performed on a c-plane underlying substrate (such as sapphire or GaN) or a (111) GaAs substrate, the HZYZHZ . . . structure is formed. In this case, silicon is absorbed into the regions Y so that they have low resistivity. This eliminates high-resistivity regions. Because no high-resistivity region is formed, the crystal has smaller local variations in conductivity and can therefore be used as a highly conductive n-type substrate.

The present invention has two characteristics: double doping with oxygen and silicon and facet growth. Because facet growth has been described in detail, the doping will be described below. In the related art, there is no example in which a nitride semiconductor is doubly doped with oxygen and silicon, and no document relating thereto was found.

There is a difference between that a certain element is n-type for GaN or other nitride semiconductors and that a certain element serves as an n-type dopant for GaN or other nitride semiconductors. In addition to oxygen and silicon, some other n-type impurities are available, including carbon. However, they do not necessarily serve as n-type dopants. If silicon and oxygen coexist, they might interfere with each other in the crystal, thus suppressing and cancelling out the effect of each other. Oxygen might fail to form a shallow donor level because of the presence of silicon, or conversely, silicon might fail to form a donor level because of the presence of oxygen. Even if a donor level is formed, silicon might capture n-type carriers released by oxygen. That is, two different types of n-type impurities might cancel out the effect of each other as a result of interaction. In this case, the conductivity could not be increased by doping with two different types of n-type impurities.

Even if two different types of n-type impurities are independent of each other without interference and each release one n-type carrier, their effects should differ because they should have different activation rates. The conductivity $\sigma$ can be represented as $\sigma = n\mu e$, where e is the electron charge, $\mu$ is the mobility of n-type carriers (free electrons), and n is the concentration of n-type carriers. The activation rates of oxygen and silicon are referred to as Mo and Ms, respectively. If silicon and oxygen are independent, $n = Mo[O] + Ms[Si]$, where [O] is the concentration of oxygen and [Si] is the concentration of silicon, and accordingly the conductivity $\sigma$ can be symbolically represented as $\sigma = \mu e(Mo[O] + Ms[Si])$. In terms of resistivity r, $r = 1/\sigma = 1/\mu e(Mo[O] + Ms[Si])$. In other words, if the oxygen concentration [O], the silicon concentration [Si], and the resistivity r meet the above relationship, silicon and oxygen are independent of each other without interfering with each other or cancelling out the effect of each other.

The oxygen and silicon concentrations are measured at a certain point in the c-plane and the f-plane on a sample using a secondary ion mass spectrometer (SIMS). The measured value may vary depending on the point where the concentration is measured because of variations in concentration. The resistivity is determined by measuring the resistance between two points on the surface. The resistivity is determined by allowing a current to flow across the ZHZYZH . . . structure. Because the regions Z and H differ in resistivity from the regions Y, the measured resistivity is the weighted average of the resistivity of the regions Z and H and the resistivity of the regions Y. The resistivity of the regions Y alone and the resistivity of the regions Z alone are unknown.

Because the regions H have the same resistivity as the regions Z and are much smaller than the regions Z, the ratio of the width of the regions H and Z to the width of the regions Y between the two points under resistivity measurement is expressed as z:y. That is, the relationship is normalized to y+z=1. Hence, the measured resistivity r can be represented by the following equation:

$$r=(1/\mu e)\{z/(Mo[O]_z+Ms[Si]_z)+y/(Mo[O]_y+Ms[Si]_y)\}$$

where $[O]_z$ is the oxygen concentration of the regions Z, $[Si]_z$ is the silicon concentration of the regions Z, $[O]_y$ is the oxygen concentration of the regions Y, and $[Si]_y$ is the silicon concentration of the regions Y. The present inventors have experimentally demonstrated that silicon is equally absorbed into the c-plane and the f-plane. Silicon absorbed through the c-plane enters the regions Y, whereas silicon absorbed through the f-plane enters the regions Z. Hence, $[Si]_z=[Si]_y$. The present inventors have also experimentally demonstrated that oxygen is absorbed into the f-plane but not into the c-plane. This does not mean that the difference is about 50 times, as disclosed in Patent Document 7, but means that $[O]_z=0$. If these two characteristics are taken into account, $[Si]_z=[Si]_y=[Si]$ and $[O]_z=[O]$, and the above equation describing the resistivity is simplified as follows:

$$r=(1/\mu e)\{z/(Mo[O]+Ms[Si])+y/(Ms[Si])\}$$

This allows a more intuitive understanding of the relationship between the oxygen and silicon concentrations and the resistivity in the present invention.

An n-type substrate having a lower resistivity r and a higher conductivity σ (rσ=1) is desired. According to the above equation, if [O] and [Si] are fixed, the resistivity is lowest at z:y=1:0. That is, it is desirable that the f-plane spread over the entire surface. In other words, it is desirable to grow a crystal while maintaining facets to the end, that is, to minimize the c-plane growth regions Y.

Type II meets the above condition. For type II, as shown in FIG. 20, a ridge-and-valley structure is maintained to the end, and the low-dislocation-density single-crystal regions Z are predominant. As the experimental results described later show, type II (ridge-and-valley structure) tends to have a lower resistivity than type I (flat).

Even for type II, if a dot mask is used, the c-plane growth region Y cannot be eliminated because of its geometric limitations. In this case, the c-plane growth region Y occurs inevitably midway between the masking portions, thus increasing the resistivity. If type II is formed using a stripe mask, the regions Y can be eliminated because the mask includes parallel masking portions. Accordingly, a crystal having the lowest resistivity should be formed if type II is formed using a stripe mask.

Type II is suitable for forming a low-resistivity, high-conductivity n-type crystal because it has the minimum resistivity if [O] and [Si] are fixed. Type II can be formed at a V/III ratio b of 1 to 10 and a temperature of 1,040° C. to 1,080° C.

A dot mask, however, has the advantage of low cracking ratio because of the absence of anisotropy in strength.

Type II, in which a facet structure is maintained to the end, has one disadvantage. Most of the facets, including {11-22}, {1-101}, {11-21}, and {1-102} planes, have a sharp angle Y, namely, about 50° to 60°, with reference to the c-plane. Because ridges are formed with the width w of the exposed portions E, the height of the ridges is (w/2)tanY. For example, if Y=55°, tanY=1.43, and accordingly the height of the ridges is 0.71w. If the width w is large, for example, 1,500 μm (1.5 mm), the height of the ridges is 1 mm. The ridges are wasteful because they are removed by grinding to form a flat surface before the crystal is polished to form a substrate. Thus, type II, in which high facets are maintained to the end, has the disadvantage of including large wasteful portions.

From this viewpoint, type I, in which a flat c-plane surface is finally formed, is economically more advantageous because it includes smaller wasteful portions. Type I can be formed at a V/III ratio b of 1 to 10 and a temperature of 1,080° C. to 1,150° C. Despite having a flat c-plane surface, type I has little bow and low cracking ratio and can therefore be processed into a substrate, unlike the crystals formed by c-plane growth in Patent Documents 2 and 3 (not facet growth, at 1,030° C. or less). Because the ratio z:y of type I is ideally 0:1, it has high resistivity if [O] and [Si] are fixed. However, this applies only to the surface, and the resistivity is low in the depth direction. It is important that the resistivity be low in the perpendicular direction because a current flows perpendicularly through a substrate used for devices. Type I has sufficiently high conductivity in the depth direction (perpendicular direction) because the crystal is initially grown by facet growth and is therefore doped with a large amount of oxygen in the initial stage.

The mixed type (see FIG. 24), formed at 1,070° C. to 1,090° C., have the advantages and disadvantages of the above two types. For the mixed type, the resistivity, the height of wasteful portions removed by grinding, and the bow and cracking ratio are at intermediate levels.

EXAMPLES

Dot masks or stripe masks were formed on GaAs substrates having (111) Ga-plane serving as underlying substrates. The masks were formed of $SiO_2$ and had a thickness of 60 to 200 nm. The ranges of dimensions (s, w, and p) of the masks were 10 μm≦s≦100 μm and 250 μm≦w≦10,000 μm. The dimensions and shapes of the masks of the individual samples will be described later. A GaN film was then grown on the substrates by HVPE. Specifically, a buffer layer was initially formed, and a thick epitaxial layer was then formed thereon. A total of 45 different types of samples were prepared. The growth conditions for the buffer layer were as follows:

Substrate temperature: 500° C. to 550° C.
GaCl partial pressure $P_{GaCl}$: 80 Pa (0.0008 atm)
$NH_3$ partial pressure $P_{NH3}$: 16 kPa (0.16 atm)
Thickness of buffer layer: 50 nm The buffer layer was grown at a V/III ratio b of 200. Although the growth temperature and the V/III ratio b are important in the present invention, they are important for epitaxial growth (growth of the thick film), and the V/III ratio b in the formation of the buffer layer is not important.

The term "cracked" means that a linear surface crack having a length of 2.0 mm or more occurs in the substrate, that three or more linear surface cracks having a length of 0.5 to 2.0 mm occur in the substrate, or that 21 or more linear surface cracks having a length of 0.3 to 0.5 mm occur in the substrate.

The term "not cracked" means that the number of linear surface cracks having a length of 2.0 mm or more occurring in the substrate is zero, that the number of linear cracks having a length of 0.5 to 2.0 mm occurring in the substrate is two or less, or that the number of cracks having a length of 0.3 to 0.5 mm occurring in the substrate is 20 or less.

The cracking ratio (%) is the number of cracked substrates divided by the total number of grown substrates and multiplied by 100. The donor density D refers to the concentration of n-type impurities. That is, the donor density D refers to the concentration of silicon and oxygen, which form a donor level. The oxygen concentration [O] and the silicon concentration [Si] were both measured using SIMS.

The bow U of a substrate is expressed as the radius of curvature (m). The curvature is the reciprocal thereof, namely, $U^{-1}$ $(m^{-1})$. This radius of curvature is the radius of curvature of a nitride semiconductor crystal after the removal of an underlying substrate but before the polishing. The smaller the radius of curvature is, the larger the bow is. The bow may also be expressed as the height h of the center of a wafer having a diameter D. As an approximation to a quadratic curve, the relationship is $h=D^2/8U$. For a 2 inch diameter wafer (D=50 mm), h (μm)=312/U (m).

Many experiments were repeatedly conducted with varying mask dimensions and shapes, varying growth temperatures, varying $NH_3$ partial pressures, GaCl partial pressures, and $SiH_4$ partial pressures, and varying amounts of water added. The substrate size of Sample 1 was 18 mm square, the substrate size of Sample 3 was three inches (75 mm) in diameter, and the substrates of the remaining samples were circular substrates having a diameter of two inches (50 mm).

The 45 samples will now be described. Serial numbers 1 to 45 were assigned to the individual samples. Samples 1 to 39 are examples of the present invention. Samples 40 to 45 are comparative examples. Of the invention examples, namely, Samples 1 to 39, Samples 1 to 24 are type I (flat surface). For type I, the oxygen concentration and the silicon concentration were measured in the c-plane because the surface is flat and the c-plane is exposed therein. Samples 25 to 39 are type II (ridge-shaped). For type II, the oxygen concentration and the silicon concentration were measured both in the c-plane and in the f-plane because the surface has ridges and valleys formed by inclined faces, namely, facets (f-plane), and flat faces, namely, the c-plane, and the oxygen concentration and the silicon concentration differ between the c-plane and the f-plane. The oxygen concentration and the silicon concentration in the c-plane are denoted by $O_C$ and $Si_C$, respectively, and the oxygen concentration and the silicon concentration in the f-plane are denoted by $O_F$ and $Si_F$, respectively.

The correspondences with the symbols shown above are as follows: $O_C=[O]_y$, $Si_C=[Si]_y$, $O_F=[O]_z$, and $Si_F=[Si]_z$.

Samples 1 to 18 and 25 to 36 had a stripe (parallel stripe) mask, where s is the width of the masking portions, w is the spacing between the masking portions in the lateral direction, and s+w is the pitch p. Samples 19 to 24 and 37 to 39 had a dot (isolated dot) mask formed on the underlying substrates, where s is the diameter of the dot masking portions and w is the spacing between the nearest masking portions. The dot mask can be completely defined only by s and w because the dot masking portions are arranged at the center and vertices of a repetitive pattern of equilateral hexagons.

For Samples 40 to 43 of comparative examples, no mask was formed on the underlying substrates, and the crystals were directly grown on the flat underlying substrates in vapor phase (by c-plane growth as a whole). Samples 40 to 43 were tested for examining the effect of a mask and do not belong to the related art. Samples 44 and 45 of comparative examples, which were grown under the same conditions as the present invention without supplying a silicon source gas, could not be used as n-type substrates because they had extremely high resistivity in the c-plane. Samples 44 and 45 demonstrate that a source gas containing silicon is required in addition to oxygen.

The term "core" in Table refers to the masking portions or the crystals grown thereon. Table shows the sample numbers, the types of pattern, the core spacing w (μm), the core width s (μm), the growth temperature Tq (° C.), $P_{Ga}$ (GaCl partial pressure $P_{GaCl}$; kPa), $P_N$ (ammonia partial pressure $P_{NH3}$; kPa), the substrate size (mm or inches ("")), the thickness (μm), the types of core (type of crystal of the portions formed on the masking portions; inverted layer J, polycrystalline layer P, or inclined layer A), the types of crystal surface (type I or type II), the silicon concentration $Si_C$ in the c-plane $(cm^{-3})$, the oxygen concentration $O_C$ in the c-plane $(cm^{-3})$, the silicon concentration $Si_F$ in facet-plane F $(cm^{-3})$, the oxygen concentration $O_F$ in facet-plane F $(cm^{-3})$, the resistivity r (Ωcm), the cracking ratio K (%), and the radius of bow curvature U (m). The radius of bow curvature is the radius of curvature of a crystal after the removal of an underlying substrate but before the polishing. The radius of bow curvature U is also simply referred to as the bow U, although it means the radius of curvature, and the larger the value is, the smaller the bow is. The resistivity r (Ωcm) and the cracking ratio K (%) were measured after the polishing.

Oxygen, serving as an n-type impurity, was supplied by adding water to one of the source gases. Silicon was supplied in the form of $SiH_4$ gas. The amount of water added and the partial pressure of $SiH_4$ gas were varied, although they were not measured or shown in Table because they were added in trace amounts and were therefore difficult to measure. Because the amount of water added and the $SiH_4$ partial pressure were varied, the dosages of silicon and oxygen, the resistivity r, the bow U, and the cracking ratio K varied from sample to sample even at the same substrate temperature Tq, the same mask dimensions (s, w, and p), and the same $NH_3$ and GaCl partial pressures.

TABLE

| Sample No. | Pattern | Core spacing w(μm) | Core width s(μm) | Growth temperature Tq(° C.) | Partial pressure $P_{Ga}$ (kPa) | $P_N$ (kPa) | Substrate size | Thickness (μm) | Type of core |
|---|---|---|---|---|---|---|---|---|---|
| 1 | Stripe | 500 | 50 | 1100 | 4 | 10 | 18 mm | 400 | Inverted layer J |
| 2 | Stripe | 500 | 50 | 1100 | 4 | 10 | 2" | 400 | Inverted layer J |
| 3 | Stripe | 500 | 50 | 1100 | 4 | 10 | 3" | 400 | Inverted layer J |
| 4 | Stripe | 500 | 50 | 1100 | 10 | 10 | 2" | 400 | Inverted layer J |
| 5 | Stripe | 500 | 50 | 1100 | 3.3 | 10 | 2" | 400 | Inverted layer J |

TABLE-continued

| Sample No. | Pattern | | Core spacing w(μm) | Core width s(μm) | Growth temperature Tq(°C.) | Partial pressure $P_{Ga}$ (kPa) | Partial pressure $P_N$ (kPa) | Substrate size | Thickness (μm) | Type of core |
|---|---|---|---|---|---|---|---|---|---|---|
| 6 | Stripe | | 500 | 50 | 1100 | 4 | 10 | 2" | 400 | Inverted layer J |
| 7 | Stripe | | 500 | 50 | 1100 | 4 | 10 | 2" | 400 | Inverted layer J |
| 8 | Stripe | | 500 | 50 | 1100 | 4 | 10 | 2" | 400 | Polycrystalline layer P |
| 9 | Stripe | | 500 | 50 | 1100 | 4 | 10 | 2" | 400 | Inclined layer A |
| 10 | Stripe | | 500 | 10 | 1100 | 4 | 10 | 2" | 400 | Inverted layer J |
| 11 | Stripe | | 500 | 25 | 1100 | 4 | 10 | 2" | 400 | Inverted layer J |
| 12 | Stripe | | 500 | 100 | 1100 | 4 | 10 | 2" | 400 | Inverted layer J |
| 13 | Stripe | | 250 | 50 | 1100 | 4 | 10 | 2" | 400 | Inverted layer J |
| 14 | Stripe | | 750 | 50 | 1100 | 4 | 10 | 2" | 400 | Inverted layer J |
| 15 | Stripe | | 1000 | 50 | 1100 | 4 | 10 | 2" | 400 | Inverted layer J |
| 16 | Stripe | | 1500 | 50 | 1100 | 4 | 10 | 2" | 400 | Inverted layer J |
| 17 | Stripe | | 2000 | 50 | 1100 | 4 | 10 | 2" | 400 | Inverted layer J |
| 18 | Stripe | | 10000 | 50 | 1100 | 4 | 10 | 2" | 400 | Inverted layer J |
| 19 | Dot | | 500 | 50 | 1100 | 4 | 10 | 2" | 400 | Inverted layer J |
| 20 | Dot | | 500 | 50 | 1100 | 4 | 10 | 2" | 400 | Inverted layer J |
| 21 | Dot | | 500 | 50 | 1100 | 4 | 10 | 2" | 400 | Inverted layer J |
| 22 | Dot | | 1000 | 50 | 1100 | 4 | 10 | 2" | 400 | Inverted layer J |
| 23 | Dot | | 2500 | 50 | 1100 | 4 | 10 | 2" | 400 | Inverted layer J |
| 24 | Dot | | 5000 | 50 | 1100 | 4 | 10 | 2" | 400 | Inverted layer J |
| 25 | Stripe | | 500 | 50 | 1050 | 4 | 10 | 2" | 400 | Inverted layer J |
| 26 | Stripe | | 500 | 50 | 1050 | 4 | 10 | 2" | 400 | Inverted layer J |
| 27 | Stripe | | 500 | 50 | 1050 | 4 | 10 | 2" | 400 | Inverted layer J |
| 28 | Stripe | | 500 | 50 | 1050 | 4 | 10 | 2" | 400 | Inverted layer J |
| 29 | Stripe | | 500 | 50 | 1050 | 4 | 10 | 2" | 400 | Inverted layer J |
| 30 | Stripe | | 500 | 50 | 1050 | 4 | 10 | 2" | 400 | Inverted layer J |
| 31 | Stripe | | 500 | 50 | 1050 | 4 | 10 | 2" | 400 | Inverted layer J |
| 32 | Stripe | | 500 | 50 | 1050 | 4 | 10 | 2" | 400 | Inverted layer J |
| 33 | Stripe | | 500 | 50 | 1050 | 4 | 10 | 2" | 400 | Inverted layer J |
| 34 | Stripe | | 500 | 50 | 1050 | 4 | 10 | 2" | 400 | Inverted layer J |
| 35 | Stripe | | 500 | 50 | 1050 | 4 | 10 | 2" | 400 | Inverted layer J |
| 36 | Stripe | | 500 | 50 | 1050 | 4 | 10 | 2" | 400 | Inverted layer J |
| 37 | Dot | | 500 | 50 | 1050 | 4 | 10 | 2" | 400 | Inverted layer J |
| 38 | Dot | | 500 | 50 | 1050 | 4 | 10 | 2" | 400 | Inverted layer J |
| 39 | Dot | | 500 | 50 | 1050 | 4 | 10 | 2" | 400 | Inverted layer J |
| 40 | C-plane | Comparative example | — | — | 1050 | 4 | 10 | 2" | 400 | — |
| 41 | C-plane | Comparative example | — | — | 1050 | 4 | 10 | 2" | 400 | — |
| 42 | C-plane | Comparative example | — | — | 1030 | 4 | 10 | 2" | 400 | — |
| 43 | C-plane | Comparative example | — | — | 1030 | 4 | 10 | 2" | 400 | — |
| 44 | Stripe | Comparative example | 500 | 50 | 1050 | 4 | 10 | 2" | 400 | Inverted layer J |
| 45 | Stripe | Comparative example | 500 | 50 | 1050 | 4 | 10 | 2" | 400 | Inverted layer J |

| Sample No. | Type of crystal surface | C-plane Silicon concentration $Si_C$ (cm$^{-3}$) | C-plane Oxygen concentration $O_C$ (cm$^{-3}$) | F-plane Silicon concentration $Si_F$ (cm$^{-3}$) | F-plane Oxygen concentration $O_F$ (cm$^{-3}$) | Resistivity r (Ωcm) | Cracking ratio K (%) | Radius of bow curvature U (m) |
|---|---|---|---|---|---|---|---|---|
| 1 | I | $1 \times 10^{18}$ | $1 \times 10^{15}$ | — | — | $9 \times 10^{-3}$ | 1 | 8.0 |
| 2 | I | $1 \times 10^{18}$ | $1 \times 10^{15}$ | — | — | $9 \times 10^{-3}$ | 7 | 6.2 |
| 3 | I | $1 \times 10^{18}$ | $1 \times 10^{15}$ | — | — | $9 \times 10^{-3}$ | 12 | 5.2 |
| 4 | I | $1 \times 10^{19}$ | $1 \times 10^{15}$ | — | — | $4.7 \times 10^{-3}$ | 15 | 5.0 |
| 5 | I | $1 \times 10^{18}$ | $1 \times 10^{15}$ | — | — | $9 \times 10^{-3}$ | 13 | 6.2 |
| 6 | I | $1 \times 10^{17}$ | $1 \times 10^{15}$ | — | — | $1 \times 10^{-2}$ | 3 | 6.5 |
| 7 | I | $5 \times 10^{19}$ | $1 \times 10^{15}$ | — | — | $1.8 \times 10^{-3}$ | 17 | 4.7 |
| 8 | I | $1 \times 10^{18}$ | $1 \times 10^{15}$ | — | — | $9 \times 10^{-3}$ | 9 | 6.2 |
| 9 | I | $1 \times 10^{18}$ | $1 \times 10^{15}$ | — | — | $9 \times 10^{-3}$ | 11 | 6.2 |
| 10 | I | $1 \times 10^{18}$ | $1 \times 10^{15}$ | — | — | $9 \times 10^{-3}$ | 11 | 6.2 |
| 11 | I | $1 \times 10^{18}$ | $1 \times 10^{15}$ | — | — | $9 \times 10^{-3}$ | 9 | 6.2 |
| 12 | I | $1 \times 10^{18}$ | $1 \times 10^{15}$ | — | — | $9 \times 10^{-3}$ | 8 | 6.4 |
| 13 | I | $1 \times 10^{18}$ | $1 \times 10^{15}$ | — | — | $9 \times 10^{-3}$ | 6 | 6.8 |
| 14 | I | $1 \times 10^{18}$ | $1 \times 10^{15}$ | — | — | $9 \times 10^{-3}$ | 8 | 6.2 |
| 15 | I | $1 \times 10^{18}$ | $1 \times 10^{15}$ | — | — | $9 \times 10^{-3}$ | 11 | 5.3 |
| 16 | I | $1 \times 10^{18}$ | $1 \times 10^{15}$ | — | — | $9 \times 10^{-3}$ | 13 | 4.7 |
| 17 | I | $1 \times 10^{18}$ | $1 \times 10^{15}$ | — | — | $9 \times 10^{-3}$ | 17 | 4.2 |
| 18 | I | $1 \times 10^{18}$ | $1 \times 10^{15}$ | — | — | $9 \times 10^{-3}$ | 22 | 4.0 |
| 19 | I | $1 \times 10^{18}$ | $1 \times 10^{15}$ | — | — | $9 \times 10^{-3}$ | 4 | 4.8 |
| 20 | I | $4 \times 10^{18}$ | $1 \times 10^{15}$ | — | — | $7 \times 10^{-3}$ | 5 | 4.2 |

TABLE-continued

| Sample No. | Pattern | Core spacing w(μm) | Core width s(μm) | Growth temperature Tq(° C.) | Partial pressure $P_{Ga}$ (kPa) | $P_N$ (kPa) | Substrate size | Thickness (μm) | Type of core |
|---|---|---|---|---|---|---|---|---|---|
| 21 | I | $7 \times 10^{18}$ | $1 \times 10^{15}$ | — | — | — | $5 \times 10^{-3}$ | 7 | 3.8 |
| 22 | I | $1 \times 10^{18}$ | $1 \times 10^{15}$ | — | — | — | $9 \times 10^{-3}$ | 9 | 3.7 |
| 23 | I | $1 \times 10^{18}$ | $1 \times 10^{15}$ | — | — | — | $9 \times 10^{-3}$ | 10 | 3.7 |
| 24 | I | $1 \times 10^{18}$ | $1 \times 10^{15}$ | — | — | — | $9 \times 10^{-3}$ | 13 | 3.5 |
| 25 | II | $1 \times 10^{18}$ | $1 \times 10^{15}$ | $1 \times 10^{18}$ | $1 \times 10^{18}$ | | $8 \times 10^{-3}$ | 6 | 6.5 |
| 26 | II | $4 \times 10^{18}$ | $1 \times 10^{15}$ | $4 \times 10^{18}$ | $1 \times 10^{18}$ | | $6 \times 10^{-3}$ | 8 | 6.3 |
| 27 | II | $7 \times 10^{18}$ | $1 \times 10^{15}$ | $7 \times 10^{18}$ | $1 \times 10^{18}$ | | $4 \times 10^{-3}$ | 11 | 6.2 |
| 28 | II | $1 \times 10^{19}$ | $1 \times 10^{15}$ | $1 \times 10^{19}$ | $1 \times 10^{18}$ | | $2 \times 10^{-3}$ | 12 | 6.0 |
| 29 | II | $1 \times 10^{18}$ | $1 \times 10^{15}$ | $1 \times 10^{18}$ | $5 \times 10^{16}$ | | $8 \times 10^{-3}$ | 5 | 6.4 |
| 30 | II | $1 \times 10^{18}$ | $1 \times 10^{15}$ | $1 \times 10^{18}$ | $1 \times 10^{17}$ | | $7.9 \times 10^{-3}$ | 5 | 6.3 |
| 31 | II | $1 \times 10^{18}$ | $1 \times 10^{15}$ | $1 \times 10^{18}$ | $5 \times 10^{17}$ | | $7.5 \times 10^{-3}$ | 6 | 6.2 |
| 32 | II | $1 \times 10^{18}$ | $1 \times 10^{15}$ | $1 \times 10^{18}$ | $5 \times 10^{18}$ | | $7.5 \times 10^{-3}$ | 7 | 6.0 |
| 33 | II | $1 \times 10^{18}$ | $1 \times 10^{15}$ | $1 \times 10^{18}$ | $1 \times 10^{19}$ | | $2 \times 10^{-3}$ | 10 | 5.8 |
| 34 | II | $4 \times 10^{18}$ | $1 \times 10^{15}$ | $4 \times 10^{18}$ | $1 \times 10^{19}$ | | $1.9 \times 10^{-3}$ | 11 | 5.5 |
| 35 | II | $7 \times 10^{18}$ | $1 \times 10^{15}$ | $7 \times 10^{18}$ | $1 \times 10^{19}$ | | $1.8 \times 10^{-3}$ | 14 | 5.0 |
| 36 | II | $1 \times 10^{19}$ | $1 \times 10^{15}$ | $1 \times 10^{19}$ | $1 \times 10^{19}$ | | $1.5 \times 10^{-3}$ | 18 | 4.8 |
| 37 | II | $1 \times 10^{18}$ | $1 \times 10^{15}$ | $1 \times 10^{18}$ | $1 \times 10^{18}$ | | $8 \times 10^{-3}$ | 3 | 5.0 |
| 38 | II | $4 \times 10^{18}$ | $1 \times 10^{15}$ | $4 \times 10^{18}$ | $1 \times 10^{18}$ | | $6.3 \times 10^{-3}$ | 5 | 4.6 |
| 39 | II | $7 \times 10^{18}$ | $1 \times 10^{15}$ | $7 \times 10^{18}$ | $1 \times 10^{18}$ | | $4 \times 10^{-3}$ | 6 | 4.2 |
| 40 | — | $1 \times 10^{18}$ | $1 \times 10^{15}$ | — | — | | 0.01 | 75 | 1.5 |
| 41 | — | $1 \times 10^{19}$ | $1 \times 10^{15}$ | — | — | | $4.7 \times 10^{-3}$ | 88 | 1.2 |
| 42 | — | $1 \times 10^{18}$ | $1 \times 10^{15}$ | — | — | | 0.01 | 92 | 1.3 |
| 43 | — | $1 \times 10^{19}$ | $1 \times 10^{15}$ | — | — | | $4.7 \times 10^{-3}$ | 90 | 1.0 |
| 44 | II | $1 \times 10^{16}$ | $1 \times 10^{15}$ | $1 \times 10^{16}$ | $4 \times 10^{18}$ | | High in c-plane | 30 | 7.0 |
| 45 | II | $1 \times 10^{16}$ | $1 \times 10^{15}$ | $1 \times 10^{16}$ | $8 \times 10^{18}$ | | High in c-plane | 36 | 6.8 |

Sample 1 (Invention Example; Stripe; Type I)

A parallel stripe mask having a stripe core spacing w of 500 μm and a mask (core) width s of 50 μm was formed on 18 mm square GaAs substrates. Sample 1 is characterized in that 18 mm square wafers were used as underlying substrates. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The GaAs substrates were removed by machining, thus obtaining free-standing GaN substrates having a thickness of 400 μm. The V/III ratio b was 2.5. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 1%, which is extremely low and was the minimum of all samples. The bow U was 8 m, indicating that the bow was extremely small. Thus, these were superior conductive GaN substrates.

Sample 2 (Invention Example; Stripe; Type I)

A parallel stripe mask having a stripe core spacing w of 500 μm and a mask width s of 50 μm was formed on 2 inch (50 mm) diameter circular GaAs substrates, which are easily available. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The GaAs substrates were removed by machining, thus obtaining free-standing GaN substrates having a thickness of 400 μm. The V/III ratio b was 2.5. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 7%, which is low. The bow U was 6.2 m, indicating that the bow was small. Thus, these were superior conductive GaN substrates.

Sample 3 (Invention Example; Stripe; Type I)

A parallel stripe mask having a stripe core spacing w of 500 μm and a mask width s of 50 μm was formed on 3 inch (75 mm) diameter circular GaAs substrates. Sample 3 is characterized in that large 3 inch GaN wafers were used as underlying substrates. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The GaAs substrates were removed by machining, thus obtaining free-standing GaN substrates having a thickness of 400 μm. The V/III ratio b was 2.5. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ cm$^{-3}$, and the oxygen concentration $O_C$ in the c-plane was $1\times10^{15}$/cm$^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 12%, which is low. The bow U was 5.2 m, indicating that the bow was small. Thus, these were superior conductive GaN substrates having a large area.

Sample 4 (Invention Example; Stripe; Type I)

A parallel stripe mask having a stripe core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the NH$_3$ partial pressure $P_{NH3}$ was 10 kPa (0.1 atm), and the GaCl partial pressure $P_{GaCl}$ was 10 kPa (0.1 atm). The epitaxial layer was grown to a thickness of 400 μm or more. Sample 4 is characterized in that the GaCl partial pressure was high.

The GaAs substrates were removed by machining, thus obtaining free-standing GaN substrates having a thickness of 400 μm. The V/III ratio b was 1. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{19}$ cm$^{-3}$, and the oxygen concentration $O_C$ in the c-plane was $1\times10^{15}$/cm$^3$. The silicon-to-oxygen ratio (Si/O ratio) (q) in the c-plane was $10^4$. The amount of oxygen absorbed was small because of the c-plane growth. The resistivity r was $4.7\times10^{-3}$ Ωcm. That is, the substrates had low resistivity r and were satisfactorily conductive. Silicon was the main donor responsible for releasing n-type carriers (conduction electrons). The cracking ratio K was 15%, which is low. The bow U was 5 m, indicating that the bow was small. Thus, these were superior conductive GaN substrates.

Sample 5 (Invention Example; Stripe; Type I)

A parallel stripe mask having a stripe core spacing w of 500 μM and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the NH$_3$ partial pressure $P_{NH3}$ was 10 kPa (0.1 atm), and the GaCl partial pressure $P_{GaCl}$ was 3.3 kPa (0.033 atm). The epitaxial layer was grown to a thickness of 400 μm or more.

The V/III ratio b was 3. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ cm$^{-3}$, and the oxygen concentration $O_C$ in the c-plane was $1\times10^{15}$/cm$^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 13%, which is low. The bow U was 6.2 m, indicating that the bow was small. Thus, these were superior conductive GaN substrates.

Sample 6 (Invention Example; Stripe; Type I)

A parallel stripe mask having a stripe core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{17}$ cm$^{-3}$, and the oxygen concentration $O_C$ in the c-plane was $1\times10^{15}$/cm$^3$. The silicon-to-oxygen ratio (Si/O ratio) (q) in the c-plane was $10^2$. The amount of oxygen absorbed was small because of the c-plane growth. The resistivity r was $1\times10^{-2}$ Ωcm, which was the highest among all samples. Still, these were conductive substrates with satisfactorily low resistivity r. Silicon was the main donor responsible for releasing n-type carriers (conduction electrons). The cracking ratio K was 3%, which is extremely low. The bow U was 6.5 m, indicating that the bow was small. Thus, these were superior conductive GaN substrates.

Sample 7 (Invention Example; Stripe; Type I)

A parallel stripe mask having a stripe core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $5\times10^{19}$ cm$^{-3}$, and the oxygen concentration $O_C$ in the c-plane was $1\times10^{15}$/cm$^3$. The silicon-to-oxygen ratio (Si/O ratio) (q) in the c-plane was $5\times10^4$. The amount of oxygen absorbed was small because of the c-plane growth. The resistivity r was $1.8\times10^{-3}$ Ωcm. That is, the substrates had extremely low resistivity r and were conductive. Silicon was the main donor responsible for releasing n-type carriers (conduction electrons). The cracking ratio K was 17%, which is satisfactorily low. The bow U was 4.7 m, indicating that the bow was satisfactorily small. Thus, these were superior conductive GaN substrates.

Sample 8 (Invention Example; Stripe; Type I)

A parallel stripe mask having a stripe core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the polycrystalline layer P. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ $cm^{-3}$, and the oxygen concentration $O_C$ in the c-plane was $1\times10^{15}/cm^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 9%, which is low. The bow U was 6.2 m, indicating that the bow was small. Thus, these were superior conductive GaN substrates.

Sample 9 (Invention Example; Stripe; Type I)

A parallel stripe mask having a stripe core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inclined layer A. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ $cm^{-3}$, and the oxygen concentration $O_C$ in the c-plane was $1\times10^{15}/cm^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 11%, which is low. The bow U was 6.2 m, indicating that the bow was small. Thus, these were superior conductive GaN substrates.

Sample 10 (Invention Example; Stripe; Type I)

A parallel stripe mask having a stripe core spacing w of 500 μm and a mask width s of 10 μm was formed on 2 inch (50 mm) diameter circular GaAs substrates. Sample 10 is characterized in that the mask width s was extremely small. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ $cm^{-3}$, and the oxygen concentration $O_C$ in the c-plane was $1\times10^{15}/cm^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 11%, which is low. The bow U was 6.2 m, indicating that the bow was small. Thus, these were superior conductive GaN substrates. In this way, an n-type conductive substrate having a desired structure can be formed even if the mask width s is as small as 10 μm.

Sample 11 (Invention Example; Stripe; Type I)

A parallel stripe mask having a stripe core spacing w of 500 μm and a mask width s of 25 μm was formed on 2 inch (50 mm) diameter circular GaAs substrates. Sample 11 is characterized in that the mask width s was small. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ $cm^{-3}$, and the oxygen concentration $O_C$ in the c-plane was $1\times10^{15}/cm^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 9%, which is low. The bow U was 6.2 m, indicating that the bow was small. Thus, these were superior conductive GaN substrates. In this way, an n-type conductive substrate having a desired structure can be formed even if the mask width s is as small as 25 μm.

Sample 12 (Invention Example; Stripe; Type I)

A parallel stripe mask having a stripe core spacing w of 500 μm and a mask width s of 100 μm was formed on 2 inch (50 mm) diameter circular GaAs substrates. Sample 12 is characterized in that the mask width s was large. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1\times10^{18}$ $cm^{-3}$, and the oxygen concentration $O_C$ in the c-plane was $1\times10^{15}/cm^3$. The silicon-to-oxygen ratio (Si/O ratio) (q) in the c-plane was $10^3$. The amount of oxygen absorbed was small because of the c-plane growth. The resistivity r was $9\times10^{-3}$ Ωcm. That is, the substrates had low resistivity r and were satisfactorily conductive. Silicon was the main donor responsible for releasing n-type carriers (conduction electrons). The cracking ratio K was 8%, which is low. The bow U was 6.4 m, indicating that the bow was small. Thus, these were superior conductive GaN substrates. In this way, an n-type conductive substrate having a desired structure can be formed even if the mask width s is as large as 100 µm.

Sample 13 (Invention Example; Stripe; Type I)

A parallel stripe mask having a stripe core spacing w of 250 µm and a mask width s of 50 µm was formed on 2 inch (50 mm) diameter circular GaAs substrates. Sample 13 is characterized in that the stripe core spacing w was small. After a buffer layer was formed on the substrates, an epitaxial layer was grown thereon. The epitaxial growth temperature Tq was 1,100° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 µm or more.

The V/III ratio b was 2.5. The GaAs substrates were removed by machining, thus obtaining free-standing GaN substrates having a thickness of 400 µm. The type of core crystal was the inverted layer J. The type of crystal surface was type I, which was formed because the growth temperature Tq was high. Because this was type I, the surface was flat, and only the c-plane was exposed therein. The silicon concentration Si$_C$ in the c-plane was $1 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 6%, which is very low. The bow U was 6.8 m, indicating that the bow was small. Thus, these were superior conductive GaN substrates. In this way, an n-type conductive substrate having a desired structure can be formed even if the stripe core spacing w is as small as 250 µm.

Sample 14 (Invention Example; Stripe; Type I)

A parallel stripe mask having a stripe core spacing w of 750 µm and a mask width s of 50 µm was formed on 2 inch (50 mm) diameter circular GaAs substrates. Sample 14 is characterized in that the stripe core spacing w was large. After a buffer layer was formed on the substrates, an epitaxial layer was grown thereon. The epitaxial growth temperature Tq was 1,100° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 µm or more.

The V/III ratio b was 2.5. The GaAs substrates were removed by machining, thus obtaining free-standing GaN substrates having a thickness of 400 µm. The type of core crystal was the inverted layer J. The type of crystal surface was type I, which was formed because the growth temperature Tq was high. Because this was type I, the surface was flat, and only the c-plane was exposed therein. The silicon concentration Si$_C$ in the c-plane was $1 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 8%, which is low. The bow U was 6.2 m, indicating that the bow was small. Thus, these were superior conductive GaN substrates. In this way, an n-type conductive substrate having a desired structure can be formed even if the stripe core spacing w is as large as 750 µm.

Sample 15 (Invention Example; Stripe; Type I)

A parallel stripe mask having a stripe core spacing w of 1,000 µm and a mask width s of 50 µm was formed on 2 inch (50 mm) diameter circular GaAs substrates. Sample 15 is characterized in that the stripe core spacing w was large. After a buffer layer was formed on the substrates, an epitaxial layer was grown thereon. The epitaxial growth temperature Tq was 1,100° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 µm or more.

The V/III ratio b was 2.5. The GaAs substrates were removed by machining, thus obtaining free-standing GaN substrates having a thickness of 400 µm. The type of core crystal was the inverted layer J. The type of crystal surface was type I, which was formed because the growth temperature Tq was high. Because this was type I, the surface was flat, and only the c-plane was exposed therein. The silicon concentration Si$_C$ in the c-plane was $1 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 11%, which is low. The bow U was 5.3 m, indicating that the bow was small. Thus, these were superior conductive GaN substrates. In this way, an n-type conductive substrate having a desired structure can be formed even if the stripe core spacing w is as large as 1,000 µm (1 mm).

Sample 16 (Invention Example; Stripe; Type I)

A parallel stripe mask having a stripe core spacing w of 1,500 µm and a mask width s of 50 µm was formed on 2 inch (50 mm) diameter circular GaAs substrates. Sample 16 is characterized in that the stripe core spacing w was large. After a buffer layer was formed on the substrates, an epitaxial layer was grown thereon. The epitaxial growth temperature Tq was 1,100° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 µm or more.

The V/III ratio b was 2.5. The GaAs substrates were removed by machining, thus obtaining free-standing GaN substrates having a thickness of 400 µm. The type of core crystal was the inverted layer J. The type of crystal surface was type I, which was formed because the growth temperature Tq was high. Because this was type I, the surface was flat, and only the c-plane was exposed therein. The silicon concentration Si$_C$ in the c-plane was $1 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 13%, which is low. The bow U was 4.7 m, indicating that the bow was small. Thus, these were superior conductive GaN substrates. In this way, an n-type conductive substrate having a desired structure can be formed even if the stripe core spacing w is as large as 1,500 µm (1.5 mm).

Sample 17 (Invention Example; Stripe; Type I)

A parallel stripe mask having a stripe core spacing w of 2,000 µm and a mask width s of 50 µm was formed on 2 inch (50 mm) diameter circular GaAs substrates. Sample 17 is characterized in that the stripe core spacing w was large. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 17%, which is satisfactorily low. The bow U was 4.2 m, indicating that the bow was satisfactorily small. Thus, these were superior conductive GaN substrates. In this way, an n-type conductive substrate having a desired structure can be formed even if the stripe core spacing w is as large as 2,000 μm (2.0 mm).

Sample 18 (Invention Example; Stripe; Type I)

A parallel stripe mask having a stripe core spacing w of 10,000 μm and a mask width s of 50 μm was formed on 2 inch (50 mm) diameter circular GaAs substrates. Sample 18 is characterized in that the stripe core spacing w was large. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 22%, which is satisfactorily low. The bow U was 4 m, indicating that the bow was satisfactorily small. Thus, these were superior conductive GaN substrates. In this way, an n-type conductive substrate having a desired structure can be formed even if the stripe core spacing w is as large as 10,000 μm (10 mm).

A comparison between Samples 16, 17, and 18 reveals that an conductive substrate having a desired structure can be formed if the mask spacing w is up to about 10,000 μm and that as the mask spacing w is increased, the cracking ratio K is increased, and the bow is also gradually increased. Accordingly, an excellent crystal structure can be achieved over a wide range of stripe mask spacing w, namely, 250 to 10,000 μm.

Samples 1 to 18 above are type I (flat surface) crystals grown on stripe masks. Next, invention examples using dot masks, namely, Samples 19 to 24, will be described.

Sample 19 (Invention Example; Dot; Type I)

A dot mask having a dot core spacing w of 500 μm and a mask diameter s of 50 μm was formed on 2 inch (50 mm) diameter circular GaAs substrates. The dot mask had an isolated dot pattern of masking portions formed at positions with six-fold symmetry. That is, the masking portions were arranged at the vertices of regular triangles tiled together. Hence, the mask can be defined only by s and w. This sample demonstrates that the present invention can be applied either to a stripe mask or to a dot mask. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 4%, which is extremely low. The bow U was 4.8 m, indicating that the bow was satisfactorily small. Thus, these were superior conductive GaN substrates. In this way, a dot mask can be used to form a highly conductive GaN substrate having a similar structure.

Sample 20 (Invention Example; Dot; Type I)

A dot mask having a dot core spacing w of 500 μm and a mask diameter s of 50 μm was formed on 2 inch (50 mm) diameter circular GaAs substrates. This sample demonstrates that the present invention can be applied either to a stripe mask or to a dot mask. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $4 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $4 \times 10^3$. The amount of oxygen absorbed was small because of the c-plane growth. The resistivity r was $7 \times 10^{-3}$ Ωcm. That is, the substrates had low resistivity r and were conductive. Silicon was the main donor responsible for releasing n-type carriers (conduction electrons). The cracking ratio K was 5%, which is extremely low. The bow U was 4.2 m, indicating that the bow was satisfactorily small. Thus, these were superior conductive GaN substrates. In this way, a dot mask can be used to form a highly conductive GaN substrate having a similar structure.

Sample 21 (Invention Example; Dot; Type I)

A dot mask having a dot core spacing w of 500 μm and a mask diameter s of 50 μm was formed on 2 inch (50 mm) diameter circular GaAs substrates. This sample demonstrates that the present invention can be applied either to a stripe mask or to a dot mask. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $7 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $7 \times 10^3$. The amount of oxygen absorbed was small because of the c-plane growth. The resistivity r was $5 \times 10^{-3}$ Ωcm. That is, the substrates had low resistivity r and were conductive. Silicon was the main donor responsible for releasing n-type carriers (conduction electrons). The cracking ratio K was 7%, which is low. The bow U was 3.8 m, indicating that the bow was satisfactorily small. Thus, these were superior conductive GaN substrates. In this way, a dot mask can be used to form a highly conductive GaN substrate having a similar structure.

Sample 22 (Invention Example; Dot; Type I)

A dot mask having a dot core spacing w of 1,000 μm and a mask diameter s of 50 μm was formed on 2 inch (50 mm) diameter circular GaAs substrates. Sample 22 is characterized in that the dot core spacing w was large. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 9%, which is low. The bow U was 3.7 m, indicating that the bow was satisfactorily small. Thus, these were superior conductive GaN substrates. In this way, a dot mask having a large dot spacing (w=1,000 μm) can be used to form a highly conductive GaN substrate having a similar structure.

Sample 23 (Invention Example; Dot; Type I)

A dot mask having a dot core spacing w of 2,500 μm and a mask diameter s of 50 μm was formed on 2 inch (50 mm) diameter circular GaAs substrates. Sample 23 is characterized in that the dot core spacing w was large. After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^{-3}$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 10%, which is low. The bow U was 3.7 m, indicating that the bow was satisfactorily small. Thus, these were superior conductive GaN substrates. In this way, a dot mask having a large dot spacing (w=2,500 μm) can be used to form a highly conductive GaN substrate having a similar structure.

Sample 24 (Invention Example; Dot; Type I)

A dot mask having a dot core spacing w of 5,000 μm and a mask diameter s of 50 μm was formed on 2 inch (50 mm) diameter circular GaAs substrates. Sample 24 is characterized in that the dot core spacing w was extremely large (5 mm). After a buffer layer was formed on the substrates, an epitaxial layer was grown thereon. The epitaxial growth temperature Tq was 1,100° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type I, which was formed because the growth temperature Tq was high. Because this was type I, the surface was flat, and only the c-plane was exposed therein. The silicon concentration $Si_C$ in the c-plane was $1 \times 10^{18}$ $cm^3$, and the oxygen concentration $O_C$ in the c-plane was $1 \times 10^{15}/cm^3$. The silicon-to-oxygen ratio (Si/O ratio) (q) in the c-plane was $10^3$. The amount of oxygen absorbed was small because of the c-plane growth. The resistivity r was $9 \times 10^{-3}$ Ωcm. That is, the substrates had low resistivity r and were satisfactorily conductive. Silicon was the main donor responsible for releasing n-type carriers (conduction electrons). The cracking ratio K was 13%, which is low. The bow U was 3.5 in, indicating that the bow was satisfactorily small. Thus, these were superior conductive GaN substrates. In this way, a dot mask having a large dot spacing (w=5,000 μm) can be used to form a highly conductive GaN substrate having a similar structure.

According to the results of the samples using a dot mask, namely, Samples 19 to 24, an excellent GaN substrate having a predetermined structure can be formed with low cracking ratio and little bow if the dot mask spacing w is 500 to 5,000 μm. According to the results of Samples 22 to 24, the cracking ratio tends to increase as the dot mask spacing w is increased. A larger dot mask spacing w is preferred for lesser spatial constraints on the fabrication of devices on the substrate.

Even if the dot mask spacing w is 10,000 μm, the cracking ratio is acceptable. As for the lower limit, a GaN substrate with superior properties can be formed even if the dot mask spacing w is 250 μm. In view of the substrate properties, a GaN substrate crystal having conductivity, low cracking ratio, and little bow can be produced over a wide range of dot mask spacing w, namely, about 250 to 10,000 μm.

Whereas Samples 1 to 24, described above, are crystal substrates grown at a higher growth temperature Tq, namely, 1,100° C., Samples 25 to 45, described below, are crystals grown at a lower growth temperature Tq, namely, 1,050° C. or lower. A crystal grown at 1,050° C. has a surface with a concavity and convexity of ridges and valleys (stripe mask) or a concavity of conical pits. The concavo-convex surface has numerous inclined facets exposed therein. This is type II. The flat faces are the c-plane, and the inclined faces are facets. Type II has anisotropy in oxygen doping. For type II, the facets are doped with a large amount of oxygen. Accordingly, the oxygen concentration $O_F$ in the facets differs from the oxygen concentration $O_C$ in the c-plane. Therefore, both the oxygen concentration $O_F$ in the facets and the oxygen concentration $O_C$ in the c-plane were measured. As a result, the oxygen concentration in the facets was higher than the oxygen concentration in the c-plane ($O_F > O_C$). Similarly, the silicon concentration was measured both in the facets and the flat c-plane faces. As a result, no selectivity was found between the silicon concentration in the c-plane and the silicon concentration in the f-plane.

Sample 25 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH₃ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a serrated structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}$/cm³. The silicon-to-oxygen ratio (Si/O ratio) (q) in the c-plane was $10^3$. The silicon concentration $Si_F$ in the f-plane was $1 \times 10^{18}$ cm$^{-3}$, and the oxygen concentration $O_F$ in the f-plane was $1 \times 10^{18}$ cm$^{-3}$. The silicon-to-oxygen ratio (Si/O ratio) (g) in the f-plane was 1. The amount of oxygen absorbed was small in the c-plane and was large in the f-plane. Thus, the amount of oxygen absorbed differed significantly between the c-plane and the f-plane, showing strong anisotropy. On the other hand, the c-plane and the f-plane were nearly equally doped with silicon and had no difference in the amount of silicon absorbed. Thus, oxygen has selectivity between the c-plane and the f-plane, whereas silicon has no such selectivity. For Sample 25, the oxygen concentration and the silicon concentration were nearly equal in the f-plane. The resistivity r was $8 \times 10^{-3}$ Ωcm and was equal in the f-plane and the c-plane. That is, the substrates had low resistivity r and were uniformly conductive. Silicon was the main donor responsible for releasing n-type carriers (conduction electrons) in the c-plane, whereas oxygen and silicon contributed equally thereto in the f-plane. The cracking ratio K was 6%, which is very low. The bow U was 6.5 m, indicating that the bow was small. Thus, these were superior conductive GaN substrates. In this way, a uniformly conductive substrate crystal having the same resistivity in the f-plane and the c-plane can be formed by doping a type II crystal having a superimposed mountain range structure with oxygen through the f-plane and silicon through the c-plane so as to complementarily supply carriers.

Sample 26 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH₃ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a serrated structure in which ridges and valleys alternated. That is, the surface was a mixture of the c-plane and the f-plane. The silicon concentration $Si_C$ in the c-plane was $4 \times 10^{18}$ cm$^{-3}$, and the oxygen concentration $O_C$ in the c-plane was $1 \times 10^{15}$/cm³. The silicon-to-oxygen ratio (Si/O ratio) (q) in the c-plane was $4 \times 10^3$. The silicon concentration $Si_F$ in the f-plane was $4 \times 10^{18}$ cm$^{-3}$, and the oxygen concentration $O_F$ in the f-plane was $1 \times 10^{18}$/cm³. The silicon-to-oxygen ratio (Si/O ratio) (g) in the f-plane was 4. The amount of oxygen absorbed was small in the c-plane and was large in the f-plane. Thus, the amount of oxygen absorbed differed significantly between the c-plane and the f-plane, showing strong anisotropy. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $6 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 8%, which is low. The bow U was 6.3 m, indicating that the bow was small. In this way, a type II crystal having a mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 27 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH₃ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a serrated structure in which ridges and valleys alternated. That is, the surface was a mixture of the c-plane and the f-plane. The silicon concentration $Si_C$ in the c-plane was $7 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $7 \times 10^3$. The silicon concentration $Si_F$ in the f-plane was $7 \times 10^{18}$ cm$^{-3}$, and the oxygen concentration $O_F$ in the f-plane was $1 \times 10^{18}$/cm$^3$. The silicon-to-oxygen ratio (Si/O ratio) (g) in the f-plane was 7. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $4 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 11%, which is low. The bow U was 6.2 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 28 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{19}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^4$. The silicon concentration $Si_F$ in the f-plane was $1 \times 10^{19}$ cm$^{-3}$, and the oxygen concentration $O_F$ in the f-plane was $1 \times 10^{18}$/cm$^3$. The silicon-to-oxygen ratio (Si/O ratio) (g) in the f-plane was 10. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $2 \times 10^{-3}$ Ωcm and was equal in the f-plane and the c-plane. That is, the substrates had extremely low resistivity r and were uniformly conductive. Silicon was the main donor responsible for releasing n-type carriers (conduction electrons) both in the c-plane and in the f-plane. The cracking ratio K was 12%, which is low. The bow U was 6 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 29 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^3$. The silicon concentration $Si_F$ in the f-plane was $1 \times 10^{18}$ cm$^{-3}$, and the oxygen concentration $O_F$ in the f-plane was $5 \times 10^{16}$/cm$^3$. The silicon-to-oxygen ratio (Si/O ratio) (g) in the f-plane was 20. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $8 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 5%, which is extremely low. The bow U was 6.4 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 30 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}/cm^3$. The silicon-to-oxygen ratio (Si/O ratio) (q) in the c-plane was $10^3$. The silicon concentration $Si_F$ in the f-plane was $1 \times 10^{18}$ cm$^{-3}$, and the oxygen concentration $O_F$ in the f-plane was $1 \times 10^{17}/cm^3$. The silicon-to-oxygen ratio (Si/O ratio) (g) in the f-plane was 10. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $7.9 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 5%, which is extremely low. The bow U was 6.3 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 31 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}/cm^3$. The silicon-to-oxygen ratio (Si/O ratio) (q) in the c-plane was $10^3$. The silicon concentration Sip in the f-plane was $1 \times 10^{18}$ cm$^{-3}$, and the oxygen concentration $O_F$ in the f-plane was $5 \times 10^{17}/cm^3$. The silicon-to-oxygen ratio (Si/O ratio) (g) in the f-plane was 2. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $7.5 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 6%, which is very low. The bow U was 6.2 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 32 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}/cm^3$. The silicon-to-oxygen ratio (Si/O ratio) (q) in the c-plane was $10^3$. The silicon concentration $Si_F$ in the f-plane was $1 \times 10^{18}$ cm$^{-3}$, and the oxygen concentration $O_F$ in the f-plane was $5 \times 10^{18}/cm^3$. The silicon-to-oxygen ratio (Si/O ratio) (g) in the f-plane was 0.2. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $7.5 \times 10^{-3}$ Ωcm and was equal in the f-plane and the c-plane. That is, the substrates had low resistivity r and were uniformly conductive. Silicon was the main donor responsible for releasing n-type carriers (conduction electrons) in the c-plane, whereas oxygen was the main donor in the f-plane. The cracking ratio K was 7%, which is low. The bow U was 6 m, indicating that the bow was small. In this way, a type II crystal having a parallel mountain range structure can be nearly equally doped with silicon through the f-plane and the c-plane to supply n-type carriers so that it has the same resistivity in the f-plane and the c-plane. Thus, a uniformly conductive substrate crystal can be formed.

Sample 33 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration $Si_C$ in the c-plane was $1 \times 10^{18}$ cm$^{-3}$, and the oxygen concentration $O_C$ in the c-plane was $1 \times 10^{15}/cm^3$. The silicon-to-oxygen ratio (Si/O ratio) (q) in the c-plane was $10^3$. The silicon concentration $Si_F$ in the f-plane was $1 \times 10^{18}$ cm$^{-3}$, and the oxygen concentration $O_F$ in the f-plane was $1 \times 10^{19}/cm^3$. The silicon-to-oxygen ratio (Si/O ratio) (g) in the f-plane was 0.1. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $2 \times 10^{-3}$ Ωcm and was substantially equal in the f-plane and the c-plane. That is, the substrates had extremely low resistivity r and were uniformly conductive. Silicon was the main donor responsible for releasing n-type carriers (conduction electrons) in the c-plane, whereas oxygen was the main donor in the f-plane. The cracking ratio K was 10%, which is low. The bow U was 5.8 m, indicating that the bow was small. In this way, a type II crystal having a parallel mountain range structure can be nearly equally doped with silicon through the f-plane and the c-plane and can be predominantly doped with oxygen through the f-plane so that the crystal is conductive both in the f-plane and in the c-plane.

Sample 34 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $4 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $4 \times 10^3$. The silicon concentration Si$_F$ in the f-plane was $4 \times 10^{18}$ cm$^{-3}$, and the oxygen concentration O$_F$ in the f-plane was $1 \times 10^{19}$/cm$^3$. The silicon-to-oxygen ratio (Si/O ratio) (g) in the f-plane was 0.4. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $1.9 \times 10^{-3}$ Ωcm and was equal in the f-plane and the c-plane. That is, the substrates had remarkably low resistivity r and were uniformly conductive. Silicon was the main donor responsible for releasing n-type carriers (conduction electrons) in the c-plane, whereas oxygen was the main donor in the f-plane. The cracking ratio K was 11%, which is low. The bow U was 5.5 m, indicating that the bow was small. In this way, a type II crystal having a parallel mountain range structure can be nearly equally doped with silicon through the f-plane and the c-plane and can be heavily doped with oxygen through the f-plane to form a substrate crystal highly conductive both in the c-plane and in the f-plane.

Sample 35 (Invention Example; Stripe; Type II)

A stripe mask having a stripe mask core spacing w of 500 μm and a mask width s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $7 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $7 \times 10^3$. The silicon concentration Si$_F$ in the f-plane was $7 \times 10^{18}$ cm$^{-3}$, and the oxygen concentration O$_F$ in the f-plane was $1 \times 10^{19}$/cm$^3$. The silicon-to-oxygen ratio (Si/O ratio) (g) in the f-plane was 0.7. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $1.8 \times 10^{-3}$ Ωcm and was equal in the f-plane and the c-plane. That is, the substrates had remarkably low resistivity r and were uniformly conductive. Silicon was the main donor responsible for releasing n-type carriers (conduction electrons) in the c-plane, whereas oxygen was the main donor in the f-plane. The cracking ratio K was 14%, which is satisfactorily low. The bow U was 5 m, indicating that the bow was small. In this way, a type II crystal having a parallel mountain range structure can be nearly equally doped with silicon through the f-plane and the c-plane and can be heavily doped with oxygen through the f-plane to form a substrate crystal highly conductive both in the c-plane and in the f-plane.

Sample 36 (Invention Example; Stripe; Type II)

A stripe mask having a stripe mask core spacing w of 500 μm and a mask width s of 50 μM was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $1 \times 10^{19}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^4$. The silicon concentration Sip in the f-plane was $1 \times 10^{19}$ cm$^{-3}$, and the oxygen concentration O$_F$ in the f-plane was $1 \times 10^{19}$/cm$^3$. The silicon-to-oxygen ratio (Si/O ratio) (g) in the f-plane was 1. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $1.5 \times 10^{-3}$ Ωcm and was equal in the f-plane and the c-plane. Heavily doped with both oxygen and silicon, the substrates had remarkably low resistivity r and were uniformly conductive. Silicon was the main donor responsible for releasing n-type carriers (conduction electrons) in the c-plane, whereas oxygen and silicon were the main donors in the f-plane. The cracking ratio K was 18%, which is satisfactorily low. The bow U was 4.8 m, indicating that the bow was fairly small. In this way, a type II crystal having a parallel mountain range structure can be nearly equally doped with silicon through the f-plane and the c-plane and can be heavily doped with oxygen through the f-plane to form a substrate crystal highly conductive both in the c-plane and in the f-plane.

Samples 25 to 36, described above, are type II crystals formed on stripe masks. The present invention can also be applied to form a similar type II crystal on a dot mask formed on an underlying substrate. Samples 37 to 39 are type II crystals formed on dot masks.

Sample 37 (Invention Example; Dot; Type II)

A dot mask having a dot mask core spacing w of 500 μm and a dot diameter s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $1 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $10^3$. The silicon concentration Si$_F$ in the f-plane was $1 \times 10^{18}$ cm$^{-3}$, and the oxygen concentration O$_F$ in the f-plane was $1 \times 10^{18}$/cm$^3$. The silicon-to-oxygen ratio (Si/O ratio) (g) in the f-plane was 1. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $8 \times 10^{-3}$ Ωcm and was equal in the f-plane and the c-plane. That is, the substrates had low resistivity r and were uniformly conductive. Silicon was the main donor responsible for releasing n-type carriers (conduction electrons) in the c-plane, whereas oxygen and silicon were the main donors in the f-plane. The cracking ratio K was 3%, which is extremely low. The bow U was 5 m, indicating that the bow was fairly small. In this way, a type II crystal having numerous isolated defect cluster regions H at regular intervals can be nearly equally doped with silicon through the f-plane and the c-plane and can be more heavily doped with oxygen through the f-plane to form a substrate crystal highly conductive both in the c-plane and in the f-plane.

Sample 38 (Invention Example; Dot; Type II)

A dot mask having a dot mask core spacing w of 500 μm and a dot diameter s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $4 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $4 \times 10^3$. The silicon concentration Si$_F$ in the f-plane was $4 \times 10^{18}$ cm$^{-3}$, and the oxygen concentration O$_F$ in the f-plane was $1 \times 10^{18}$/cm$^3$. The silicon-to-oxygen ratio (Si/O ratio) (g) in the f-plane was 4. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $6.3 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 5%, which is extremely low. The bow U was 4.6 m, indicating that the bow was fairly small. In this way, a type II crystal having numerous isolated defect cluster regions H at regular intervals can be nearly equally doped with silicon through the f-plane and the c-plane and can be more heavily doped with oxygen through the f-plane to form a substrate crystal highly conductive both in the c-plane and in the f-plane.

Sample 39 (Invention Example; Dot; Type II)

A dot mask having a dot mask core spacing w of 500 μm and a dot diameter s of 50 μm was formed on 2 inch (50 mm) diameter circular GaAs substrates. After a buffer layer was formed on the substrates, an epitaxial layer was grown thereon. The epitaxial growth temperature Tq was 1,050° C., the NH$_3$ partial pressure P$_{NH3}$ was 10 kPa (0.1 atm), and the GaCl partial pressure P$_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The type of core crystal was the inverted layer J. The type of crystal surface was type II, which was formed because the growth temperature Tq was low (1,050° C.). Because this was type II, the surface included facets and flat c-plane faces and had a mountain range structure in which ridges and valleys alternated. That is, the surface was a mixture of the c-plane and the f-plane. The silicon concentration Si$_C$ in the c-plane was $7 \times 10^{18}$ cm$^{-3}$, and the oxygen concentration O$_C$ in the c-plane was $1 \times 10^{15}$/cm$^3$. The silicon-to-oxygen ratio (Si/O ratio) (q) in the c-plane was $7 \times 10^3$. The silicon concentration Si$_F$ in the f-plane was $7 \times 10^{18}$ cm$^{-3}$, and the oxygen concentration O$_F$ in the f-plane was $1 \times 10^{18}$/cm$^3$. The silicon-to-oxygen ratio (Si/O ratio) (g) in the f-plane was 7. The amount of oxygen absorbed was small in the c-plane and was large in the f-plane. On the other hand, the c-plane and the f-plane were nearly equally doped with silicon and had no difference in the amount of silicon absorbed. Thus, oxygen has selectivity between the c-plane and the f-plane, whereas silicon has no selectivity between the c-plane and the f-plane. The resistivity r was $4 \times 10^{-3}$ Ωcm and was equal in the f-plane and the c-plane. That is, the substrates had low resistivity r and were uniformly conductive. Silicon was the main donor responsible for releasing n-type carriers (conduction electrons) both in the c-plane and in the f-plane. The cracking ratio K was 6%, which is extremely low. The bow U was 4.2 m, indicating that the bow was fairly small. In this way, a type II crystal having numerous isolated defect cluster regions H at regular intervals can be nearly equally doped with silicon through the f-plane and the c-plane and can be more heavily doped with oxygen through the f-plane to form a substrate crystal highly conductive both in the c-plane and in the f-plane.

Sample 40 (Comparative Example; No Mask; C-Plane Growth)

After a buffer layer was formed on 2 inch (50 mm) diameter circular GaAs substrates without forming a mask, an epitaxial layer was grown thereon. This is not an invention example, but a comparative example, because no mask was formed. This comparative example is not a known example. The epitaxial growth temperature Tq was 1,050° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. No core was present because no mask was formed. A flat surface was formed by c-plane growth. The surface was neither type I nor type II, but was a uniform c-plane surface in which no f-plane was present. The silicon concentration $Si_C$ in the c-plane was $1 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^3$. The resistivity r was 0.01 Ωcm. That is, the substrates had high resistivity r and were insufficiently conductive. Silicon was the main donor responsible for releasing n-type carriers (conduction electrons). The cracking ratio K was 75%, which is extremely high. The bow U was 1.5 m, indicating that the bow was very large. Because these substrates have high cracking ratio and large bow, they cannot be used as a substrate on which devices are to be fabricated.

Sample 41 (Comparative Example; No Mask; C-Plane Growth)

After a buffer layer was formed on 2 inch (50 mm) diameter circular GaAs substrates without forming a mask, an epitaxial layer was grown thereon. This is not an invention example, but a comparative example, because no mask was formed. This comparative example is not a known example. The epitaxial growth temperature Tq was 1,050° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. No core was present because no mask was formed. A flat surface was formed by c-plane growth. The surface was neither type I nor type II, but was a uniform c-plane surface in which no f-plane was present. The silicon concentration $Si_C$ in the c-plane was $1 \times 10^{19}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^4$. The resistivity r was $4.7 \times 10^{-3}$ Ωcm. That is, the substrates had low resistivity r and were satisfactorily conductive. Silicon was the main donor responsible for releasing n-type carriers (conduction electrons). The cracking ratio K was 88%, which is extremely high. The bow U was 1.2 m, indicating that the bow was extremely large. Because these substrates have high cracking ratio and large bow, they cannot be used as a substrate on which devices are to be fabricated.

Sample 42 (Comparative Example; No Mask; C-Plane Growth)

After a buffer layer was formed on 2 inch (50 mm) diameter circular GaAs substrates without forming a mask, an epitaxial layer was grown thereon. This is not an invention example, but a comparative example, because no mask was formed. This comparative example is not a known example. The epitaxial growth temperature Tq was 1,030° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. No core was present because no mask was formed. A flat surface was formed by c-plane growth. The surface was neither type I nor type II, but was a uniform c-plane surface in which no f-plane was present. The silicon concentration $Si_C$ in the c-plane was $1 \times 10^{18}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^3$. The resistivity r was 0.01 Ωcm, which is high. Silicon was the main donor responsible for releasing n-type carriers (conduction electrons). The cracking ratio K was 92%, which is extremely high. The bow U was 1.3 m, indicating that the bow was extremely large. Because these substrates have high cracking ratio and large bow, they cannot be used as a substrate on which devices are to be fabricated.

Sample 43 (Comparative Example; No Mask; C-Plane Growth)

After a buffer layer was formed on 2 inch (50 mm) diameter circular GaAs substrates without forming a mask, an epitaxial layer was grown thereon. This is not an invention example, but a comparative example, because no mask was formed. This comparative example is not a known example. The epitaxial growth temperature Tq was 1,030° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. No core was present because no mask was formed. A flat surface was formed by c-plane growth. The surface was neither type I nor type II, but was a uniform c-plane surface in which no f-plane was present. The silicon concentration $Si_C$ in the c-plane was $1 \times 10^{19}$ cm$^{-3}$, and the oxygen concentration $O_C$ in the c-plane was $1 \times 10^{15}$/cm$^3$. The silicon-to-oxygen ratio (Si/O ratio) (q) in the c-plane was $10^4$. The resistivity r was $4.7 \times 10^{-3}$ Ωcm, which is low. Silicon was the main donor responsible for releasing n-type carriers (conduction electrons). The cracking ratio K was 90%, which is extremely high. The bow U was 1 m, indicating that the bow was extremely large. Because these substrates have high cracking ratio and large bow, they cannot be used as a substrate on which devices are to be fabricated.

Sample 44 (Comparative Example; Stripe; Type II)

A stripe mask having a stripe mask spacing w of 500 μm, a stripe width s of 50 μm, and a pitch of 550 μm was formed on 2 inch (50 mm) diameter circular GaAs substrates. After a buffer layer was formed on the substrates, the supply of $SiH_4$ gas was interrupted, and a GaN layer was epitaxially grown thereon. This is not an invention example because the silicon source gas was not supplied. This comparative example is not a known example. The epitaxial growth temperature Tq was 1,050° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. These substrates had a periodic structure with the same period as the mask. The type of the crystals on the cores was the inverted layer J. The crystal type was type II. The silicon concentration $Si_C$ in the c-plane was $1 \times 10^{16}$ $cm^{-3}$, and the oxygen concentration $O_C$ in the c-plane was $1 \times 10^{15}/cm^3$. The silicon-to-oxygen ratio (Si/O ratio) (q) in the c-plane was 10. The resistivity r was high in the c-plane. The silicon concentration $Si_F$ in the f-plane was $1 \times 10^{16}$ $cm^{-3}$, and the oxygen concentration $O_F$ in the f-plane was $4 \times 10^{18}/cm^3$. The silicon-to-oxygen ratio (Si/O ratio) (g) in the f-plane was 1/400. Because silicon was contained in a concentration of $1 \times 10^{16}$ $cm^{-3}$ despite the fact that no silicon source material was supplied, silicon remaining in the furnace might have been absorbed into the crystal, or the above concentration might have been the detection limit of silicon. These substrates were not conductive, but semi-insulating. The cracking ratio K was 30%, which is low. The bow U was 7 m, indicating that the bow was small. Because these substrates have high resistivity, they cannot be used as a conductive substrate.

Sample 45 (Comparative Example; Stripe; Type II)

A stripe mask having a stripe mask spacing w of 500 μm, a stripe width s of 50 and a pitch of 550 μm was formed on 2 inch (50 mm) diameter circular GaAs substrates. After a buffer layer was formed on the substrates, the supply of $SiH_4$ gas was interrupted, and a GaN layer was epitaxially grown thereon. This is not an invention example because the silicon source gas was not supplied. This comparative example is not a known example. The epitaxial growth temperature Tq was 1,050° C., the $NH_3$ partial pressure $P_{NH3}$ was 10 kPa (0.1 atm), and the GaCl partial pressure $P_{GaCl}$ was 4 kPa (0.04 atm). The epitaxial layer was grown to a thickness of 400 μm or more.

The V/III ratio b was 2.5. The GaAs substrates were removed by machining, thus obtaining free-standing GaN substrates having a thickness of 400 μm. The crystal regions had a periodic structure with the same period as the mask. The type of the crystals on the cores was the inverted layer J. The portions above the unmasked regions included the low-dislocation-density single-crystal regions Z and the c-plane growth regions Y, thus having the ZYZ structure. The crystal type was type II. The silicon concentration $Si_C$ in the c-plane was $1 \times 10^{16}$ $cm^{-3}$, and the oxygen concentration $O_C$ in the c-plane was $1 \times 10^{15}/cm^3$. The silicon-to-oxygen ratio (Si/O ratio) (q) in the c-plane was 10. The resistivity r was high in the c-plane. The silicon concentration $Si_F$ in the f-plane was $1 \times 10^{16}$ $cm^{-3}$, and the oxygen concentration $O_F$ in the f-plane was $8 \times 10^{18}/cm^3$. The silicon-to-oxygen ratio (Si/O ratio) (g) in the f-plane was 1/800. Because silicon was contained in a concentration of $1 \times 10^{16}$ $cm^{-3}$ despite the fact that no silicon source material was supplied, silicon remaining in the furnace might have been absorbed into the crystal, or the above concentration might have been the detection limit of silicon. These substrates were not conductive, but semi-insulating. The cracking ratio K was 36%, which is low. The bow U was 6.8 m, indicating that the bow was small. Because these substrates have high resistivity in the c-plane, they cannot be used as a conductive substrate.

The growth temperatures (substrate temperatures) and the V/III ratios b of the examples in the cited patent documents have been mentioned in the description of the related art and are indicated by the black dots and the circled black dots in FIG. 22. Similarly, the substrate temperatures and the V/III ratios b of the invention examples and the comparative examples are shown in FIG. 22 to clarify the growth conditions unique to the present invention.

The points at the temperatures and the V/III ratios b of the type II crystals of the present invention are indicated by the white triangles. There are 15 white triangles at a temperature of 1,050° C. and a V/III ratio b of 2.5.

The points at the temperatures and the V/III ratios b of the type I crystals of the present invention are indicated by the white circles. There are 22 white circles at a temperature of 1,100° C. and a V/III ratio b of 2.5, one white circle at a temperature of 1,100° C. and a V/III ratio b of 3, and one white circle at a temperature of 1,100° C. and a V/III ratio b of 1.

The ranges of substrate temperature and V/III ratio b of the present invention are surrounded by the broken line, where 1,080° C. is a temperature at which the intermediate mixed type is formed.

Figure 23:
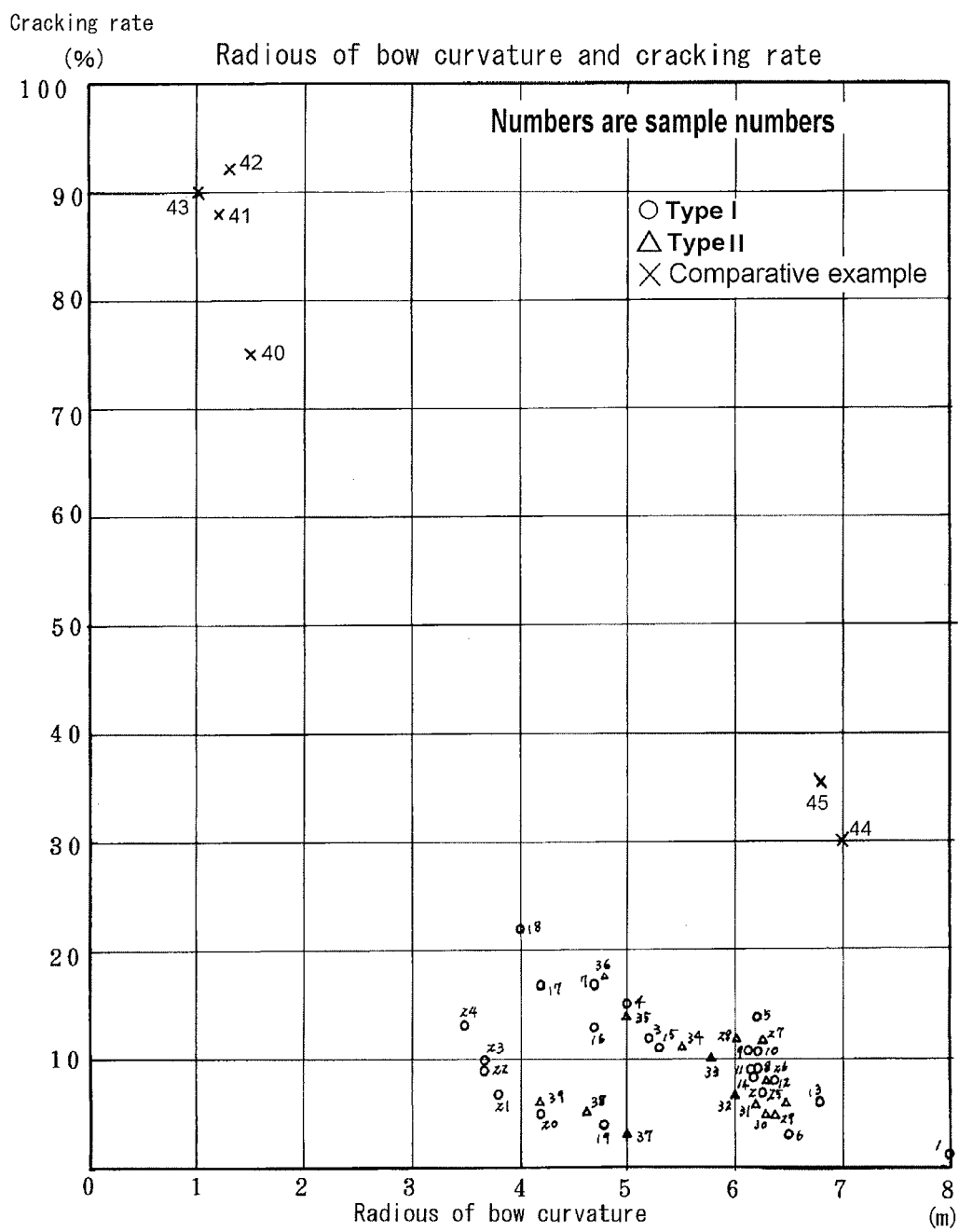
FIG. 23 is a graph showing the radii of bow curvature (m) of invention examples and comparative examples, namely, Samples 1 to 45, along the horizontal axis and the cracking ratios (%) thereof along the vertical axis, where the numbers are the sample numbers, the white circles indicate type I, the white triangles indicate type II, and the multiplication signs indicate the comparative examples, which are not known examples.

FIG. 23 shows the radii of bow curvature (m) and the cracking ratios (%) of Samples 1 to 45 in a two-dimensional coordinate system, where the horizontal axis indicates the radius of bow curvature (m) and the vertical axis indicates the cracking ratio (%). The numbers are the sample numbers. Type I is indicated by the white circles. Sample 1 was the best sample, having a bow U of 8 m and a cracking ratio K of 1%. The bow U was 3.5 m for Sample 24 and was 3.7 m for Samples 22 and 23. For type I, the bow U ranged from 3.5 to 8 m. The cracking ratio K was 22% for Sample 18. For type I, the cracking ratio K ranged from 1% to 22%.

Type II is indicated by the white triangles. The bow U of Sample 39 was 4.2 m. For type II, the bow U ranged from about 4.2 to 6.5 m. The cracking ratio K was lower for type II than for type I. The cracking ratio K was 18% for Sample 36 and was 3% for Sample 37. For the invention examples, namely, Samples 1 to 39, the bow U was 3.5 m≦U≦8 m. For type II alone, the bow U was 4.2 m≦U≦6.5 m, and the cracking ratio K was 3%≦K≦18%. Thus, type II is superior to type I in terms of cracking ratio K and bow U, although they have no remarkable difference.

The comparative examples are indicated by the multiplication signs. Samples 40 to 43 had high cracking ratio and large bow. This shows that a crystal having superior mechanical properties, including little internal stress, low cracking ratio, and little bow, can be formed by facet growth using an underlying substrate on which a mask (masking portions) is formed. Samples 44 and 45 had small bow and low cracking ratio, although they are comparative examples because of the high resistivity.

Figure 27:
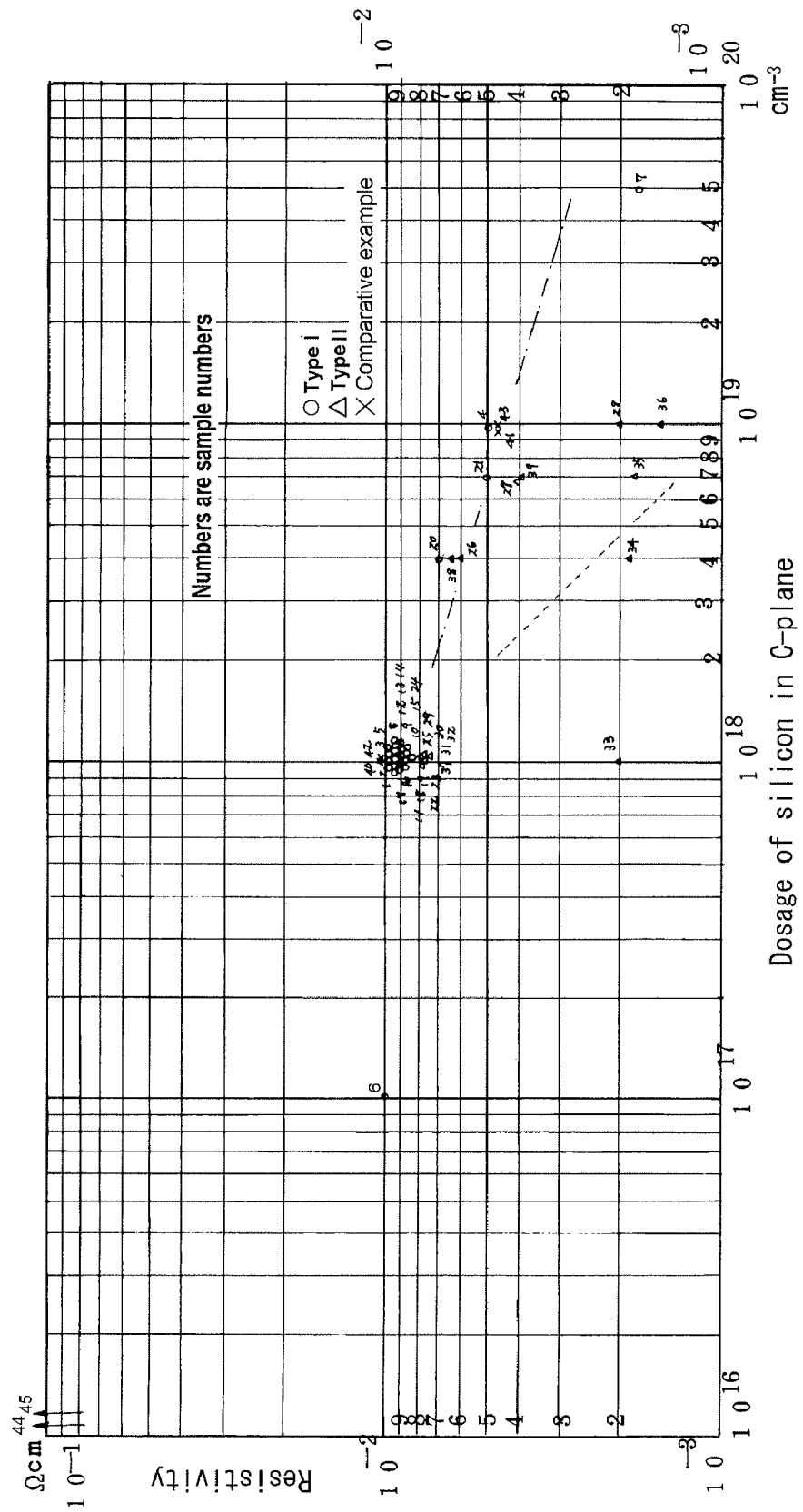
FIG. 27 is a graph showing the silicon concentrations ($cm^{-3}$) in the c-plane of the examples of GaN crystals grown in vapor phase disclosed herein, namely, Samples 1 to 45, along the horizontal axis in a logarithmic scale and the resistivities ($\Omega cm$) thereof along the vertical axis in a logarithmic scale, where the numbers are the sample numbers, the white circles indicate type I, the white triangles indicate type II, and the multiplication signs indicate the comparative examples.

FIG. 27 shows the dosages of silicon in the c-plane ($cm^{-3}$) and the surface resistivities (Ωcm) of the samples in a logarithmic scale in a two-dimensional coordinate system, where the white circles indicate type I, the white triangles indicate type II, the multiplication signs indicate the comparative examples, and the numbers are the sample numbers. Samples 1, 2, 3, 5, 8 to 19, and 22 to 24, which are type I, are plotted at a silicon concentration in the c-plane of $1 \times 10^{18}$ $cm^{-3}$ and a resistivity r of 0.009 Ωcm. The number of samples is 19. For type II, Samples 25, 29, 30, 31, 32, and 37 lie around the above coordinates. The total number of samples is 25. It is reasonable that the samples of type I having the same silicon concentration had the same resistivity because the resistivity was measured on the surfaces of the samples and the number of silicon atoms was counted on the surfaces of the samples using SIMS. This is because type I, which can absorb only silicon because the surface is the c-plane, is not subjected to the effect of oxygen near the surface. For type II (Samples 25, 29, 30, 31, and 37), which has the f-plane in the surface, the oxygen concentration in the f-plane (facets) was equal to the silicon concentration in the f-plane (Samples 25 and 37) or was lower than the silicon concentration in the f-plane (Samples 29, 30, and 31). Hence, if the silicon concentration in the c-plane (equal in the f-plane) is $1\times10^{18}$ cm$^{-3}$, the resistivity r is about 0.007 to 0.008 Ωcm. It is assumed that the slight differences from a resistivity r of 0.009 Ωcm resulted from oxygen doping in the f-plane.

Sample 32 had a resistivity r of 0.0075 Ωcm despite the fact that the oxygen concentration in the f-plane was $5\times10^{18}$ cm$^{-3}$, which was higher than the silicon concentration. This is probably due to a measurement error.

Because the resistivity should be inversely proportional to the carrier concentration, if the mobility is constant, coordinate points of silicon concentration and resistivity should lie along a line connecting the point at a silicon concentration of $1\times10^{18}$ cm$^{-3}$ and a resistivity r of 0.009 Ωcm and the point at a silicon concentration of $1\times10^{19}$ cm$^{-3}$ and a resistivity r of 0.0009 Ωcm (indicated by the broken line in FIG. 27) in the logarithmic graph. For type I, Samples 20, 21, 4, and 7 are located above the broken line. That is, the resistivity is not decreased (the conductivity is not increased) proportionally as the dosage of silicon is increased. This is probably because a higher dosage results in more scattering, thus decreasing the carrier mobility. For type II, the resistivity should be decreased by the contribution of oxygen. Nevertheless, Samples 26, 38, 27, and 39, which are type II, are located above the broken line. This is probably because the contribution of oxygen was weak since the oxygen concentration was lower than the silicon concentration.

The dosage of silicon of Sample 7, which is type I, was extremely high, namely, $5\times10^{19}$ cm$^{-3}$, and accordingly the resistivity r thereof was 0.0018 Ωcm. Thus, Sample 7 serves as an excellent substrate with high conductivity. The above dosage of silicon was the highest of all samples. Despite such a high dosage, Sample 7 had a bow U of 4.7 m and a cracking ratio K of 17%, which are both high but acceptable. Thus, Sample 7 was structurally maintained despite such a high dosage of silicon because the internal stress was reduced by the hybrid HZYZH . . . structure. That is, whereas a sample formed by c-plane growth so that it has a flat surface is impractical because the cracking ratio K is 100%, as disclosed in Patent Documents 2 and 3, a crystal of the present invention having a flat surface is structurally robust after being heavily doped with silicon because the crystal is a type I crystal formed by facet growth after forming masking portions so that a flat surface is finally formed. This was demonstrated by Sample 7, which is separated toward the right end in FIG. 27.

Sample 36, which is type II, had a silicon concentration of $1\times10^{19}$ cm$^{-3}$ and a resistivity r of 0.0015 Ωcm, which was the lowest of all samples. Accordingly, the conductivity was the highest. The oxygen concentration in the f-plane was $1\times10^{19}$ cm$^{-3}$. That is, both the oxygen concentration and the silicon concentration were high. The high conductivity, namely, σ=667/Ωcm, was the result of the high oxygen concentration and the high silicon concentration, where the conductivity σ is the reciprocal of resistivity, that is, $\sigma=r^{-1}$. Sample 36 had a cracking ratio K of 18% and a bow U of 4.8 m, which are rather inferior but acceptable.

The importance of oxygen for type II is well understood by comparing Samples 28 and 36. These samples had the same silicon concentration, namely, $1\times10^{19}$ cm$^{-3}$, but had different oxygen concentrations, namely, $1\times10^{18}$ cm$^{-3}$ for Sample 28 and $1\times10^{19}$ cm$^{-3}$ for Sample 36. It is assumed that the difference between the resistivity r of Sample 28, namely, 0.002 Ω cm, and the resistivity r of Sample 36, namely, 0.0015 Ωcm, is due to the difference in the amount of oxygen.

Sample 33 had a silicon concentration of $1\times10^{18}$ cm$^{-3}$ and a resistivity r of 0.002 Ωcm, which was about one fifth those of the 25 samples having the same silicon concentration (Samples 1, 2, 3 . . . ). This low resistivity is due to the effect of oxygen. That is, such a low resistivity was achieved because the oxygen concentration was $1\times10^{19}$ cm$^{-3}$, which was ten times the silicon concentration.

Sample 6 had the maximum resistivity r, namely, 0.01 Ω cm. This sample is type I and had a silicon concentration of $1\times10^{17}$ cm$^{-3}$. Because the silicon concentration was one tenth those of the above 25 samples having silicon concentrations around $1\times10^{18}$ cm$^{-3}$ (Samples 1, 2, 3 . . . ), the resistivity r should have been about 0.09 Ωcm; however, the measured resistivity r was 0.01 Ωcm. Because Sample 6 had a cracking ratio K of 3% and a radius of bow curvature U of 6.5 m, it should have had a low dosage of silicon. It is therefore assumed that the measured silicon concentration, namely, $1\times10^{17}$ cm$^{-3}$, is correct. The average silicon concentration might have been higher because of varying silicon concentrations because the silicon concentration was measured at one fixed point using SIMS. Alternatively, the resistivity measurement might have been erroneous. The range of resistivity r of the substrates of the present invention was $0.0015$ Ωcm$\leq r \leq 0.01$ Ωcm.

Figure 28:
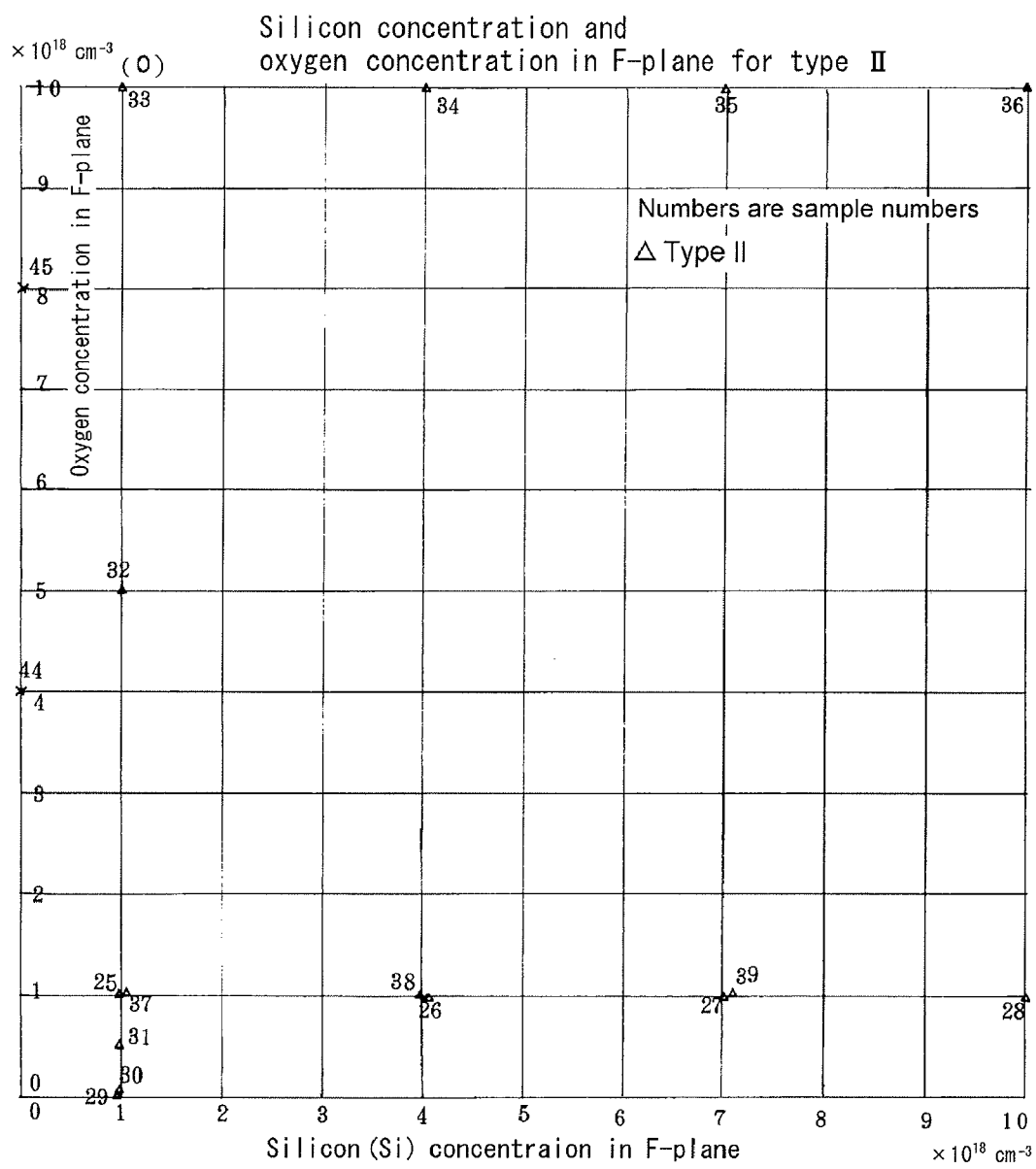
FIG. 28 is a graph showing the silicon concentrations ($cm^{-3}$) in the f-plane of the examples of type II GaN crystals grown in vapor phase disclosed herein, namely, Samples 25 to 39, along the horizontal axis and the oxygen concentrations ($cm^{-3}$) thereof in the f-plane along the vertical axis, where the white triangles indicate the points of the samples and the numbers are the sample numbers.

FIG. 28 is a graph showing the silicon concentrations (cm$^{-3}$) in the f-plane (facets) of the type II crystals, namely, Samples 25 to 39, along the horizontal axis and the oxygen concentrations (density) (cm$^{-3}$) thereof in the f-plane along the vertical axis, where Samples 25 to 39 are indicated by the white triangles.

For Samples 25, 37, and 36, which are located on a diagonal line, the silicon concentration in the f-plane was equal to the oxygen concentration in the f-plane. For Samples 25 and 37, the silicon and oxygen concentrations were both $1\times10^{18}$ cm$^{-3}$, and the resistivity r was $8\times10^{-3}$ Ωcm.

For Samples 31, 30, 29, 38, 26, 27, 39, and 28, which are located below the diagonal line, the silicon concentration in the f-plane was higher than the oxygen concentration in the f-plane ($Si_F > O_F$). For Samples 39 and 27, the silicon concentration was $7\times10^{18}$ cm$^{-3}$, the oxygen concentration was $1\times10^{18}$ cm$^{-3}$, and the resistivity r was $4\times10^{-3}$ Ωcm. These results suggest that a substrate whose silicon and oxygen concentrations are the same in the f-plane often have the same resistivity r. Samples 25, 37, 31, 30, and 29, which had a silicon concentration of $1\times10^{18}$ cm$^{-3}$, had oxygen concentrations of $1\times10^{18}$ cm$^{-3}$ or lower and resistivities r of $8\times10^{-3}$, $8\times10^{-3}$, $7.5\times10^{-3}$, $7.9\times10^{-3}$, and $8\times10^{-3}$ Ωcm, respectively. That is, the resistivity r was largely determined by the silicon concentration because the oxygen concentration was lower.

Samples 33, 34, 35, and 36, which had an oxygen concentration of $10\times10^{18}$ cm$^{-3}$, had low resistivities r, namely, $2\times10^{-3}$, $1.9\times10^{-3}$, $1.8\times10^{-3}$, and $1.5\times10^{-3}$ Ωcm, respectively. That is, the resistivity r was low (the conductivity was high) because of the high oxygen concentration. The differences in resistivity r are due to the differences in silicon concentration.

Samples 33, 34, 35, and 36 had silicon concentrations of $1\times10^{18}$, $4\times10^{18}$, $7\times10^{18}$, and $10\times10^{18}$ cm$^{-3}$, respectively. This demonstrates that the resistivity r is decreased as the silicon and oxygen concentrations are increased.

Samples having the same silicon concentration and different oxygen concentrations will now be compared. For Samples 36 and 28, the silicon concentration was $10\times10^{18}$ cm$^{-3}$, and the difference in oxygen concentration was ten times. The resistivities r of Samples 36 and 28 were $1.5\times10^{-3}$ and $2\times10^{-3}$ Ωcm, respectively, and the difference therebetween was 1.3 times. For Samples 35 and 27, the silicon concentration was $7\times10^{18}$ cm$^{-3}$, and the difference in oxygen concentration was ten times. The resistivities r of Samples 35 and 27 were $1.8\times10^{-3}$ and $4\times10^{-3}$ Ωcm, respectively, and the difference therebetween was 2.2 times. For Samples 33 and 25, the silicon concentration was $1\times10^{18}$ cm$^{-3}$, and the difference in oxygen concentration was ten times. The resistivities r of Samples 33 and 25 were $2\times10^{-3}$ and $8\times10^{-3}$ Ωcm, respectively, and the difference therebetween was four times. These results suggest that for type II, as the silicon and oxygen concentrations in the f-plane are increased, the resistivity r is decreased so as to be inversely proportional to the square roots of the silicon and oxygen concentrations, rather than linearly inversely proportional to the silicon and oxygen concentrations.

Figure 29:
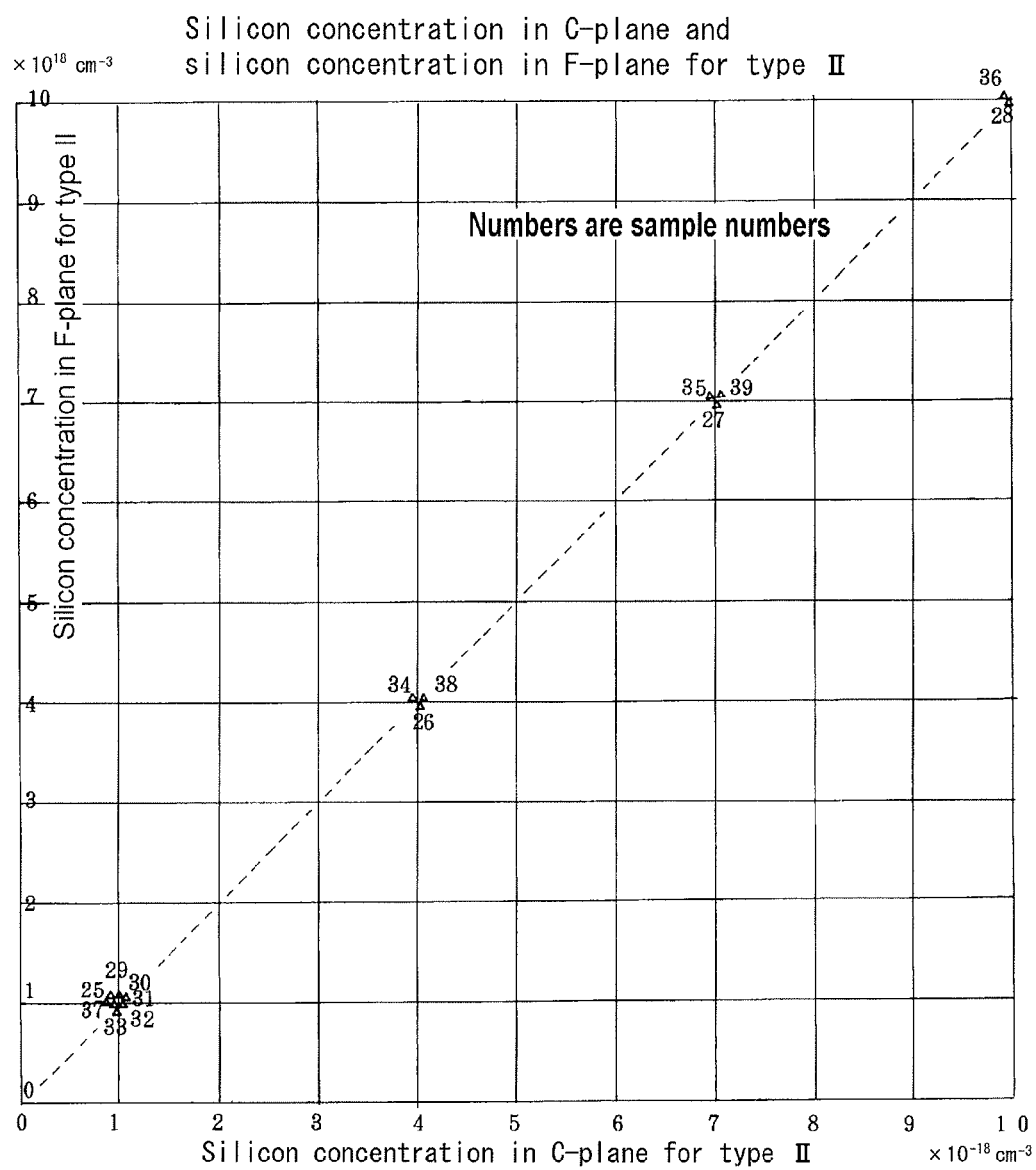
FIG. 29 is a graph showing the silicon concentrations ($cm^{-3}$) in the c-plane of the examples of type II GaN crystals grown in vapor phase disclosed herein, namely, Samples 25 to 39, along the horizontal axis and the silicon concentrations ($cm^{-3}$) thereof in the f-plane along the vertical axis, where the white triangles indicate the points of the samples and the numbers are the sample numbers.

FIG. 29 is a graph showing the silicon concentrations in the c-plane of the type II crystals, namely, Samples 25 to 39, along the horizontal axis and the silicon concentrations thereof in the f-plane along the vertical axis. For Samples 25, 29, 30, 31, 32, 33, and 37, the silicon concentration was $1\times10^{18}$ cm$^{-3}$ and was equal in the c-plane and the f-plane. For Samples 26, 34, and 38, the silicon concentration was $4\times10^{18}$ cm$^{-3}$ and was equal in the c-plane and the f-plane. For Samples 27, 35, and 39, the silicon concentration was $7\times10^{18}$ cm$^{-3}$ and was equal in the c-plane and the f-plane. For Samples 36 and 28, the silicon concentration was $10\times10^{18}$ cm$^{-3}$ and was equal in the c-plane and the f-plane. These coordinate points are located on the diagonal line at 45°, meaning that the same amount of silicon was absorbed into the c-plane and the f-plane, that is, $Si_F = Si_C$, which is equivalent to the equation $[Si]_z = [Si]_y$ described above. This demonstrates that silicon has no plane orientation dependence, in other words, no plane selectivity.

Figure 30:
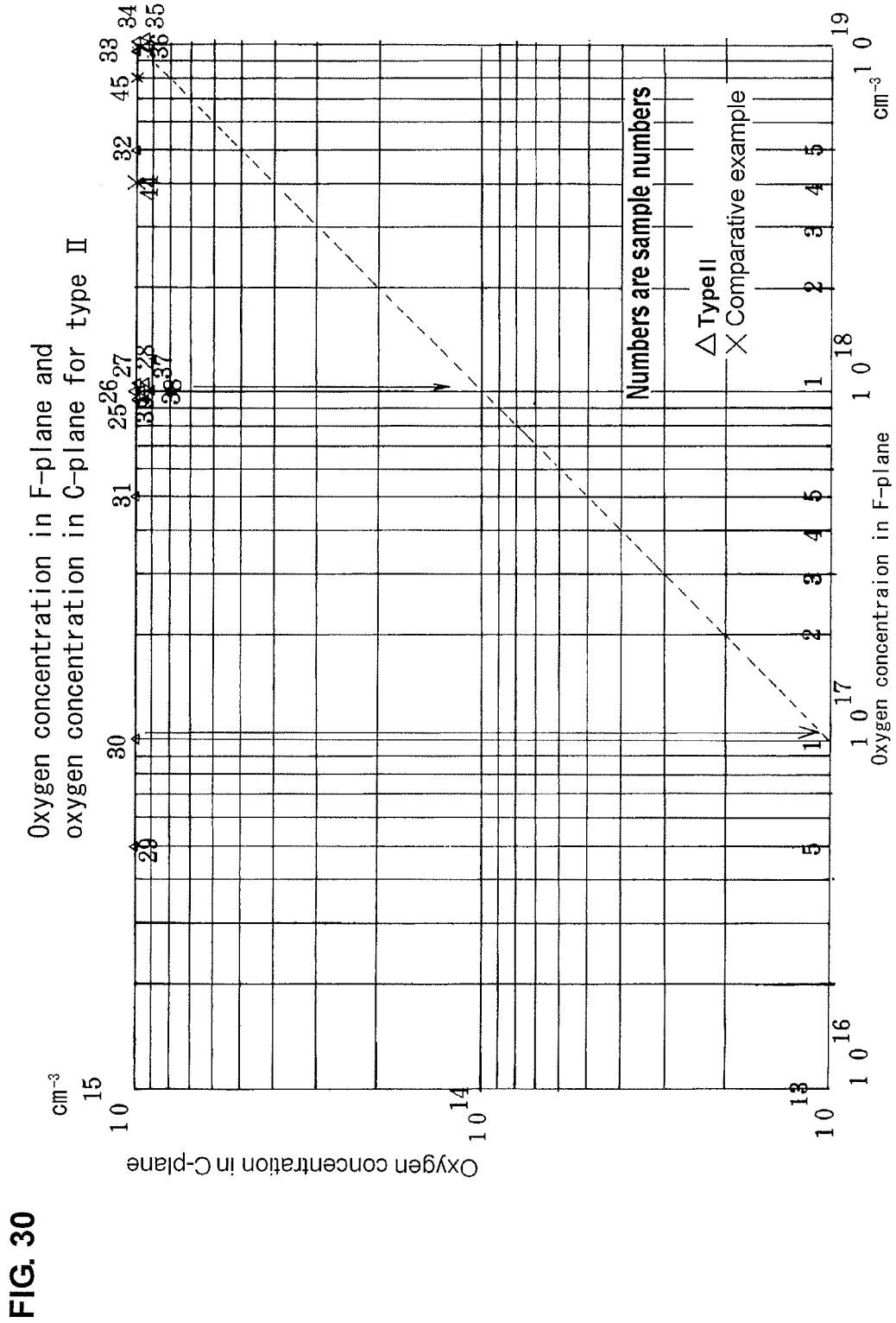
FIG. 30 is a graph showing the oxygen concentrations ($cm^{-3}$) in the f-plane of the examples of type II GaN crystals grown in vapor phase disclosed herein, namely, Samples 25 to 39, and Comparative Examples 44 and 45 along the horizontal axis in a logarithmic scale and the oxygen concentrations ($cm^{-3}$) thereof in the c-plane along the vertical axis in a logarithmic scale, where the numbers are the sample numbers, the white triangles indicate type II, and the multiplication signs indicate the comparative examples.

FIG. 30 is a graph showing the oxygen concentrations in the f-plane of the type II crystals, namely, Samples 25 to 39, along the horizontal axis and the oxygen concentrations thereof in the c-plane along the vertical axis. The horizontal axis indicates the oxygen concentration (cm$^{-3}$) in the f-plane. The vertical axis indicates the oxygen concentration (cm$^{-3}$) in the c-plane. For Samples 33, 34, 35, and 36, the oxygen concentration in the f-plane was $1\times10^{19}$ cm$^{-3}$, and the oxygen concentration in the c-plane was $1\times10^{15}$ cm$^{-3}$. For Samples 25, 26, 27, 28, and 37 to 39, the oxygen concentration in the f-plane was $1\times10^{18}$ cm$^{-3}$, and the oxygen concentration in the c-plane was $1\times10^{15}$ cm$^{-3}$. For Samples 29 and 30, the oxygen concentration in the f-plane was $5\times10^{16}$ cm$^{-3}$ for Sample 29 and $1\times10^{17}$ cm$^{-3}$ for Sample 30, and the oxygen concentration in the c-plane was $1\times10^{15}$ cm$^{-3}$. Because the c-plane and the f-plane were exposed to the same atmosphere, it appears unreasonable that the amount of oxygen absorbed into the c-plane was $1\times10^{15}$ cm$^{-3}$ for every sample despite the fact that the difference in the amount of oxygen absorbed into the f-plane was as large as 100 times or 200 times. The amount of oxygen absorbed into the c-plane is supposed to be proportional to the amount of oxygen absorbed into the f-plane.

It is assumed that the above oxygen concentration, namely, $1\times10^{15}$ cm$^{-3}$, was the oxygen detection limit of the SIMS used, that is, the SIMS read $1\times10^{15}$ cm$^{-3}$ for amounts of oxygen below $1\times10^{15}$ cm$^{-3}$. If an oxygen concentration in the f-plane of $1\times10^{19}$ cm$^3$ and an oxygen concentration in the c-plane of $1\times10^{15}$ cm$^{-3}$ are correct, the ratio is $10^4$ times. For the samples having the lower concentration in the f-plane, as indicated by the broken line at 45° in FIG. 30, the concentration in the c-plane should be located lower from the point of concentration in the f-plane, as indicated by the arrow. Specifically, because Samples 25, 26, 27, 28, and 37 to 39 had an oxygen concentration in the f-plane of $1\times10^{18}$ cm$^{-3}$, the oxygen concentration in the c-plane should have been $1\times10^{14}$ cm$^{-3}$, which was unknown because it was below the detection limit. That is, the oxygen concentrations in the c-plane shown in Table, which were all $1\times10^{15}$ cm$^{-3}$, are incorrect, and the actual oxygen concentrations in the c-plane could not be measured because they were below the detection limit. Accordingly, the oxygen concentration in the f-plane can be assumed to be zero. Thus, the oxygen concentration in the c-plane growth regions Y is zero, namely, $O_C = [O]_y = 0$.

Type II has four concentration parameters: the silicon concentration in the c-plane, the oxygen concentration in the c-plane, the silicon concentration in the f-plane, and the oxygen concentration in the f-plane. According to the above results, the oxygen concentration in the c-plane was zero ($O_C = 0$), and the silicon concentration in the c-plane was equal to the silicon concentration in the f-plane ($Si_C = Si_F$). That is, there are two free parameters: the oxygen concentration in the f-plane ($O_F = [O]_z$) and the common silicon concentration ($Si_F = [Si]_z = Si_C = [Si]_y$), which are simply written as [O] and [Si], respectively. For type I, [Si] is the only parameter because the surface is the c-plane, which corresponds to the fact that Samples 1, 2, 3, 5, 8 to 19, and 22 to 24, indicated by the white circles in FIG. 27, are located at the point of a silicon concentration of $1\times10^{18}$ cm$^{-3}$ and a resistivity r of $9\times10^{-3}$ Ω cm. Samples 20, 21, 4, and 7 are type I and had higher silicon concentrations and lower resistivities r. If these points are approximated by a straight line passing through the point of a silicon concentration of $1\times10^{18}$ cm$^{-3}$ and a resistivity r of $9\times10^{-3}$ Ωcm, the one-dot chain line passing through the point of a silicon concentration of $1\times10^{19}$ cm$^{-3}$ and a resistivity r of $4.4\times10^{-3}$ Skin is obtained. If the relationship between the resistivity r and the silicon concentration is determined by the straight line passing through the above two points, the following approximate equation can be obtained for type I:

$$\log r = 3.55 - 0.311 \log [Si]$$

If the unit of resistivity is $1\times10^{-3}$ Ωcm and is denoted by r', $r = r' \times 10^{-3}$. If the unit of silicon concentration is $1\times10^{18}$ cm$^{-3}$ and is denoted by Si', $[Si'] \times 10^{18} = [Si]$. For type I, the relationship between the resistivity r' and the silicon concentration Si' is as follows:

$$\log r' = -0.311 \log [Si'] + 0.954$$

This is the approximate equation of the broken line in FIG. 27. Sample 7 (r'=1.8, Si'=50) and Sample 6 (r'=10, Si'=0.1) deviate downward from the line. These samples can be included if the constant term is +0.689 or more. Sample 20 (r'=7, Si'=4) and Sample 4 (r'=4.7, Si'=10) deviate downward from the line. These samples can be included if the constant term is 1.032 or less. That is, all samples of type I can be included by the following equation:

$$0.689 \leq \log r' + 0.311 \log [Si'] \leq 1.032$$

The resistivity r' is inversely proportional to the silicon concentration raised to the power of 0.311, rather than linearly inversely proportional to the silicon concentration. It is unknown why the resistivity r' is not inversely proportional to the first power of the silicon concentration. This may be due to a decrease in electron mobility as a result of an increase in silicon concentration, although it remains unclear. Still, the case of type I is simpler because only silicon is present on the surface.

The case of Type II is more complicated. In FIG. 27, the samples of type II (white triangles) having the same silicon concentrations had different resistivities. Samples 25, 29, 30, 31, 32, 33, and 37 had the same silicon concentration, namely, $1\times10^{18}$ cm$^{-3}$, but had different resistivities. Samples 38, 26, and 34 had the same silicon concentration, namely, $4\times10^{18}$ cm$^{-3}$, but had different resistivities. Thus, the resistivity is not determined only by the silicon concentration; the oxygen concentration is important.

Figure 31:
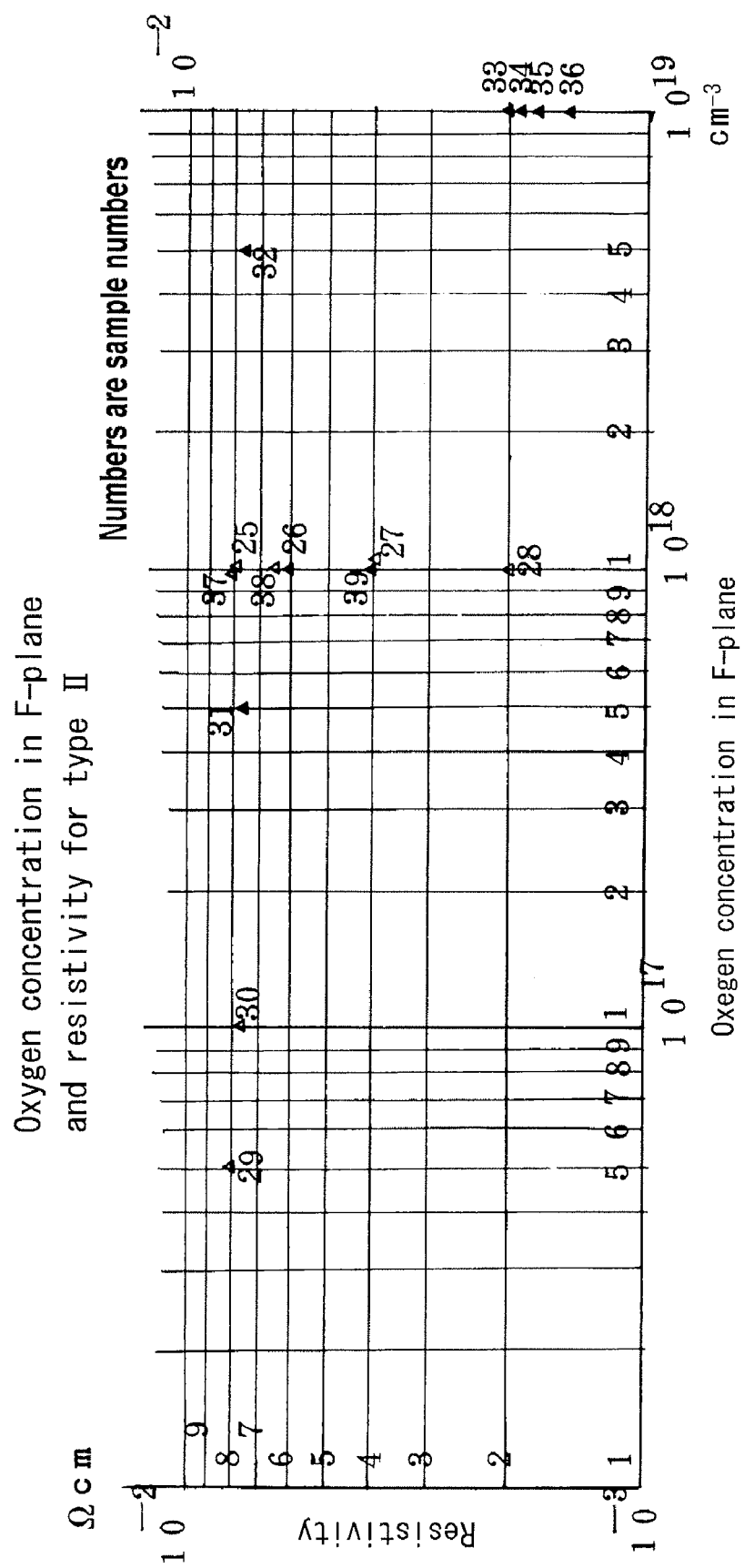
FIG. 31 is a graph showing the oxygen concentrations ($cm^{-3}$) in the f-plane of the examples of type II GaN crystals grown in vapor phase disclosed herein, namely, Samples 25 to 39, along the horizontal axis in a logarithmic scale and the resistivities ($\Omega cm$) thereof along the vertical axis in a logarithmic scale, where the numbers are the sample numbers and the white triangles indicate and the points of the samples.

FIG. 31 shows the oxygen concentration (cm$^{-3}$) in the f-plane and the resistivity (Ωcm) in a two-dimensional coordinate system. Samples 33, 34, 35, and 36, which had an oxygen concentration of $1\times10^{19}$ cm$^{-3}$, had low resistivities, namely, $2\times10^{-3}$, $1.9\times10^{-3}$, $1.8\times10^{-3}$, and $1.5\times10^{-3}$ Ωcm, respectively. Thus, the samples having the highest oxygen concentration had the lowest resistivities. Although Samples 33, 34, 35, and 36 were heavily doped with oxygen, they had cracking ratios of 10%, 11%, 14%, and 18%, respectively, which are lower than 22% and are satisfactory. The differences in resistivity and cracking ratio between the four samples are due to the differences in silicon concentration.

Samples 37, 25, 38, and 26 had an oxygen concentration of $1\times10^{18}$ cm$^{-3}$ and a resistivity of 6 to $8\times10^{-3}$ Ωcm. These differences are due to the differences in silicon concentration. The silicon concentration was 1 to $4\times10^{18}$ cm$^{-3}$. If the unit of oxygen concentration is $1\times10^{18}$ cm$^{-3}$ and is denoted by O' and the coefficient for type I, namely, −0.311, is used, the following equation is obtained:

$$\log r' = -0.311 \log(1.6[O']+[Si'])+1.032$$

This applies to oxygen concentrations below $1\times10^{18}$ cm$^{-3}$.

Samples 33, 34, 35, and 36 had an oxygen concentration of $1\times10^{19}$ cm$^{-3}$, silicon concentrations [Si'] of 1, 4, 7, and 10, respectively, and resistivities r' of 2, 1.9, 1.8, and 1.5, respectively. If the above coefficient, −0.311, is used, the following equation is obtained:

$$\log r' = -0.311 \log([O']+[Si'])+0.62$$

This applies to oxygen concentrations above $1\times10^{19}$ cm$^{-3}$.

Accordingly, all samples of type II are included by the following equation:

$$\log r' = -0.311 \log(\kappa[O']+[Si'])+S$$

where κ is 1 to 1.6 and S is 0.62 to 1.032. This is a phenomenological equation, and x may be 1.1, 1.3, or 1.5. The coefficient used is 0.311 for consistency with type I. For type II, the coefficient may vary between 0.3 and 0.5.

κ serves as a measure of the effectiveness of silicon and oxygen as a dopant. If κ=1, oxygen and silicon release the same number of n-type carriers. If κ=1.6, silicon releases only 0.625 times as many n-type carriers as oxygen.

Figure 32:
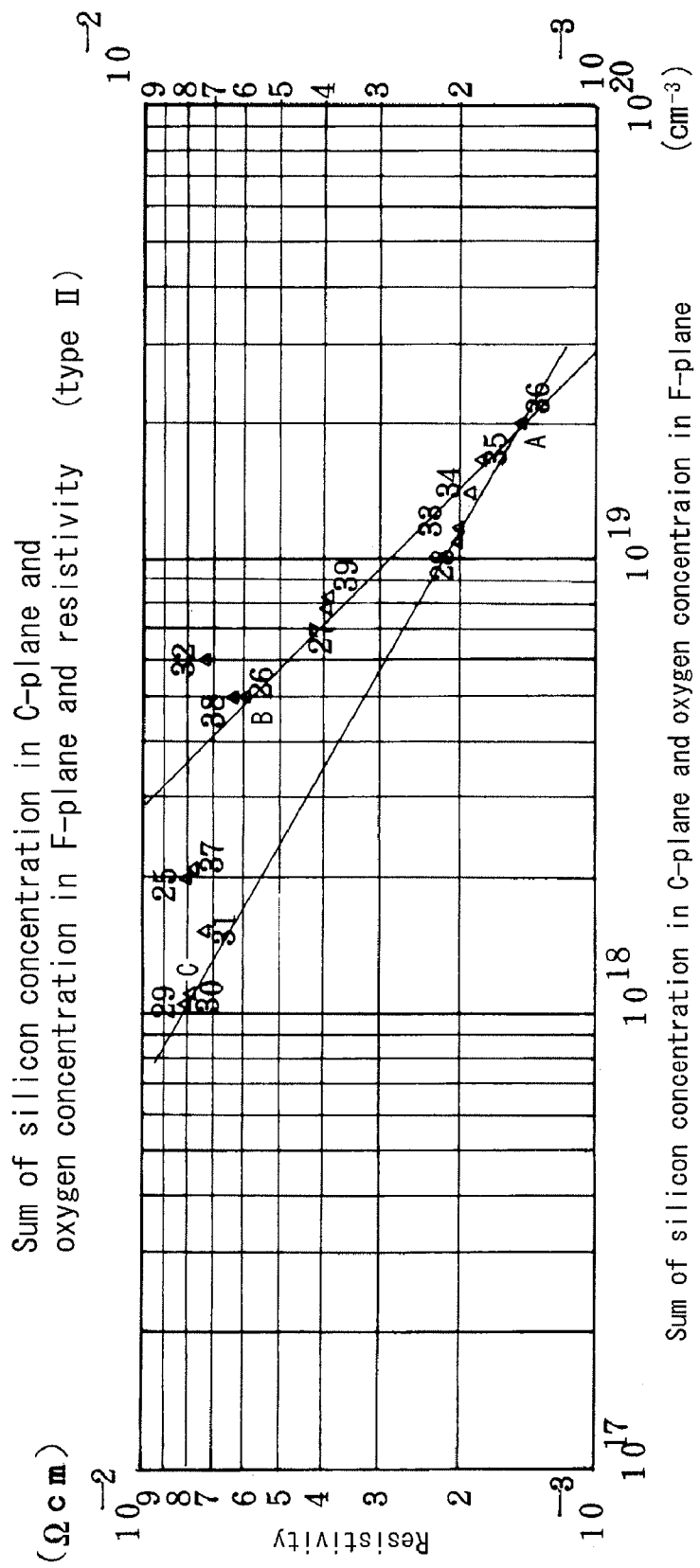
FIG. 32 is a graph showing the sums of the silicon concentrations in the c-plane and the oxygen concentrations in the f-plane of the examples of type II GaN crystals disclosed herein, namely, Samples 25 to 39, along the horizontal axis in a logarithmic scale and the resistivities ($\Omega cm$) thereof along the vertical axis in a logarithmic scale, where the numbers are the sample numbers and the white triangles indicate and the points of the samples.
Figure 33:
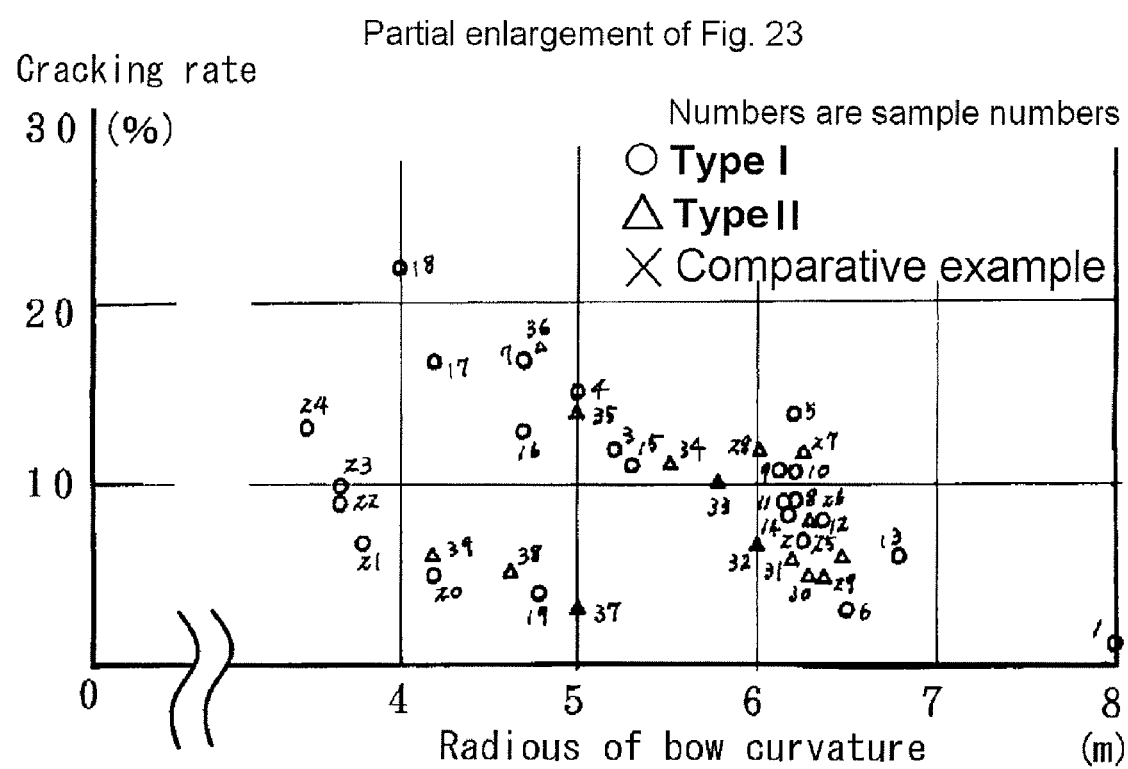
FIG. 33 is a partial enlargement of FIG. 23.
Figure 34:
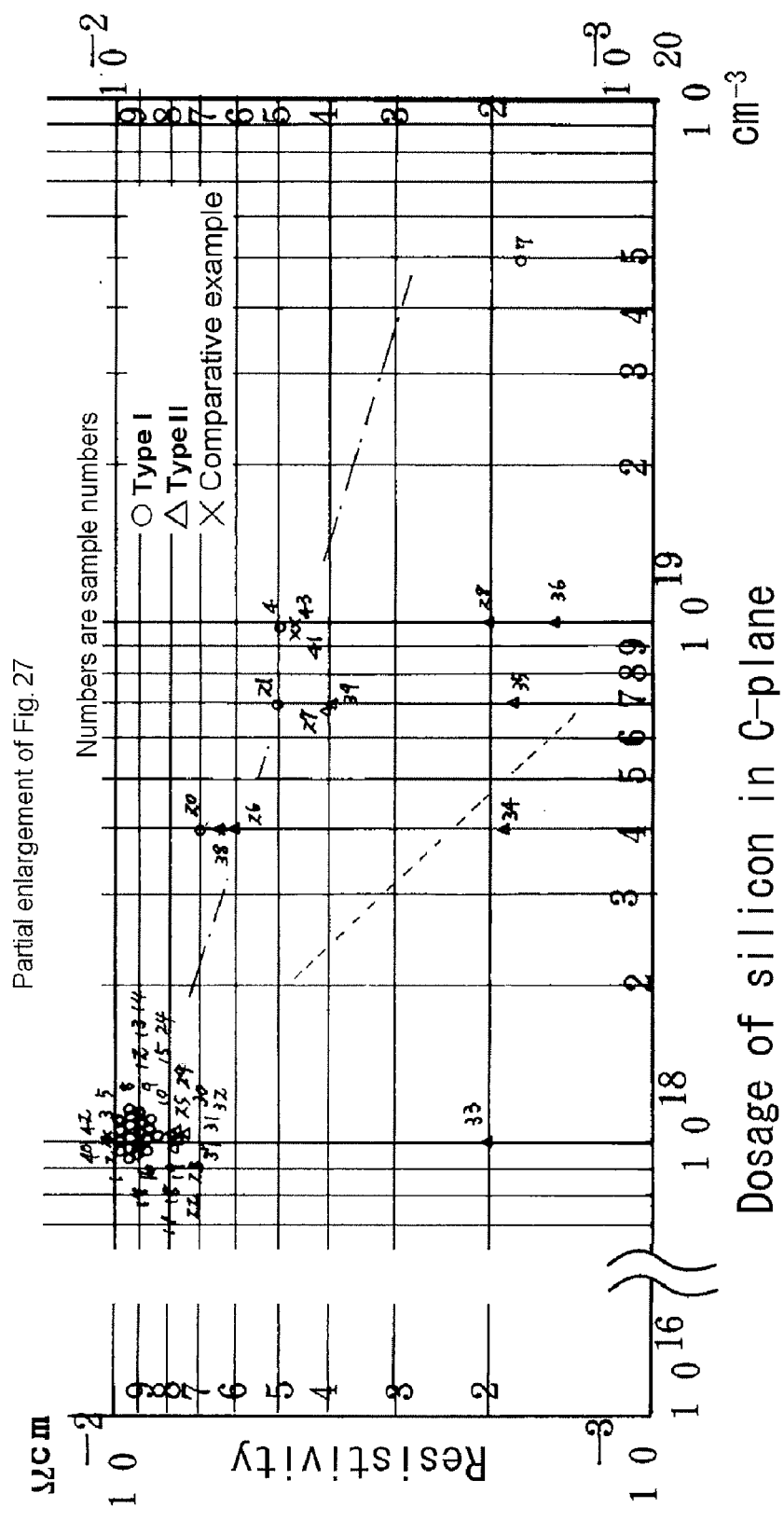
FIG. 34 is a partial enlargement of FIG. 27.

FIG. 32 is a graph showing the sums of the silicon concentrations (cm$^{-3}$) in the c-plane and the oxygen concentrations (cm$^{-3}$) in the f-plane of the type II samples along the horizontal axis and the resistivities (Ωcm) thereof along the vertical axis. That is, the horizontal axis indicates $[Si]_C+[O]_F$. This graph is intended to examine the assumption that oxygen and silicon each independently release one n-type carrier. If the sums of the silicon and oxygen concentrations and the resistivities r of the samples are plotted in a logarithmic graph, it reveals that the above assumption is correct to some extent.

The assumption that the two dopants are independent is supported by Sample 36, which was most heavily doped with silicon and oxygen and had the lowest resistivity. The graph also shows that Samples 35, 34, 39, 27, 26, and 38 are located on the same straight line, namely, line AB, drawn from the point of Sample 36. For Sample 36 (point A), the sum of the silicon and oxygen concentrations was $20\times10^{18}$ cm$^{-3}$, and the resistivity r was $1.5\times10^{-3}$ Ωcm. For Sample 26 (point B), the sum of the silicon and oxygen concentrations was $5\times10^{18}$ cm$^{-3}$, and the resistivity r was $6\times10^{-3}$ Ωcm. In the same manner as above, the units of silicon and oxygen concentrations are $1\times10^{18}$ cm$^{-3}$ and are denoted by Si' and O', respectively, and the unit of resistivity is $1\times10^{-3}$ Ωcm and is denoted by r'. With Si', O', and r', the coordinates of points A and B are represented as follows:

Point A [Si']+[O']=20 r'=1.5

Point B [Si']+[O']=5 r'=6

Line AB is a line inclined downward to the right exactly at 45°, meaning that the resistivity is exactly inversely proportional to the sum of the silicon and oxygen concentrations. Line AB is represented by the following equation:

$$\log r' = 1.478 - \log\{[Si']+[O']\} \quad (AB)$$

where log is a common logarithm. If the equation is expressed as a normal inversely proportional equation, a simple and clear equation is obtained as follows:

$$r' = 30/\{[Si']+[O']\} \quad (AB')$$

The fact that the coefficient of the silicon concentration is equal to that of the oxygen concentration means that they have the same activation rates. The fact that there is a simple inversely proportional relationship means that a simple free electron model (Drude model) holds, that is, $1/r=\sigma=ne\mu$, where n is the n-type carrier concentration, e is the electron charge, and μ is the mobility. Because the silicon and oxygen concentrations have the same coefficient, they have nearly the same activation rate ν, that is, $\nu_{Si}=\nu_O=\nu$. Hence, the n-type carrier concentration n is $\nu\{[Si]+[O]\}$. Accordingly, $$r=1/[e\nu\mu\{[Si]+[O]\}]$$

Because $r=r'\times10^{-3}$ Ωcm and $[Si]+[O]=\{[Si']+[O']\}\times10^{18}$ cm$^{-3}$, $$r'\times10^{-3}=1/[e\nu\mu\{[Si']+[O']\}\times10^{-18}]$$

If this is equal to equation AB' above, $$e\nu\mu=10^3/30\times10^{18}=33\times10^{-18}$$

where e is $1.6\times10^{-19}$. Dividing this by e gives the following equation:

$$\nu\mu=206 \text{ cm}^2/\text{Vs}$$

The value of ν is unknown from the above data alone. If the activation rate ν is close to 1, the mobility is 200 cm$^2$/Vs.

The equation indicating that the product of the resistivity r' and the sum of the silicon and oxygen concentrations ([Si']+[O']) is 30 is an approximate equation that applies well to Samples 36, 35, 34, 39, 27, 26, and 38 in FIG. 32. However, Samples 25, 37, 31, 30, 29, 28, and 33 deviate from the line. For these samples, the resistivity should also be expressed as a function of the sum of the silicon and oxygen concentrations. For Sample 30 (point C), the sum of the silicon and oxygen concentrations was $1.1\times10^{18}$ cm$^{-3}$, and the resistivity r was $7.9\times10^{-3}$ Ωcm. The equation of line AC connecting point A (Sample 36) and point C (Sample 30) will now be considered. Points A and C have the following coordinates:

Point A [Si']+[O']=20

$r'=1.5$

Point C [Si']+[O']=1.1

$r'=7.9$

Hence, line AC is represented by the following equation:

$$\log r'=0.9213-0.5728 \log \{[\text{Si}']+[\text{O}']\} \quad (AC)$$

If this is expressed as an exponential equation, rather than a logarithmic equation, $$r'=8.34257/\{[\text{Si}']+[\text{O}']\}^{0.5728}$$

The type II samples other than Sample 32 are located between line AC and line AB. That is, the resistivity is given by the following inequality:

$$0.9213-0.5728 \log \{[\text{Si}']+[\text{O}']\} \leq \log r' \leq 1.478-\log \{[\text{Si}']+[\text{O}']\}$$

This represents the relationship between the concentrations and the resistivities of all type II samples other than Sample 32. If this is expressed as an exponential inequality, $$8.34257/\{[\text{Si}']+[\text{O}']\}^{0.5728} \leq r' \leq 30/\{[\text{Si}']+[\text{O}']\}$$

The fact that this relationship holds for type II suggests that silicon and oxygen each release one n-type carrier as a donor without interfering with each other. Thus, double doping with silicon and oxygen has advantageous properties.

What is claimed is:

1. A method for producing a conductive nitride semiconductor substrate, comprising the steps of:
    preparing an underlying substrate having a c-plane or a plane with three-fold symmetry;
    forming, on the underlying substrate, masking portions having a width or diameter of 10 to 100 µm and periodically repeated at a spacing of 250 to 10,000 µm and an exposed portion where the substrate is exposed;
    growing a nitride semiconductor crystal having facets in a surface thereof on the underlying substrate by hydride vapor phase epitaxy (HVPE) at a crystal growth temperature of 1,040° C. to 1,150° C. while doping the nitride semiconductor crystal with silicon and oxygen by supplying a group III source gas, a group V source gas, a silicon compound gas, and water or oxygen in a V/III ratio of 1 to 10 so that low-dislocation-density single-crystal regions Z following the facets and a c-plane growth region Y following a flat face are formed above the exposed portion and crystal defect cluster regions H are formed above the masking portions, the nitride semiconductor crystal being doped with oxygen and silicon through the facets and with silicon through a c-plane and having an HZYZHZYZ . . . structure in an inner portion thereof;
    removing the underlying substrate; and
    polishing the surface of the nitride semiconductor crystal to form a free-standing conductive nitride semiconductor crystal having a cracking rate K of $1\% \leq K \leq 22\%$.

2. The method for producing a conductive nitride semiconductor substrate according to claim 1, wherein the crystal growth temperature is 1,090° C. to 1,150° C. and the V/III ratio is 1 to 5 in the step of growing the nitride semiconductor crystal, and in the step, the nitride semiconductor crystal is initially grown while maintaining the facets and is finally grown so as to have a flat surface where the c-plane spreads.

3. The method for producing a conductive nitride semiconductor substrate according to claim 2, wherein the silicon compound gas is not supplied at the beginning of the growth of the nitride semiconductor crystal and is supplied later during the growth to start silicon doping at some point during the growth in the step of growing the nitride semiconductor crystal.

4. The method for producing a conductive nitride semiconductor substrate according to claim 3, wherein the amount of silicon compound gas supplied is gradually increased and is maximized at the end of the growth.

5. The method for producing a conductive nitride semiconductor substrate according to claim 2, wherein the silicon concentration in the c-plane is $1 \times 10^{17}$ to $5 \times 10^{19}$ cm$^{-3}$.

6. The method for producing a conductive nitride semiconductor substrate according to claim 3, wherein the radius of bow curvature U after the removal of the underlying substrate and before the polishing is $3.5 \text{ m} \leq U \leq 8 \text{ m}$.

7. A method for producing a conductive nitride semiconductor substrate according to claim 2, comprising the steps of:
    preparing a (111) GaAs underlying substrate;
    forming, on the underlying substrate, masking portions having a width or diameter of 10 to 100 µm and periodically repeated at a spacing of 250 to 10,000 µm and an exposed portion where the substrate is exposed;
    growing a nitride semiconductor crystal having facets in a surface thereof on the underlying substrate by hydride vapor phase epitaxy (HVPE) at a crystal growth temperature of 1,090° C. to 1,150° C. while doping the nitride semiconductor crystal with silicon and oxygen by supplying a group III source gas, a group V source gas, a silicon compound gas, and water or oxygen in a V/III ratio of 1 to 10 so that low-dislocation-density single-crystal regions Z following the facets and c-plane growth regions Y following flat faces are formed above the exposed portions and crystal defect cluster regions H are formed above the masking portions, the nitride semiconductor crystal being doped with oxygen and silicon through the facets and with silicon through a c-plane and having an HZYZHZYZ . . . structure in an inner portion thereof, the c-plane finally spreading over the surface of the nitride semiconductor crystal;
    removing the underlying substrate to obtain a nitride semiconductor crystal having a radius of bow curvature U of $3.5 \text{ m} \leq U \leq 8 \text{ m}$; and
    polishing the surface of the nitride semiconductor crystal to form a free-standing conductive nitride semiconductor crystal having a cracking rate K of $1\% \leq K \leq 22\%$, and a resistivity of 0.0018 to 0.01 Ωcm.

8. The method for producing a conductive nitride semiconductor substrate according to claim 2, wherein if the resistivity of the conductive nitride semiconductor crystal is denoted by r and the silicon concentration of the conductive nitride semiconductor crystal is denoted by [Si], the resistivity is represented by the following equation:

$$\log r=3.55-0.311 \log [\text{Si}]$$

(where log is a common logarithm).

9. The method for producing a conductive nitride semiconductor substrate according to claim 2, wherein if the resistivity r of the conductive nitride semiconductor crystal is expressed as r'×10$^{-3}$ Ωcm and the silicon concentration [Si]

of the conductive nitride semiconductor crystal is expressed as $[Si'] \times 10^{18}$ cm$^{-3}$, the resistivity is represented by the following equation:

$$\log r' = -0.311 \log [Si'] + 0.954$$

(where log is a common logarithm).

10. The method for producing a conductive nitride semiconductor substrate according to claim 2, wherein if the resistivity r of the conductive nitride semiconductor crystal is expressed as $r' \times 10^{-3}$ Ωcm and the silicon concentration [Si] of the conductive nitride semiconductor crystal is expressed as $[Si'] \times 10^{18}$ cm$^{-3}$, the resistivity is represented by the following equation:

$$689 \leq \log r' + 0.311 \log [Si'] \leq 1.032$$

(where log is a common logarithm).

11. The method for producing a conductive nitride semiconductor substrate according to claim 1, wherein the crystal growth temperature is 1,040° C. to 1,070° C. and the V/III ratio is 1 to 10 in the step of growing the nitride semiconductor crystal, and the nitride semiconductor crystal is grown while maintaining the facets throughout the step so as to have a surface where ridges and valleys formed by the facets spread.

12. The method for producing a conductive nitride semiconductor substrate according to claim 11, wherein the amount of silicon compound gas supplied is increased as the growth proceeds in the step of growing the nitride semiconductor crystal.

13. The method for producing a conductive nitride semiconductor substrate according to claim 11, wherein the radius of bow curvature U after the removal of the underlying substrate and before the polishing is 4.2 m ≤ U ≤ 6.5 m.

14. A method for producing a conductive nitride semiconductor substrate according to claim 11, comprising the steps of:

preparing a (111) GaAs underlying substrate;

forming, on the underlying substrate, masking portions having a width or diameter of 10 to 100 µm and periodically repeated at a spacing of 250 to 10,000 µm and an exposed portion where the substrate is exposed;

growing a nitride semiconductor crystal having facets in a surface thereof on the underlying substrate by hydride vapor phase epitaxy (HVPE) at a crystal growth temperature of 1,040° C. to 1,070° C. while doping the nitride semiconductor crystal with silicon and oxygen by supplying a group III source gas, a group V source gas, a silicon compound gas, and water or oxygen in a V/III ratio of 1 to 10 so that low-dislocation-density single-crystal regions Z following the facets and c-plane growth regions Y following flat faces are formed above the exposed portions and crystal defect cluster regions H are formed above the masking portions, the nitride semiconductor crystal being doped with oxygen and silicon through the facets and with silicon through a c-plane and having an HZYZHZYZ . . . structure in an inner portion thereof, the facets being maintained to the end of the growth so that the facets and the c-plane finally spread over the surface of the nitride semiconductor crystal;

removing the underlying substrate to obtain a nitride semiconductor crystal having a radius of bow curvature U of 4.2 m ≤ U ≤ 6.5 m; and polishing the surface of the nitride semiconductor crystal to form a free-standing conductive nitride semiconductor crystal having a cracking ratio K of 3% ≤ K ≤ 18%, and a resistivity of 0.0015 to 0.008 Ωcm.

15. The method for producing a conductive nitride semiconductor substrate according to claim 11, wherein if the resistivity r of the conductive nitride semiconductor crystal is expressed as $r' \times 10^{-3}$ Ωcm, the silicon concentration [Si] of the conductive nitride semiconductor crystal is expressed as $[Si'] \times 10^{18}$ cm$^{-3}$, and the oxygen concentration [O] of the conductive nitride semiconductor crystal is expressed as $[O'] \times 10^{18}$ cm$^{-3}$, the resistivity is represented by the following equation:

$$\log r' = -0.311 \log(1.6[O'] + [Si']) + 1.032.$$

16. The method for producing a conductive nitride semiconductor substrate according to claim 11, wherein if the resistivity r of the conductive nitride semiconductor crystal is expressed as $r' \times 10^{-3}$ Ωcm, the silicon concentration [Si] of the conductive nitride semiconductor crystal is expressed as $[Si'] \times 10^{18}$ cm$^{-3}$, and the oxygen concentration [O] of the conductive nitride semiconductor crystal is expressed as $[O'] \times 10^{18}$ cm$^{-3}$, the resistivity is represented by the following equation:

$$\log r' = -0.311 \log([O'] + [Si']) + 0.62.$$

17. The method for producing a conductive nitride semiconductor substrate according to claim 11, wherein if the resistivity r of the conductive nitride semiconductor crystal is expressed as $r' \times 10^{-3}$ Ωcm, the silicon concentration [Si] of the conductive nitride semiconductor crystal is expressed as $[Si'] \times 10^{18}$ cm$^{-3}$, and the oxygen concentration [O] of the conductive nitride semiconductor crystal is expressed as $[O'] \times 10^{18}$ cm$^{-3}$, the resistivity is represented by the following equation:

$$\log r' = -0.311 \log(\kappa[O'] + [Si']) + S$$

(where κ is 1 to 1.6 and S is 0.62 to 1.032).

* * * * *

UNITED STATES PATENT AND TRADEMARK OFFICE
CERTIFICATE OF CORRECTION

| | |
|---|---|
| PATENT NO. | : 8,110,484 B1 |
| APPLICATION NO. | : 12/950686 |
| DATED | : February 7, 2012 |
| INVENTOR(S) | : Fumitaka Sato, Seiji Nakahata and Makoto Kiyama |

It is certified that error appears in the above-identified patent and that said Letters Patent is hereby corrected as shown below:

Col. 69, Claim 10, line 8, change ".689 ≤ logr' + 0.311 log[Si'] ≤ 1.032" to --0.689 ≤ logr' + 0.311 log[Si'] ≤ 1.032--.

Signed and Sealed this
Twenty-fourth Day of April, 2012

David J. Kappos
*Director of the United States Patent and Trademark Office*